US012453174B2

(12) United States Patent
Ching et al.

(10) Patent No.: US 12,453,174 B2
(45) Date of Patent: Oct. 21, 2025

(54) INTEGRATED CIRCUITS WITH FinFET GATE STRUCTURES

(71) Applicant: Taiwan Semiconductor Manufacturing Co., Ltd., Hsin-Chu (TW)

(72) Inventors: Kuo-Cheng Ching, Hsinchu County (TW); Huan-Chieh Su, Changhua County (TW); Zhi-Chang Lin, Hsinchu County (TW); Chih-Hao Wang, Hsinchu County (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/524,934

(22) Filed: Nov. 30, 2023

(65) Prior Publication Data

US 2024/0105719 A1 Mar. 28, 2024

Related U.S. Application Data

(60) Continuation of application No. 17/856,471, filed on Jul. 1, 2022, now Pat. No. 11,855,084, which is a (Continued)

(51) Int. Cl.
*H10D 84/83* (2025.01)
*H01L 21/033* (2006.01)
(Continued)

(52) U.S. Cl.
CPC ....... *H10D 84/834* (2025.01); *H01L 21/0337* (2013.01); *H10D 30/62* (2025.01);
(Continued)

(58) Field of Classification Search
CPC ............ H01L 27/0886; H01L 21/0337; H01L 21/823418; H01L 21/823431; H01L 21/823437; H01L 21/823468; H01L 29/0649; H01L 29/66545; H01L 29/785; H10D 84/834; H10D 84/013; H10D 84/0147; H10D 84/0135; H10D 84/0158;
(Continued)

(56) References Cited

U.S. PATENT DOCUMENTS 8,217,450 B1 * 7/2012 Yu ....................... H01L 29/7856 257/365
8,772,109 B2 7/2014 Colinge
(Continued)

*Primary Examiner* — Eric W Jones
(74) *Attorney, Agent, or Firm* — HAYNES AND BOONE, LLP

(57) ABSTRACT

Examples of an integrated circuit with FinFET devices and a method for forming the integrated circuit are provided herein. In some examples, an integrated circuit device includes a substrate, a fin extending from the substrate, a gate disposed on a first side of the fin, and a gate spacer disposed alongside the gate. The gate spacer has a first portion extending along the gate that has a first width and a second portion extending above the first gate that has a second width that is greater than the first width. In some such examples, the second portion of the gate spacer includes a gate spacer layer disposed on the gate.

20 Claims, 48 Drawing Sheets

Related U.S. Application Data division of application No. 16/360,502, filed on Mar. 21, 2019, now Pat. No. 11,380,682.

(60) Provisional application No. 62/749,198, filed on Oct. 23, 2018.

(51) Int. Cl.

| | |
|---|---|
| ***H10D 30/62*** | (2025.01) |
| ***H10D 62/10*** | (2025.01) |
| ***H10D 64/01*** | (2025.01) |
| ***H10D 84/01*** | (2025.01) |
| ***H10D 84/03*** | (2025.01) |

(52) U.S. Cl.

CPC ......... *H10D 62/115* (2025.01); *H10D 64/017* (2025.01); *H10D 84/013* (2025.01); *H10D 84/0135* (2025.01); *H10D 84/0147* (2025.01); *H10D 84/0158* (2025.01); *H10D 84/038* (2025.01)

(58) Field of Classification Search

CPC .... H10D 84/038; H10D 30/62; H10D 64/017; H10D 62/115

USPC .......................................................... 257/368

See application file for complete search history.

(56) References Cited

U.S. PATENT DOCUMENTS

| | | | | |
|---|---|---|---|---|
| 8,785,285 | B2 | 7/2014 | Tsai et al. | |
| 8,796,666 | B1 | 8/2014 | Huang et al. | |
| 8,816,444 | B2 | 8/2014 | Wann et al. | |
| 8,822,243 | B2 | 9/2014 | Yan et al. | |
| 8,823,065 | B2 | 9/2014 | Wang et al. | |
| 8,860,148 | B2 | 10/2014 | Hu et al. | |
| 8,987,142 | B2 | 3/2015 | Lee et al. | |
| 9,053,279 | B2 | 6/2015 | Chang et al. | |
| 9,093,530 | B2 | 7/2015 | Huang et al. | |
| 9,099,530 | B2 | 8/2015 | Lin et al. | |
| 9,105,490 | B2 | 8/2015 | Wang et al. | |
| 9,153,478 | B2 | 10/2015 | Liu et al. | |
| 9,236,267 | B2 | 1/2016 | De et al. | |
| 9,236,300 | B2 | 1/2016 | Liaw | |
| 9,501,601 | B2 | 11/2016 | Chang et al. | |
| 9,520,482 | B1 | 12/2016 | Chang et al. | |
| 9,548,303 | B2 | 1/2017 | Lee et al. | |
| 9,576,814 | B2 | 2/2017 | Wu et al. | |
| 9,761,483 | B1 * | 9/2017 | Chang | H01L 21/76834 |
| 9,876,114 | B2 | 1/2018 | Huang | |
| 11,380,682 | B2 * | 7/2022 | Ching | H10D 84/0158 |
| 2005/0098822 | A1 * | 5/2005 | Mathew | H10D 64/035 438/257 |
| 2005/0199920 | A1 * | 9/2005 | Lee | H10D 30/6219 257/288 |
| 2006/0081895 | A1 * | 4/2006 | Lee | H10D 86/01 257/288 |
| 2006/0270156 | A1 * | 11/2006 | Kim | H10D 30/6891 438/257 |
| 2006/0275988 | A1 * | 12/2006 | Yagishita | H10D 30/62 257/288 |
| 2007/0287255 | A1 * | 12/2007 | Doyle | H10D 30/6211 438/283 |
| 2009/0008716 | A1 * | 1/2009 | Goto | H10D 84/0135 257/E27.06 |
| 2010/0044762 | A1 * | 2/2010 | Orlowski | H10D 30/0245 257/329 |
| 2010/0124818 | A1 * | 5/2010 | Lee | H10D 84/038 438/589 |
| 2011/0062501 | A1 | 3/2011 | Soss et al. | |
| 2014/0061925 | A1 | 3/2014 | Kim | |
| 2014/0252479 | A1 | 9/2014 | Utomo et al. | |
| 2015/0162338 | A1 * | 6/2015 | Nakada | H10D 64/518 438/268 |
| 2015/0243564 | A1 * | 8/2015 | Zhao | H10D 84/0181 438/591 |
| 2015/0357425 | A1 | 12/2015 | Liu et al. | |
| 2016/0043197 | A1 | 2/2016 | Kim et al. | |
| 2016/0111518 | A1 | 4/2016 | Chang et al. | |
| 2016/0163820 | A1 | 6/2016 | Lee et al. | |
| 2016/0276455 | A1 | 9/2016 | Yang et al. | |
| 2016/0284599 | A1 | 9/2016 | Liu et al. | |
| 2016/0284817 | A1 | 9/2016 | Basker et al. | |
| 2017/0077097 | A1 | 3/2017 | Dong et al. | |
| 2017/0110549 | A1 | 4/2017 | Xie et al. | |
| 2018/0350938 | A1 * | 12/2018 | Lee | H01L 21/28088 |
| 2019/0006515 | A1 | 1/2019 | Cheng et al. | |
| 2020/0126979 | A1 | 4/2020 | Ching | |
| 2022/0336452 | A1 | 10/2022 | Ching et al. | |

* cited by examiner

INTEGRATED CIRCUITS WITH FinFET GATE STRUCTURES

PRIORITY DATA

The present application is a continuation of U.S. patent application Ser. No. 17/856,471, filed Jul. 1, 2022, which is a divisional application of U.S. patent application Ser. No. 16/360,502, filed Mar. 21, 2019, which claims the benefit of U.S. Provisional Application No. 62/749,198, entitled "Integrated Circuits with FinFET Gate Structures," filed Oct. 23, 2018, each of which is herein incorporated by reference in its entirety. The present application is also related to U.S. patent application Ser. No. 17/655,649, filed Mar. 21, 2022.

BACKGROUND

The semiconductor integrated circuit (IC) industry has experienced rapid growth. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down has also been accompanied by increased complexity in design and manufacturing of devices incorporating these ICs. Parallel advances in manufacturing have allowed increasingly complex designs to be fabricated with precision and reliability.

For example, advances in fabrication have enabled three-dimensional designs, such as Fin-like Field Effect Transistors (FinFETs). A FinFET may be envisioned as a typical planar device extruded out of a substrate and into the gate. An exemplary FinFET is fabricated with a thin "fin" (or fin structure) extending up from a substrate. The channel region of the FET is formed in this vertical fin, and a gate is provided over (e.g., wrapping around) the channel region of the fin. Wrapping the gate around the fin increases the contact area between the channel region and the gate and allows the gate to control the channel from multiple sides. This can be leveraged in a number of way, and in some applications, FinFETs provide reduced short channel effects, reduced leakage, and higher current flow. In other words, they may be faster, smaller, and more efficient than planar devices.

As device sizes shrink, the features of the integrated circuit, such as the gates and contacts that couple to the gates, may become increasingly difficult to form and align. Advances that improve techniques for forming minute features or that provide additional space for forming larger features have the potential to increase yield, improve performance, reduce variability, reduce circuit area, and provide other benefits.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the dimensions of the various features may be arbitrarily increased or reduced for clarity of discussion.

DETAILED DESCRIPTION

Figure 1A:
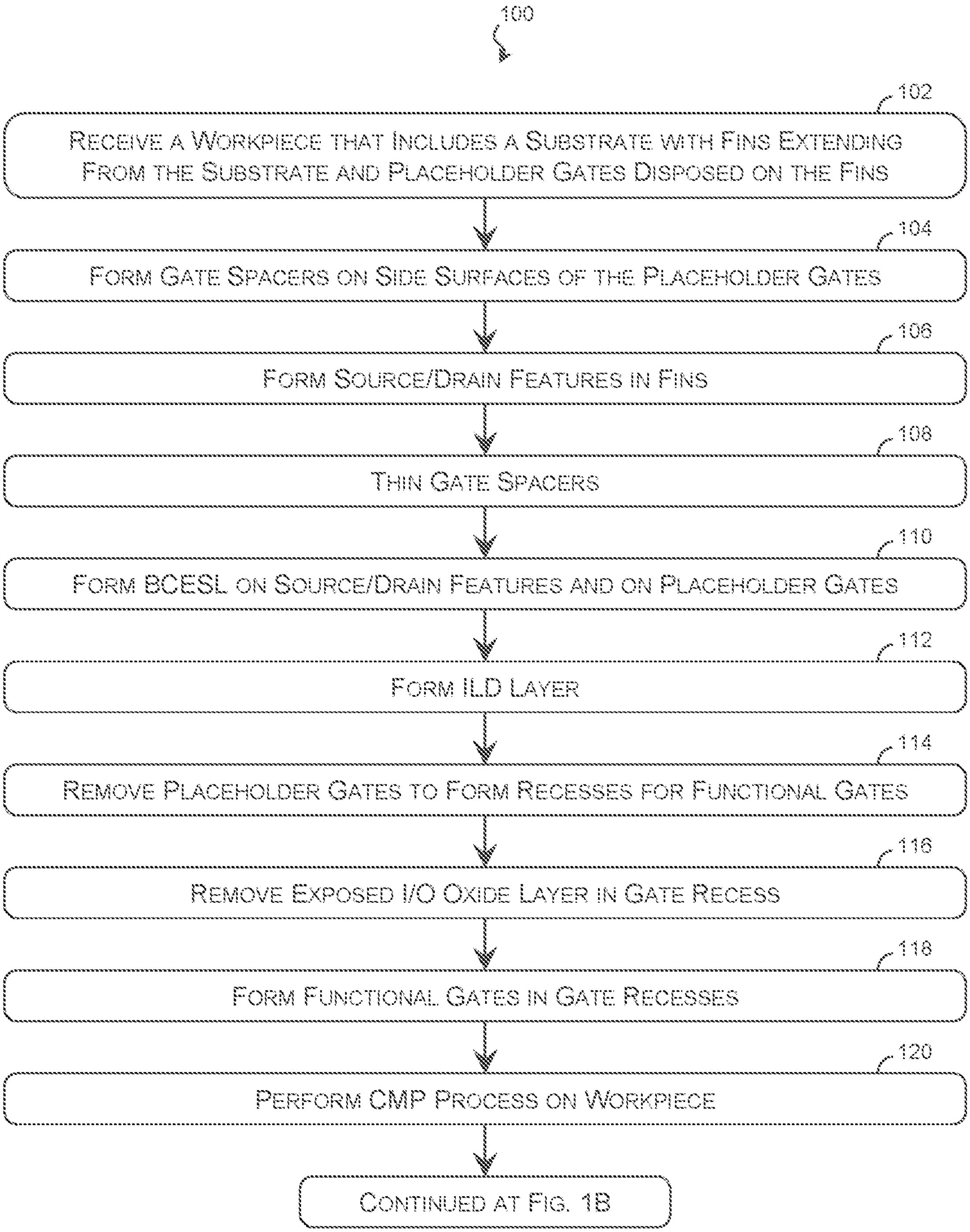
FIGS. 1A and 1B are flow diagrams of a method of fabricating a workpiece with FinFET gate structures according to various aspects of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. Moreover, the formation of a feature connected to and/or coupled to another feature in the present disclosure that follows may include embodiments in which the features are formed in direct contact, and may also include embodiments in which additional features may be formed interposing the features, such that the features may not be in direct contact.

In addition, spatially relative terms, for example, "lower," "upper," "horizontal," "vertical," "above," "over," "below," "beneath," "up," "down," "top," "bottom," etc. as well as derivatives thereof (e.g., "horizontally," "downwardly," "upwardly," etc.) are used for ease of the present disclosure of one features relationship to another feature. The spatially relative terms are intended to cover different orientations of the device including the features. In addition, the present disclosure may repeat reference numerals and/or letters in the various examples. This repetition is for the purpose of simplicity and clarity and does not in itself dictate a relationship between the various embodiments and/or configurations beyond the extent noted.

Integrated circuits include an ever-increasing number of active and passive circuit devices formed on a substrate or wafer, of which Fin-like Field Effect Transistors (FinFETs) are an example. FinFETs may include a number of raised semiconductor portions (e.g., fins) containing source/drain features and channel regions with gate structures wrapping around the channel regions. Some examples of the present technique improve the formation of contacts that couple to the source/drain features and to the gate structures by reducing the thickness of dielectric gate spacers that are disposed alongside the gates. The thinner gate spacers may allow more space for contacts, making the contacts easier to fabricate and align. Furthermore, in some such examples, the portions of the gate spacers alongside the gates are thinner than the portions of the gate spacers above the gates where a contact may be formed. The thinner portions of the gate spacer may provide a relatively wider recess in which to form a gate, which may make the gate easier to fabricate and align. Wider gate structures may also reduce adverse short channel effects. The thicker portions of the gate spacer elsewhere provide isolation between contacts, may reduce time-dependent gate oxide breakdown, and provide other benefits.

The present technique may avoid forming the gate structure in those regions where the gate spacer is thicker by omitting the gate structure entirely above the fins while retaining it alongside the fins. Instead, a conductive cap is formed on a fin that electrically couples the gate structures on either side of the fin. This may reduce the amount of conductive material in the gate structure. In addition to simplifying the gate, this may reduce gate capacitance and increase device switching speed. These advantages are merely examples and no particular advantage is required for any particular embodiment.

Figure 1B:
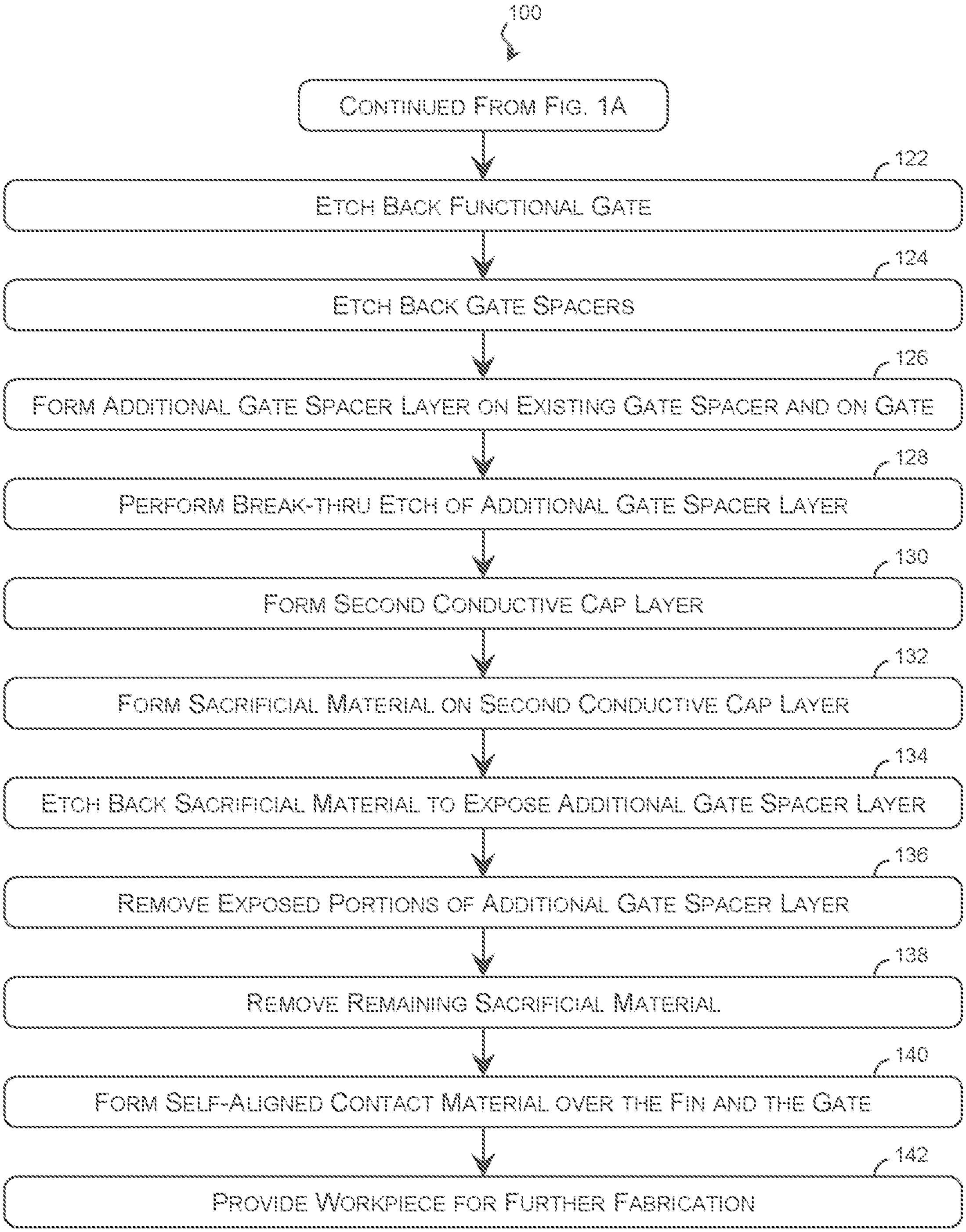
Figure 2:
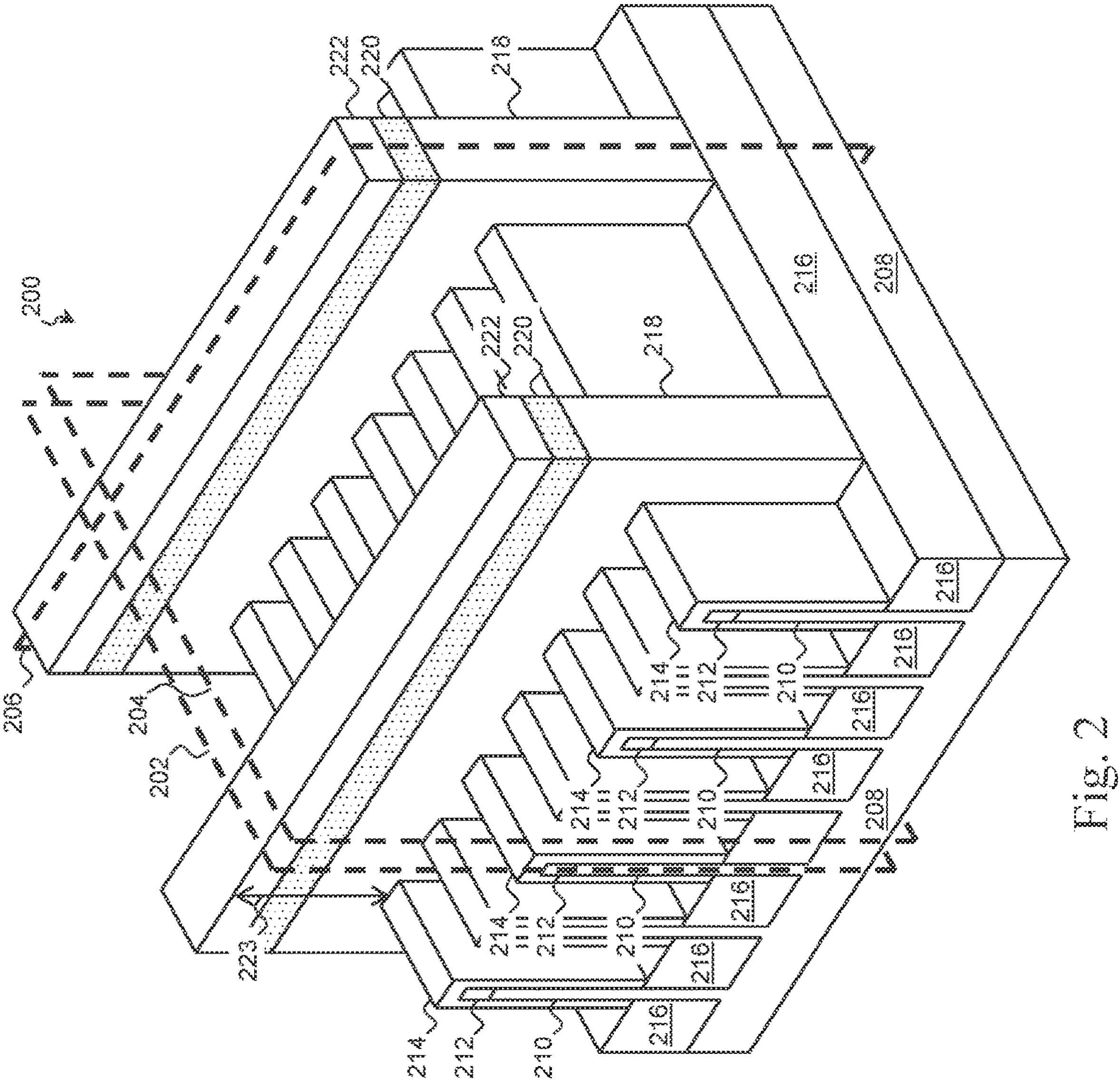
FIG. 2 is a perspective illustration of a workpiece undergoing the method of fabrication according to various aspects of the present disclosure.

The present disclosure provides examples of an integrated circuit including a plurality of FinFETs and the associated gate structures. In that regard, FIGS. 1A and 1B are flow diagrams of a method 100 of fabricating a workpiece 200 with FinFET gate structures according to various aspects of the present disclosure. Additional steps can be provided before, during, and after the method 100, and some of the steps described can be replaced or eliminated for other embodiments of the method 100. FIG. 2 is a perspective illustration of the workpiece 200 undergoing the method 100 of fabrication according to various aspects of the present disclosure. FIGS. 3-11, 13, 15, 17, 19, 21, 23, 25, 27, and 29 are cross-sectional illustrations of the workpiece 200 taken in a fin-length direction that cut through a fin, as indicated by plane 202, according to various aspects of the present disclosure. FIGS. 12, 14, 16, 18, 20, 22, 24, 26, 28, and 30 are cross-sectional illustrations of the workpiece 200 taken in the fin-length direction that cut through an isolation feature, as indicated by plane 204, according to various aspects of the present disclosure. FIG. 31 is a cross-sectional illustration of the workpiece 200 taken in a gate-length direction that cuts through a gate structure, as indicated by plane 206, according to various aspects of the present disclosure.

Referring to block 102 of FIG. 1A and to FIG. 2, the workpiece 200 is received. The workpiece 200 includes a substrate 208 upon which devices are to be formed. In various examples, the substrate 208 includes an elementary (single element) semiconductor, such as silicon or germanium in a crystalline structure; a compound semiconductor, such as silicon carbide, gallium arsenic, gallium phosphide, indium phosphide, indium arsenide, and/or indium antimonide; an alloy semiconductor such as SiGe, GaAsP, AlInAs, AlGaAs, GaInAs, GaInP, and/or GaInAsP; a non-semiconductor material, such as soda-lime glass, fused silica, fused quartz, and/or calcium fluoride ($CaF_2$); and/or combinations thereof.

The substrate 208 may be uniform in composition or may include various layers, some of which may be selectively etched to form the fins. The layers may have similar or different compositions, and in various embodiments, some substrate layers have non-uniform compositions to induce device strain and thereby tune device performance. Examples of layered substrates include silicon-on-insulator (SOI) substrates 208. In some such examples, a layer of the substrate 208 may include an insulator such as a semiconductor oxide, a semiconductor nitride, a semiconductor oxynitride, a semiconductor carbide, and/or other suitable insulator materials.

Doped regions, such as wells, may be formed on the substrate 208. In that regard, some portions of the substrate 208 may be doped with p-type dopants, such as boron, $BF_2$, or indium while other portions of the substrate 208 may be doped with n-type dopants, such as phosphorus or arsenic; and/or other suitable dopants including combinations thereof.

In some examples, the devices to be formed on the substrate 208 extend out of the substrate 208. For example, FinFETs and/or other non-planar devices may be formed on device fins 210 disposed on the substrate 208. The device fins 210 are representative of any raised feature and include FinFET device fins 210 as well as fins 210 for forming other raised active and passive devices upon the substrate 208. The fins 210 may be similar in composition to the substrate 208 or may be different therefrom. For example, in some embodiments, the substrate 208 may include primarily silicon, while the fins 210 include one or more layers that are primarily germanium or a SiGe semiconductor. In some embodiments, the substrate 208 includes a SiGe semiconductor, and the fins 210 include a SiGe semiconductor with a different ratio of silicon to germanium than the substrate 208.

The fins 210 may be formed by etching portions of the substrate 208, by depositing various layers on the substrate 208 and etching the layers, and/or by other suitable techniques. For example, the fins 210 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over the fins 210 and one or more fin-top hard masks 212. The sacrificial layer is patterned using a photolithography process. Spacers are formed alongside the patterned sacrificial layer using a self-aligned process. The sacrificial layer is then removed, and the remaining spacers are used to pattern the fins 210 by removing material of the fin-top hard mask 212 and the substrate 208 that is not covered by the spacers so that the fins 210 remain.

The fin-top hard mask 212 may be used to control the etching process that defines the fins 210 and may protect the fins 210 during subsequent processing. Accordingly, the fin-top hard mask 212 may be selected to have different etch selectivity from the material(s) of the fins 210. The fin-top hard mask 212 may include a dielectric material such as a semiconductor oxide, a semiconductor nitride, a semiconductor oxynitride, a semiconductor carbide, a semiconductor carbonitride, a semiconductor oxycarbonitride, and/or a metal oxide. In some examples, the fin-top hard mask 212 includes silicon oxide or silicon nitride. The fin-top hard mask 212 may be formed to any suitable thickness and, in various examples, has a thickness between about 1 nm and about 10 nm.

The workpiece 200 may also include an isolation dielectric layer 216 disposed on the substrate 208 between the fins 210 to form isolation features (e.g., Shallow Trench Isolation features (STIs)). The isolation dielectric layer 216 may include a dielectric material such as a semiconductor oxide, a semiconductor nitride, a semiconductor oxynitride, a semiconductor carbide, a semiconductor carbonitride, a semiconductor oxycarbonitride, a metal oxide, etc., and in some examples, the isolation dielectric layer 216 includes multiple sublayers of different dielectric materials. The isolation dielectric layer 216 may be formed by any suitable process, and in some examples, the isolation dielectric layer 216 is deposited using Atomic Layer Deposition (ALD), Plasma Enhanced ALD (PEALD), Chemical Vapor Deposition (CVD), Plasma Enhanced CVD (PECVD), High-Density Plasma CVD (HDP-CVD), and/or other suitable deposition processes. Following deposition, the isolation dielectric layer 216 may be etched back so that the uppermost portions of the fins 210 protrude above the isolation dielectric layer. In various such examples, the fins 210 and fin-top hard mask 212 extend between about 100 nm and about 500 nm above the topmost surface of the isolation dielectric layer 216.

An I/O oxide layer 214 may be disposed on top of the fin-top hard mask 212 and on the sides of the fins 210. The I/O oxide layer 214 may include a dielectric material such as a semiconductor oxide, a semiconductor oxynitride, a semiconductor oxycarbonitride, and/or a metal oxide. The I/O oxide layer 214 may be formed by any suitable deposition process including ALD, PEALD, CVD, PECVD, HDP-CVD, thermal growth, and/or other suitable techniques. In various examples, the I/O oxide layer 214 is deposited to a thickness between about 1 nm and about 5 nm.

The workpiece may also include placeholder gates 218 formed over and surrounding the channel regions of the fins 210. When materials of the functional gate structures are sensitive to fabrication processes or are difficult to pattern, placeholder gates 218 of polysilicon, dielectric, and/or other resilient material may be used during some of the fabrication processes. The placeholder gates are later removed and replaced with elements of functional gates (e.g., a gate electrode, a gate dielectric layer, an interfacial layer, etc.) in a gate-last process. In this way, the placeholder gates 218 reserve area for the forthcoming functional gates.

The placeholder gates 218 may include any suitable material, such as polysilicon, one or more dielectric materials (e.g., a semiconductor oxide, a semiconductor nitride, a semiconductor oxynitride, a semiconductor carbide, a semiconductor carbonitride, a semiconductor oxycarbonitride, etc.), and/or other suitable material. The material of the placeholder gates 218 may be formed by any suitable process including CVD, PECVD, HDP-CVD, Physical Vapor Deposition (PVD), ALD, PEALD, and/or other suitable deposition processes. In some examples, the material of the placeholder gates 218 is deposited in a blanket deposition and etched to selectively remove portions of the material so that the placeholder gates 218 remain over the channel regions of the fins 210. To aid in patterning, one or more gate hard mask layers (e.g., layers 220 and 222) of dielectric material or other suitable material may be formed on top of the placeholder gate material prior to etching. The gate hard mask layers 220 and 222 may have similar or different compositions, and in an example, a first gate hard mask layer 220 includes a semiconductor nitride and a second gate hard mask layer 222 includes a semiconductor oxide.

The placeholder gates 218 run perpendicular to the fins 210 and extend above the top of the fins 210 (including any fin-top hard masks 212) as indicated by marker 223. In an example where the fins 210 and fin-top hard mask 212 extend between about 100 nm and about 500 nm above the topmost surface of the isolation dielectric layer 216, the placeholder gates 218 extend between about 50 nm and about 150 nm from the upper-most surface of the fin-top hard mask 212.

Figure 3:
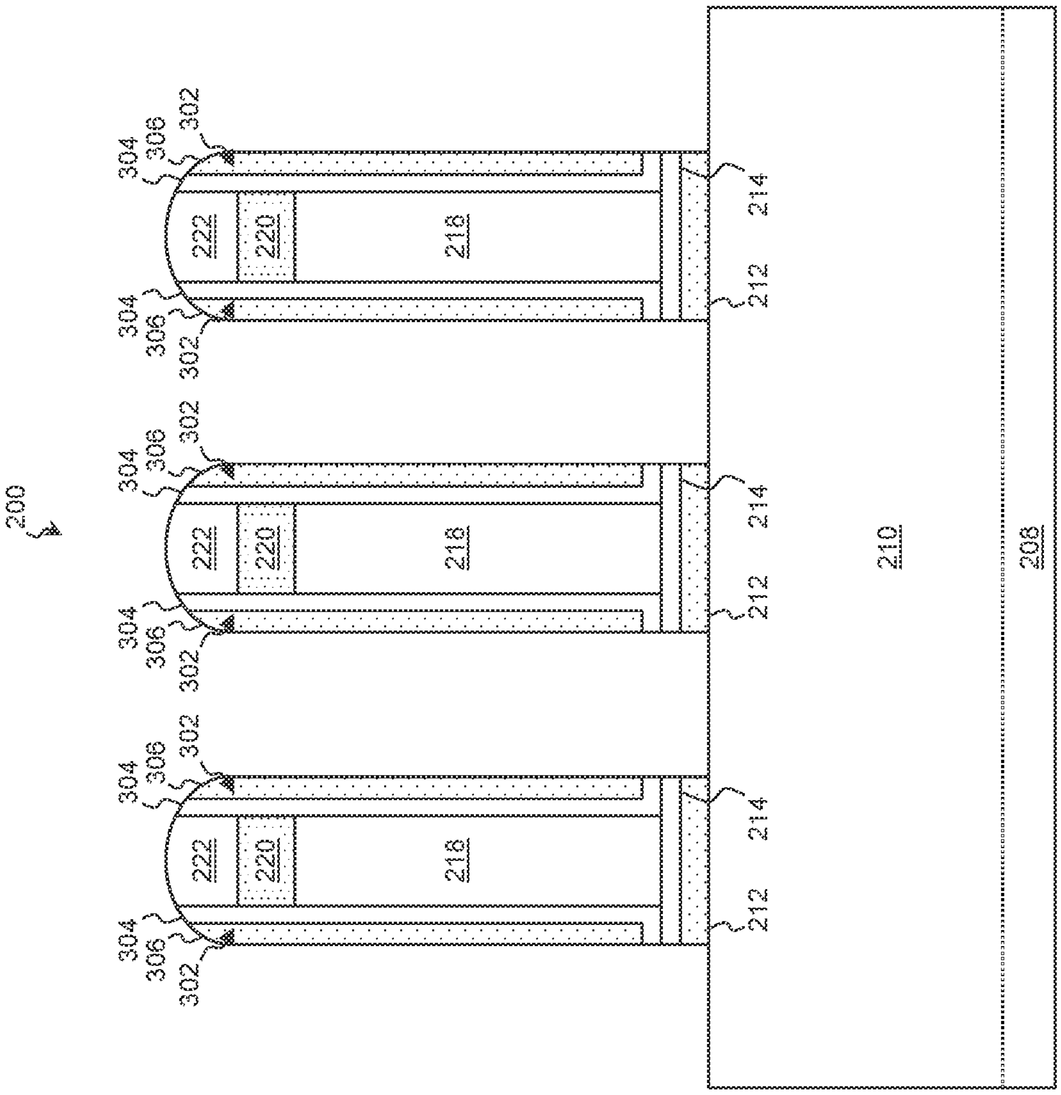
FIGS. 3-11, 13, 15, 17, 19, 21, 23, 25, 27, and 29 are cross-sectional illustrations of a workpiece taken in a fin-length direction that cut through a fin according to various aspects of the present disclosure.

Referring to block 104 of FIG. 1A and to FIG. 3, gate spacers 302 are formed on side surfaces of the placeholder gates 218 and any gate hard mask layers 220 and 222. In various examples, the gate spacers 302 include one or more layers of suitable materials, such as a dielectric material (e.g., a semiconductor oxide, a semiconductor nitride, a semiconductor oxynitride, a semiconductor carbide, a semiconductor oxycarbonitride, etc.). In some such examples, the gate spacers 302 each include a first spacer layer 304 of a low-k dielectric material (e.g., SiCN, SiOC, SiOCN, etc.) and a second spacer layer 306 of the same or another low-k dielectric material. In the example, the first spacer layer 304 has a thickness between about 1 nm and about 5 nm and the second spacer layer 306 has a thickness between about 1 nm and about 5 nm.

The gate spacer layers 304 and 306 may be formed using any suitable deposition technique (e.g., ALD, CVD, HDP-CVD, etc.). In an example, the gate spacer layers 304 and 306 are deposited on the placeholder gates 218, the fins 210, and the isolation dielectric layer 216 using a conformal technique. The gate spacer layers 304 and 306 are then selectively etched to remove them from the horizontal surfaces of the gate hard mask layers 220 and 222, the fins 210, and the isolation dielectric layer 216 while leaving them on the vertical surfaces of the placeholder gates 218. The remaining material defines the gate spacers 302. The etching process may be performed using any suitable etching method, such as anisotropic dry etching, wet etching, Reactive Ion Etching (RIE), and/or other etching methods and may use any suitable etchant chemistries. The etching methods and the etchant chemistries may vary as the gate spacer layers 304 and 306 are etched to target the particular material being etched while minimizing unintended etching of the materials not being targeted.

Figure 4:
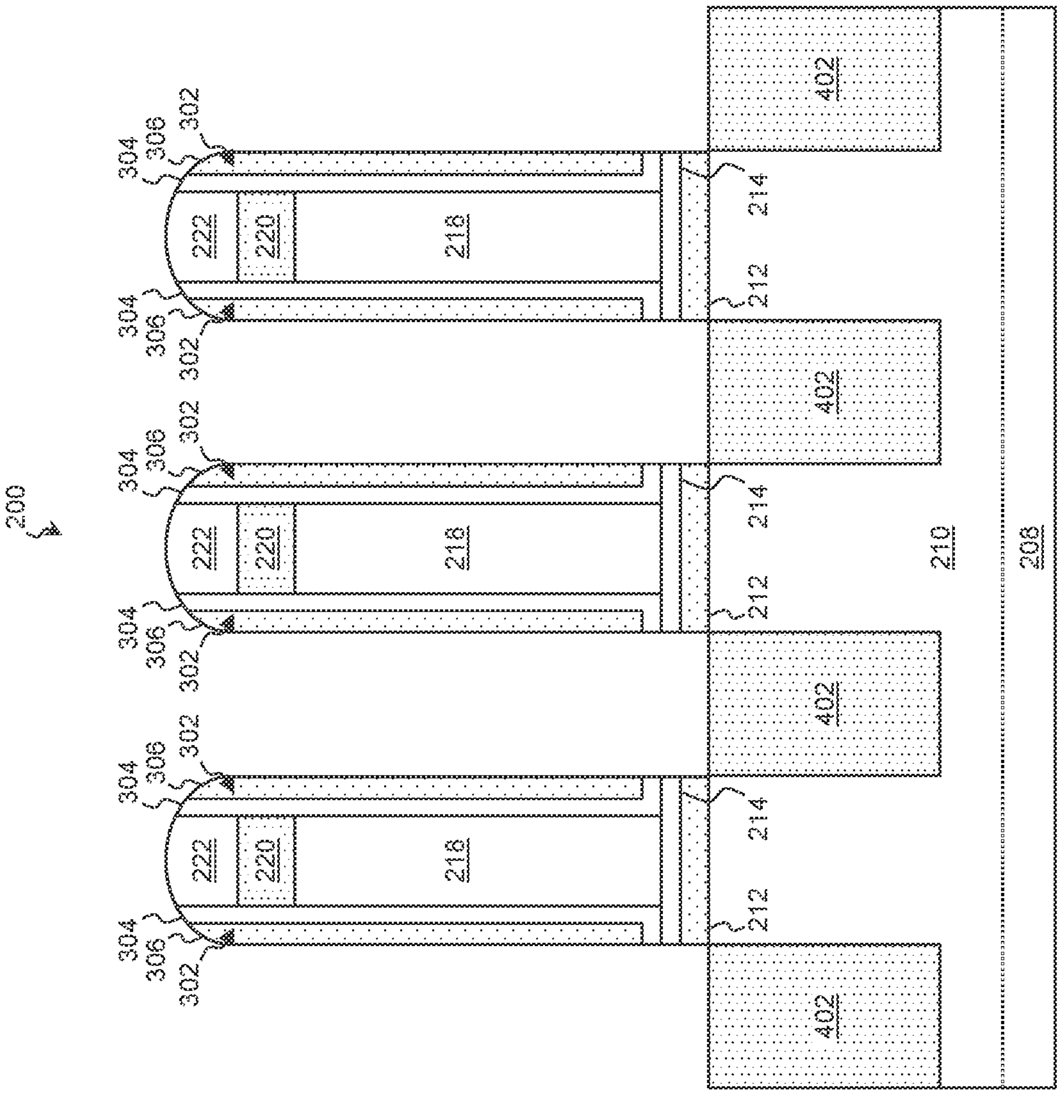

Referring to block 106 of FIG. 1A and to FIG. 4, source/drain features 402 are formed on opposing sides of the placeholder gates 218. The source/drain features 402 may be formed by recessing a portion of the fins 210 and depositing material in the recess using a CVD deposition technique (e.g., Vapor-Phase Epitaxy (VPE) and/or Ultra-High Vacuum CVD (UHV-CVD)), molecular beam epitaxy, and/or other suitable processes. The epitaxy process may use gaseous and/or liquid precursors, which interact with a component of the remaining portions of the fins 210 (e.g., silicon or silicon-germanium) to form the source/drain features 402. The semiconductor component of the source/drain features 402 may be similar to or different from the remainder of the fin 210. For example, Si-containing source/drain features 402 may be formed on a SiGe-containing fin 210 or vice versa. When the source/drain features 402 and fins 210 contain more than one semiconductor, the ratios may be substantially similar or different.

The source/drain features 402 may be in-situ doped to include p-type dopants, such as boron, $BF_2$, or indium; n-type dopants, such as phosphorus or arsenic; and/or other suitable dopants including combinations thereof. Additionally or in the alternative, the source/drain features 402 may be doped using an implantation process (i.e., a junction implant process) after the source/drain features 402 are formed. With respect to the particular dopant type, the source/drain features 402 are doped to be of opposite type than the remainder of the fins 210. For a p-channel device, the fin 210 is doped with an n-type dopant and the source/drain features 402 are doped with a p-type dopant, and vice versa for an n-channel device. Once the dopant(s) are introduced into the source/drain features 402, a dopant activation process, such as Rapid Thermal Annealing (RTA) and/or a laser annealing process, may be performed to activate the dopants.

Figure 5:
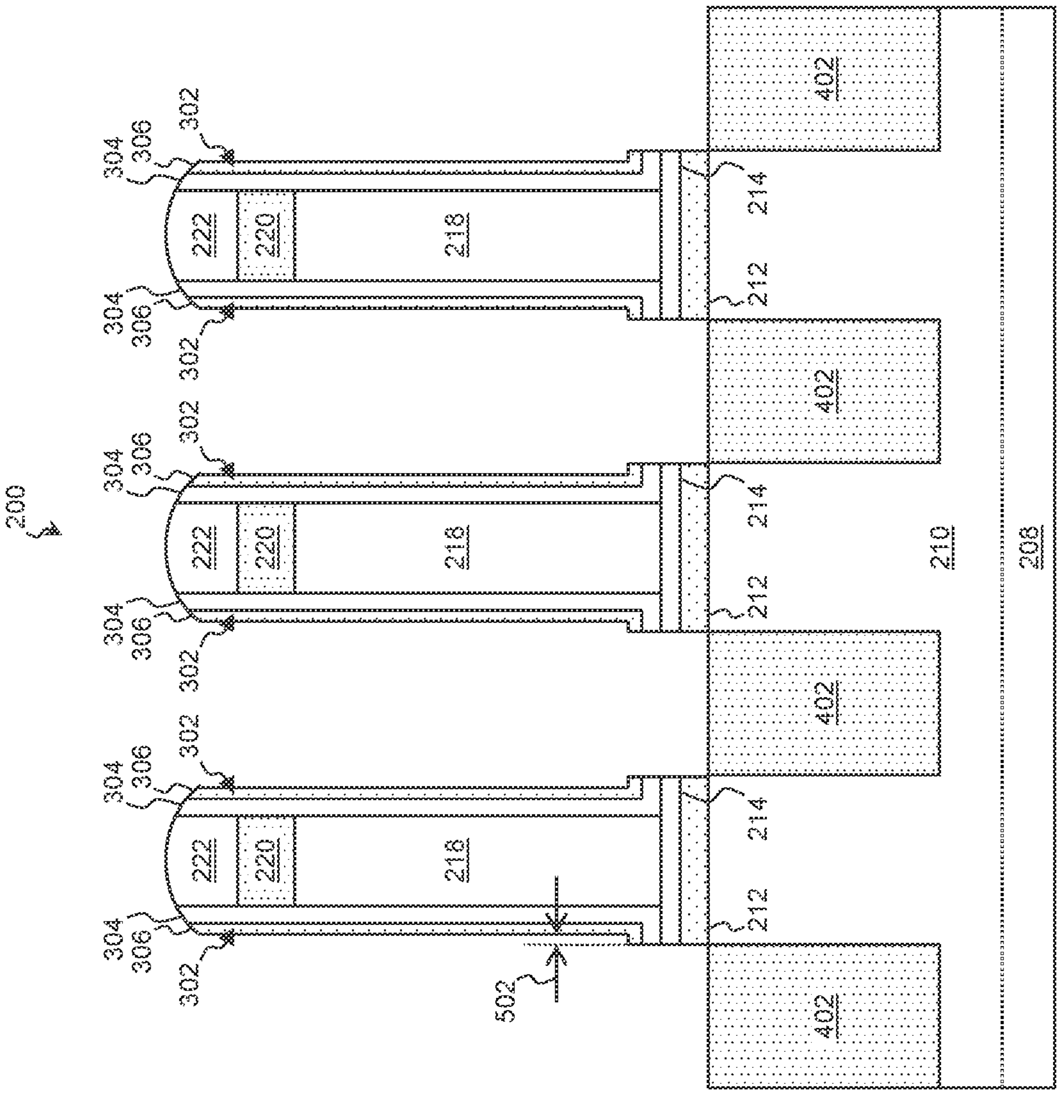

Referring to block 108 of FIG. 1A and to FIG. 5, an etching process is performed to thin the outermost layer or layers of the gate spacers 302 (e.g., gate spacer layer 306). Thinning the gate spacers 302 may provide additional space for contacts to extend alongside the gate spacers 302 and contact the source/drain features 402. This additional space may allow for wider contact trenches and wider contacts. As narrow contact trenches may be more difficult to uniformly fill with contact material, thinning the gate spacers 302 may improve the fill quality of the deposited contact material. Wider contacts may also have reduced contact resistance and allow for more overlay error when depositing subsequent materials. In these ways and others, the thinner gate spacers 302 may provide more reliable circuit devices.

The process may use any suitable etching technique, including dry etching, wet etching, RIE, and other suitable techniques, and in some examples, the gate spacers 302 are thinned using wet etching with Standard Clean 1 (SC-1) (a mixture of $NH_4OH$, $H_2O_2$, and $H_2O$), and/or Standard Clean 2 (SC-2) (a mixture of HCl, $H_2O_2$, and $H_2O$). The process may remove any suitable thickness 502, and in various such examples, between about 1 nm and about 2 nm of the outer gate spacer layer 306 is removed, leaving a total gate spacer 302 width of between about 1 nm and about 10 nm. In some examples, the thinning technique may leave a bottommost portion of the gate spacers 302 unetched so that the bottommost portion is thicker than a topmost portion by, for example, between about 1 nm and about 2 nm.

Figure 6:
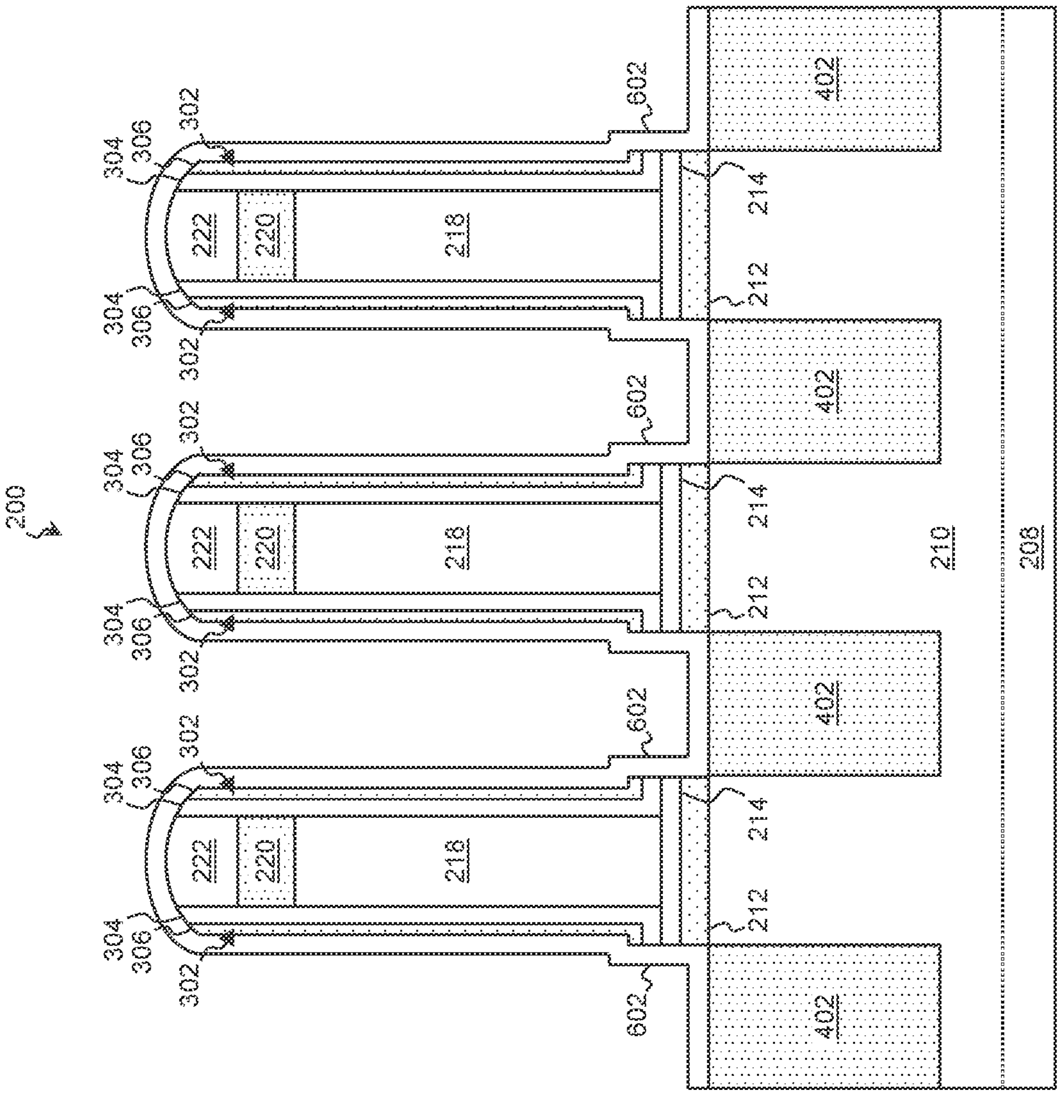

Referring to block 110 of FIG. 1A and to FIG. 6, a Bottom Contact Etch Stop Layer (BCESL) 602 is formed on the source/drain features 402 and along the top and sides of the placeholder gates 218 and gate hard mask layers 220 and 222. The BCESL 602 may be formed by any suitable technique, including ALD, PEALD, CVD, PECVD, and/or HDP-CVD, and may be formed to any suitable thickness. In some examples, the BCESL 602 has a thickness between about 1 nm and about 10 nm. The BCESL 602 may include a dielectric (e.g., a semiconductor oxide, a semiconductor nitride, a semiconductor oxynitride, a semiconductor carbide, etc.) and/or other suitable material, and in various embodiments, the BCESL 602 includes SiN, SiO, SiON, and/or SiC.

Figure 7:
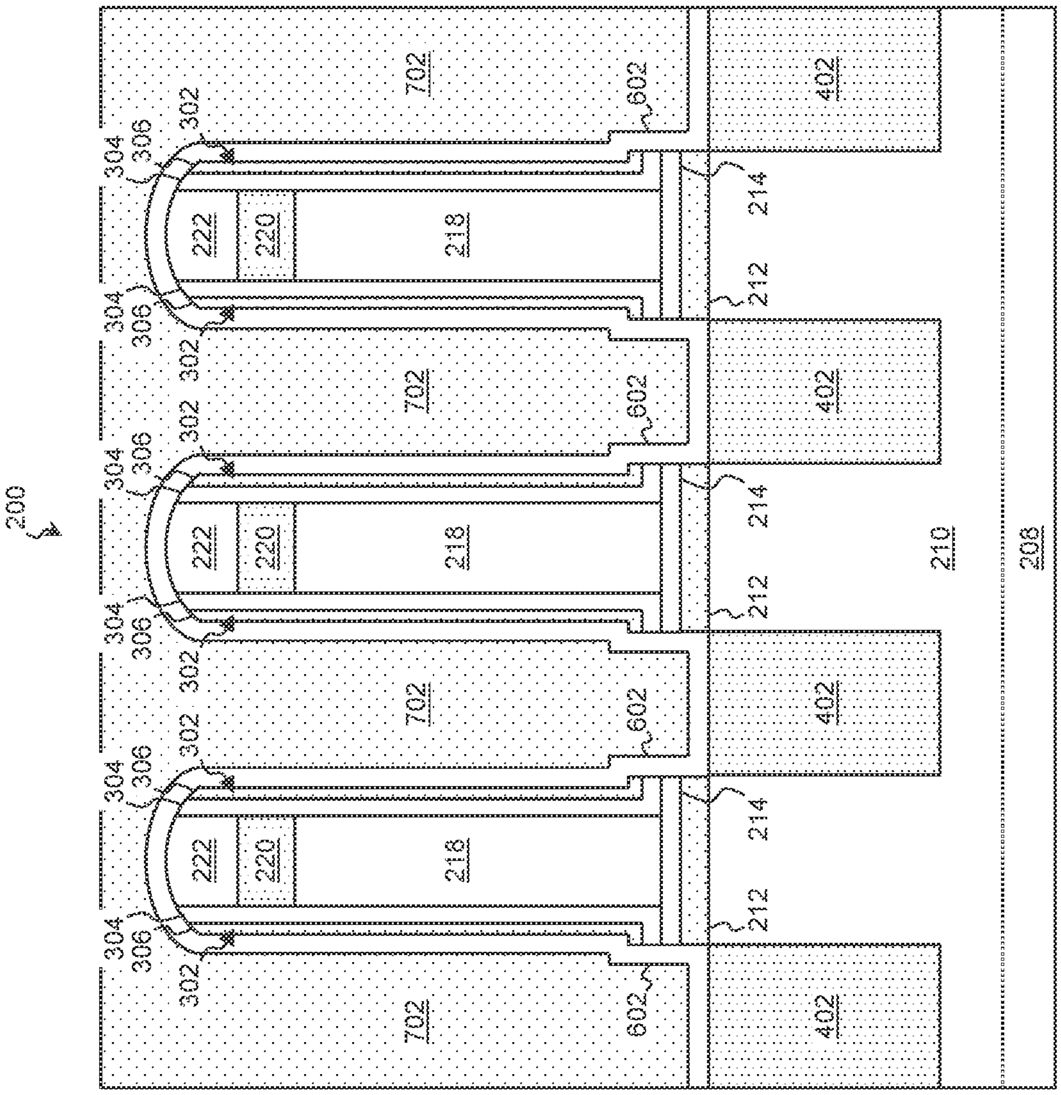

Referring to block 112 of FIG. 1A and to FIG. 7, an Inter-Level Dielectric (ILD) layer 702 is formed on the workpiece 200. The ILD layer 702 acts as an insulator that supports and isolates conductive traces of an electrical multi-level interconnect structure. In turn, the multi-level interconnect structure electrically interconnects elements of the workpiece 200, such as the source/drain features 402 and the functional gates. The ILD layer 702 may be formed by any suitable process including CVD, PVD, spin-on deposition, and/or other suitable processes. The ILD layer 702 may include a dielectric material (e.g., a semiconductor oxide, a semiconductor nitride, a semiconductor oxynitride, a semiconductor carbide, etc.), Spin-On-Glass (SOG), fluoride-doped silicate glass (FSG), phosphosilicate glass (PSG), borophosphosilicate glass (BPSG), Black Diamond® (Applied Materials of Santa Clara, California), Xerogel, Aerogel, amorphous fluorinated carbon, parylene, BCB, SiLK® (Dow Chemical of Midland, Michigan), and/or combinations thereof.

Figure 8:
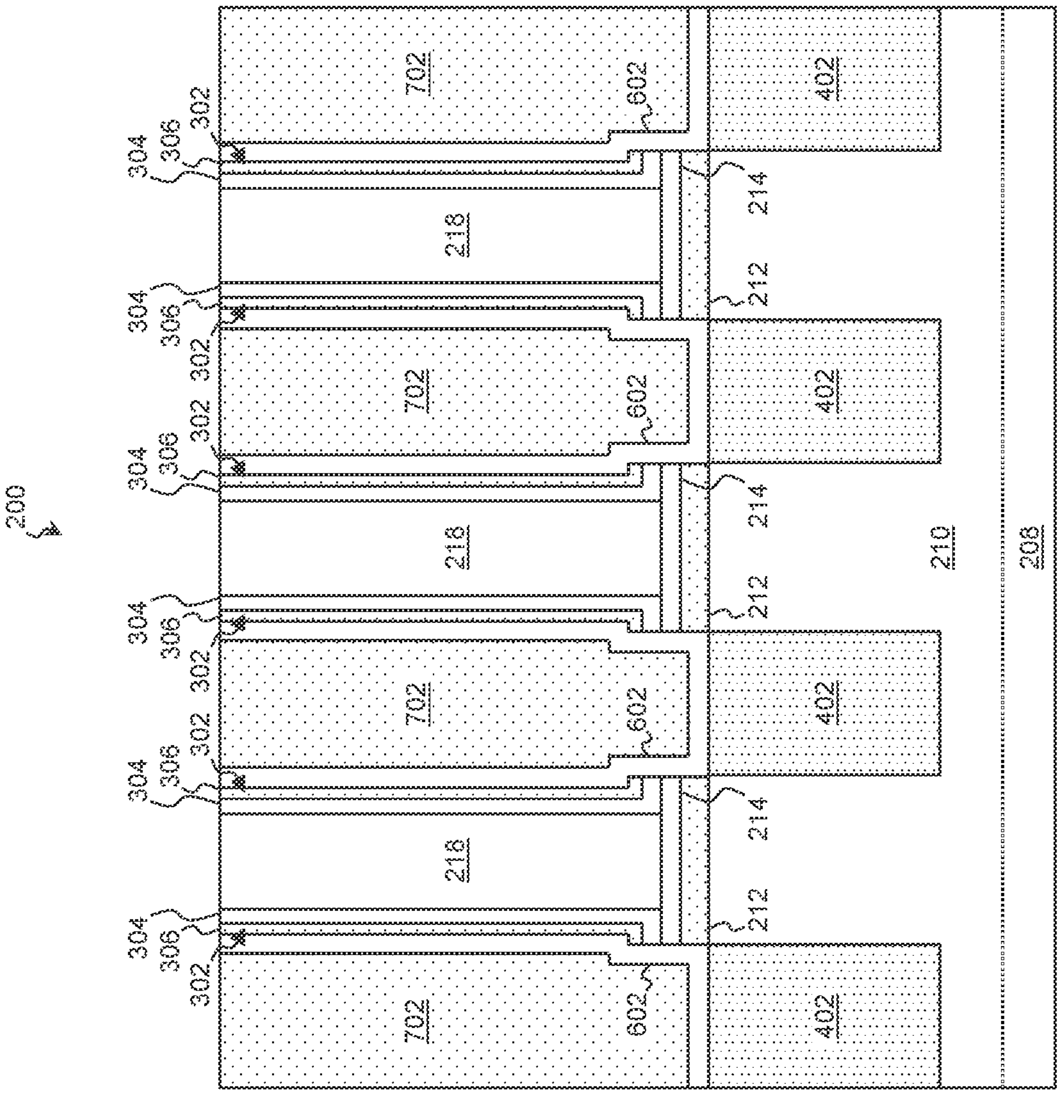

As illustrated in FIG. 8, a Chemical Mechanical Planarization/Polishing (CMP) process may be performed following the deposition of the ILD layer 702 to planarize the ILD layer 702, the BCESL 602, the gate spacers 302, and the placeholder gates 218. In particular, the CMP process may remove the gate hard mask layers 220 and 222 from the top of the placeholder gates 218.

Figure 9:
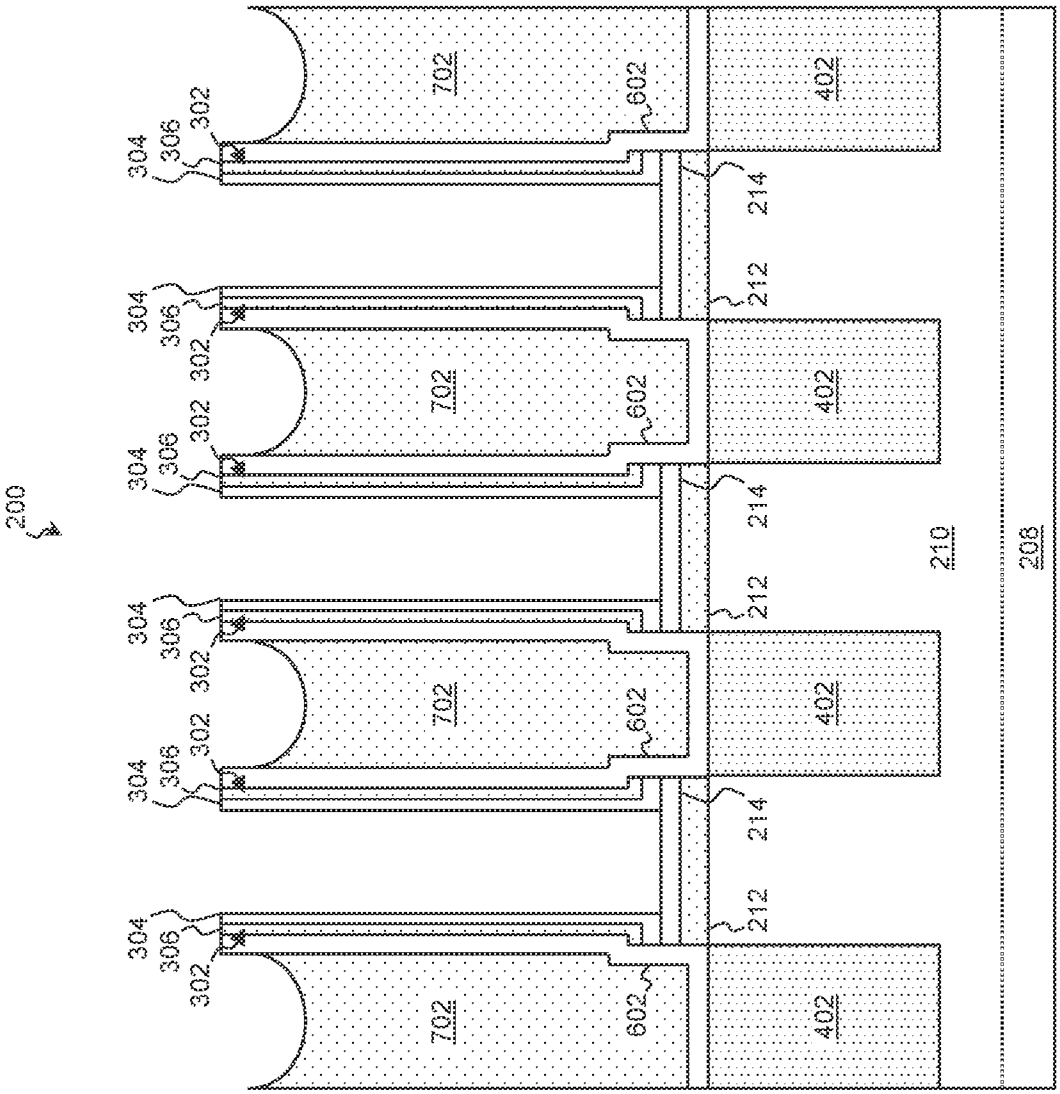

Referring to block 114 of FIG. 1A and referring to FIG. 9, the remaining placeholder gates 218 are removed. Removing the placeholder gates 218 form recesses between the gate spacers 302 in which to form functional gates. The placeholder gates 218 may be removed using one or more iterations of various etching techniques, such as dry etching, wet etching, RIE, etc., each configured to selectively etch a particular material or set of materials of the placeholder gates 218.

In general, the techniques and etchants may be configured to avoid significant etching of the surrounding materials such as the ILD layer 702 and the gate spacers 302. However, in some examples, the etching may be configured to thin the materials of the gate spacers 302 (e.g., gate spacer layer 304). Thinning the gate spacers 302 may widen the recesses for the functional gates. In turn, the wider recesses may improve the quality and uniformity of the gate materials. The wider recesses may also allow the formation of wider functional gates, which may increase the control over the channel region, reduce gate resistance, and reduce alignment issues. In this way and others, the thinner gate spacers 302 may provide more reliable circuit devices. The etching may remove any suitable thickness, and in various such examples, between about 1 nm and about 2 nm of the gate spacer layer 304 is removed, leaving a total gate spacer 302 width of between about 1 nm and about 10 nm.

The etching technique(s) used to remove the placeholder gates 218 may also cause some inadvertent etching of the ILD layer 702 as shown in FIG. 9.

Figure 10:
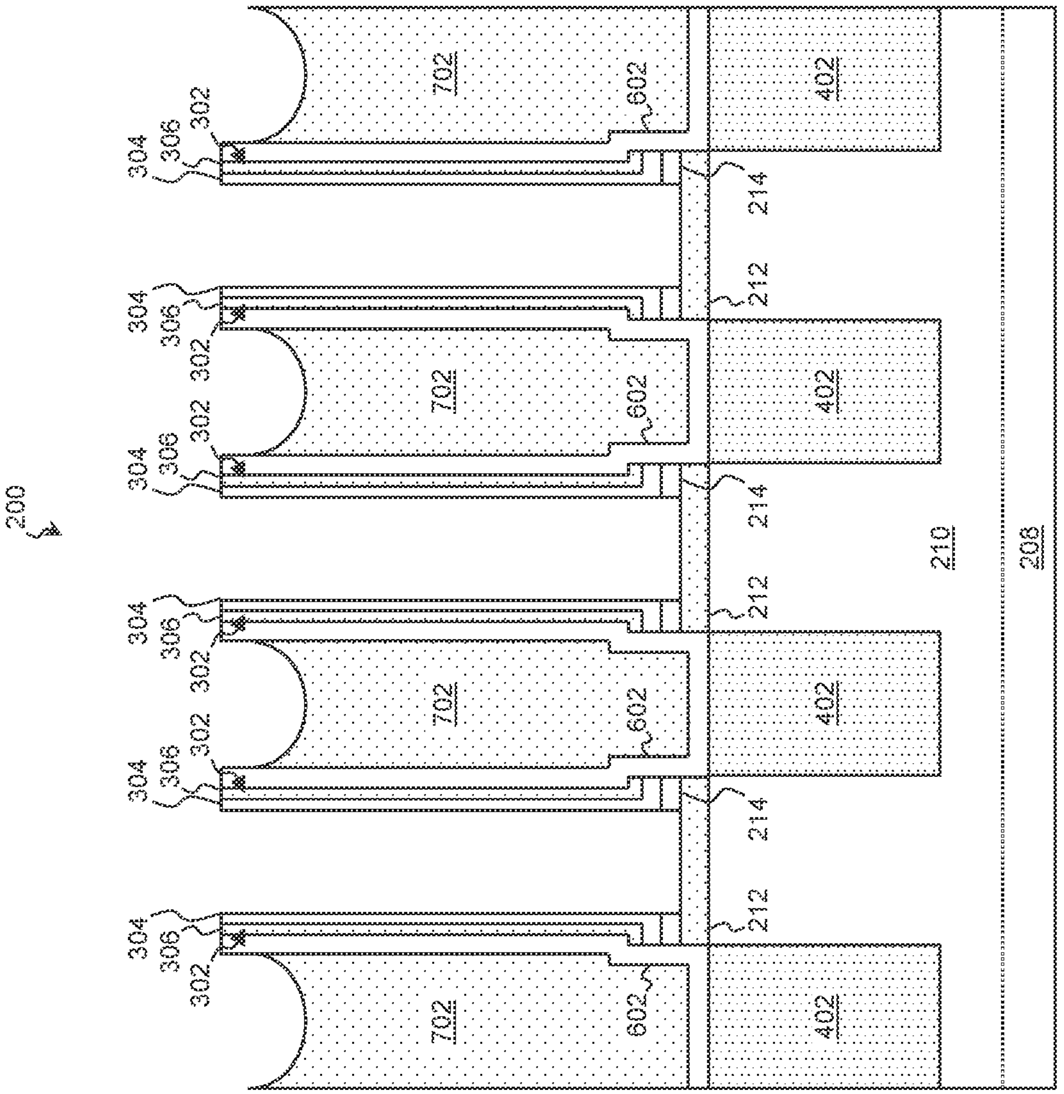

Referring to block 116 of FIG. 1A and referring to FIG. 10, a portion of the I/O oxide layer 214 that is exposed by removing the placeholder gates 218 is removed. The I/O oxide layer 214 may be removed using any suitable etching technique such as dry etching, wet etching, RIE, and/or other suitable techniques. Removing the I/O oxide layer 214 may expose the fin-top hard mask 212 disposed on the top of the fins 210 and may expose the side surfaces of the fins 210 themselves.

Figure 11:
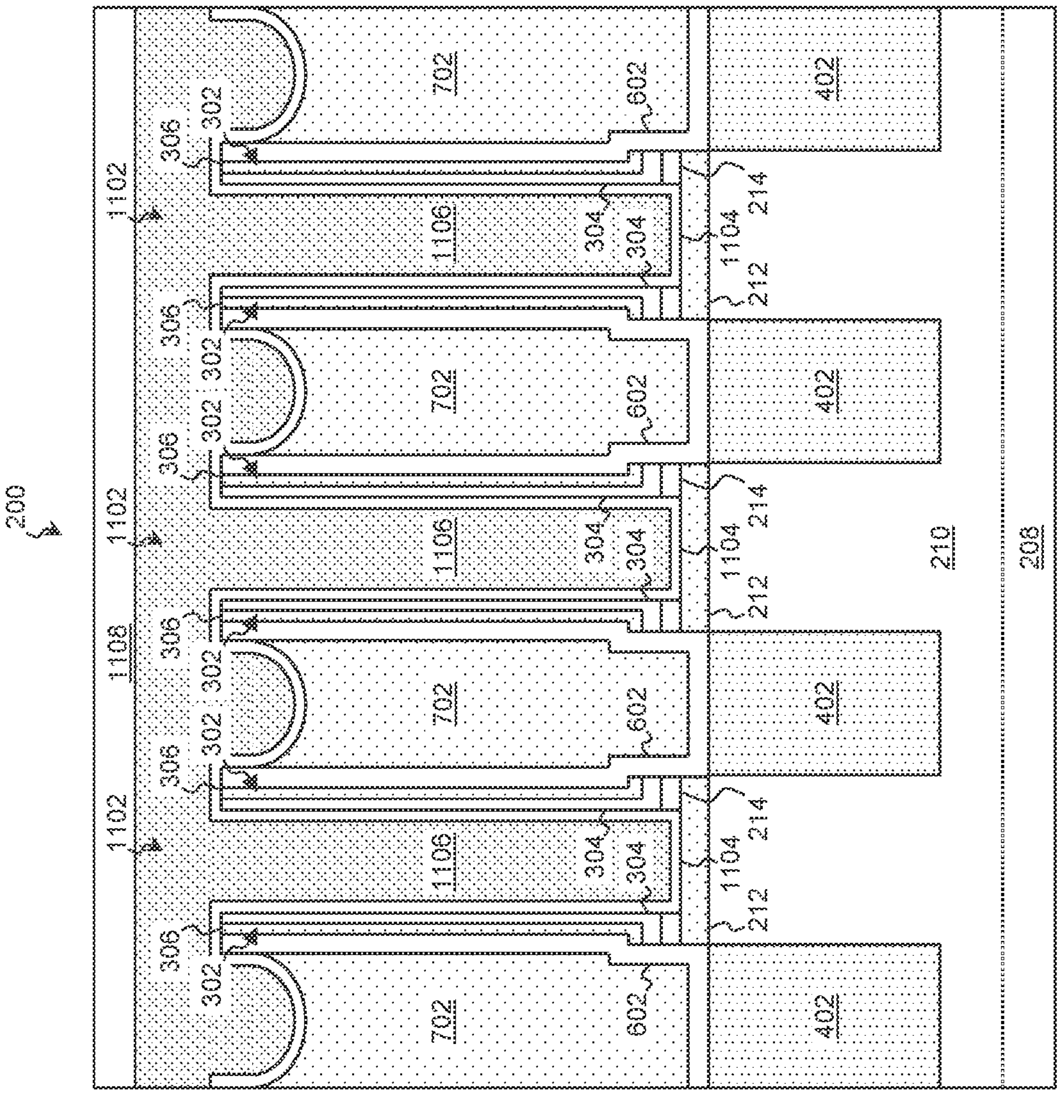
Figure 12:
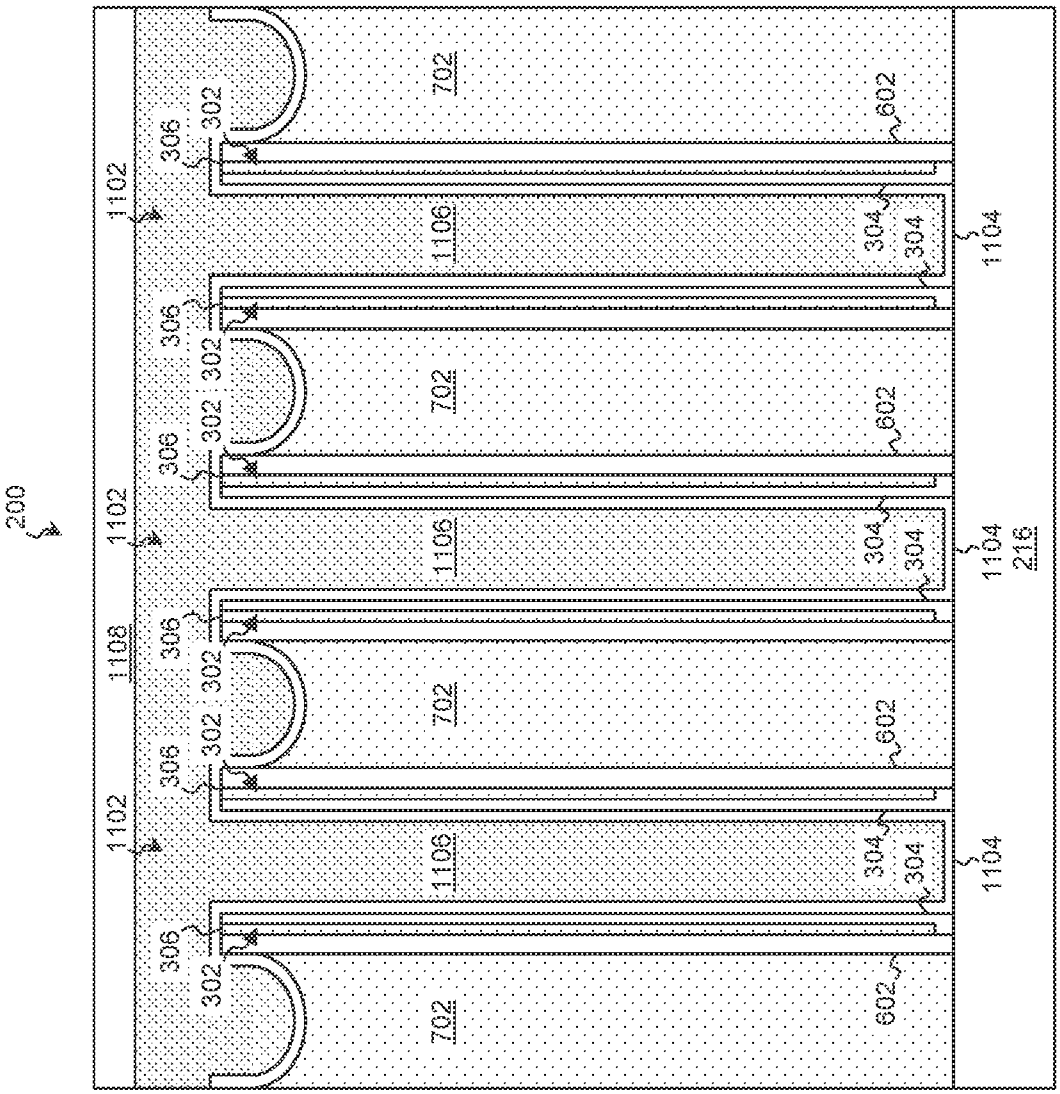
FIGS. 12, 14, 16, 18, 20, 22, 24, 26, 28, and 30 are cross-sectional illustrations of a workpiece taken in the fin-length direction that cut through an isolation feature according to various aspects of the present disclosure.

Referring to block 118 of FIG. 1A and to FIGS. 11 and 12, functional gates 1102 are formed in the recesses left by removing the placeholder gates 218. The functional gates 1102 may include multiple layers of dielectric and conductor materials. For clarity, the gate electrode 1106, which may itself include multiple layers of different materials, is shown as a single feature in the intermediate figures, and exemplary layers that form the gate electrode 1106 are shown in the context of the final structure.

In some examples, the forming of the functional gates 1102 in the recesses begins by forming an interfacial layer on the side surfaces of the fins 210. The interfacial layer may include an interfacial material, such as a semiconductor oxide, semiconductor nitride, semiconductor oxynitride, other semiconductor dielectrics, other suitable interfacial materials, and/or combinations thereof. The interfacial layer may be formed to any suitable thickness using any suitable process including thermal growth, ALD, CVD, HDP-CVD, PVD, spin-on deposition, and/or other suitable deposition processes. In some examples, the interfacial layer is formed by a thermal oxidation process and includes a thermal oxide of a semiconductor present in the fins 210 (e.g., silicon oxide for silicon-containing fins 210, silicon-germanium oxide for silicon-germanium-containing fins 210, etc.).

A gate dielectric 1104 is formed on the interfacial layer on the side surfaces of the fins 210 and is formed on the fin-top hard mask 212 on top of the fins 210. The gate dielectric 1104 may include one or more dielectric materials, which are commonly characterized by their dielectric constant relative to silicon dioxide. In some embodiments, the gate dielectric 1104 includes a high-k dielectric material, such as $HfO_2$, HfSiO, HfSiON, HfTaO, HfTiO, HfZrO, zirconium oxide, aluminum oxide, hafnium dioxide-alumina ($HfO_2$—$Al_2O_3$) alloy, other suitable high-k dielectric materials, and/or combinations thereof. Additionally or in the alternative, the gate dielectric 1104 may include other dielectrics, such as a semiconductor oxide, semiconductor nitride, semiconductor oxynitride, semiconductor carbide, amorphous carbon, TEOS, other suitable dielectric material, and/or combinations thereof. The gate dielectric 1104 may be formed using any suitable process including ALD, PEALD, CVD, Plasma Enhanced CVD (PE CVD), HDP-CVD, PVD, spin-on deposition, and/or other suitable deposition processes. The gate dielectric 1104 may be formed to any suitable thickness, and in some examples, the gate dielectric 1104 has a thickness of between about 0.1 nm and about 3 nm.

A gate electrode 1106 is formed on the gate dielectric 1104 above and between the fins 210. The gate electrode 1106 may include a number of different conductive layers, including capping layers, work function layers, and an electrode fill. For example, forming a gate electrode may include forming one or more capping layers on the gate dielectric 1104 to prevent migration of other gate materials into the gate dielectric 1104. The capping layer(s) may include any suitable conductive material including metals (e.g., W, Al, Ta, Ti, Ni, Cu, Co, etc.), metal nitrides, and/or metal silicon nitrides, and may be deposited via CVD, ALD, PE CVD, PEALD, PVD, and/or other suitable deposition processes. In various embodiments, the capping layer(s) include TaSiN, TaN, and/or TiN.

In some examples, forming a gate electrode 1106 includes forming one or more work function layers on the capping layer(s). Suitable work function layer materials include n-type and/or p-type work function materials based on the type of circuit device being formed. Exemplary p-type work function metals include TiN, TaN, Ru, Mo, Al, WN, $ZrSi_2$, $MoSi_2$, $TaSi_2$, $NiSi_2$, WN, other suitable p-type work function materials, and/or combinations thereof. Exemplary n-type work function metals include Ti, Ag, TaAl, TaAlC, TiAlN, TaC, TaCN, TaSiN, Mn, Zr, other suitable n-type work function materials, and/or combinations thereof. The work function layer(s) may be deposited by any suitable technique including ALD, PEALD, CVD, PE CVD, PVD, and/or combinations thereof. Because the p-channel and n-channel devices may have different work function layers, in some examples, the p-type work function layers are deposited in a first deposition process that uses a dielectric hard mask to prevent depositing on the electrodes of the n-channel devices, and the n-type work function layers are deposited in a second deposition process that uses a dielectric hard mask to prevent depositing on the electrodes of the p-channel devices.

In some examples, forming a gate electrode 1106 includes forming an electrode fill on the work function layer(s). The electrode fill may include any suitable material including metals (e.g., W, Al, Ta, Ti, Ni, Cu, Co, etc.), metal oxides, metal nitrides and/or combinations thereof, and in an example, the electrode fill includes tungsten. The electrode fill may be deposited by any suitable technique including ALD, PEALD, CVD, PE CVD, PVD, and/or combinations thereof.

Forming the functional gates 1102 may also include forming a conductive cap layer 1108 on the gate electrode 1106. The conductive cap layer 1108 may include any suitable conductive material including metals (e.g., W, Al, Ta, Ti, Ni, Cu, Co, etc.), metal oxides, metal nitrides and/or combinations thereof. The material(s) of the conductive cap layer 1108 may be deposited by any suitable technique including ALD, PEALD, CVD, PE CVD, PVD, and/or combinations thereof. In some examples, the conductive cap layer 1108 includes tungsten and is formed by a fluorine-free ALD process.

Figure 13:
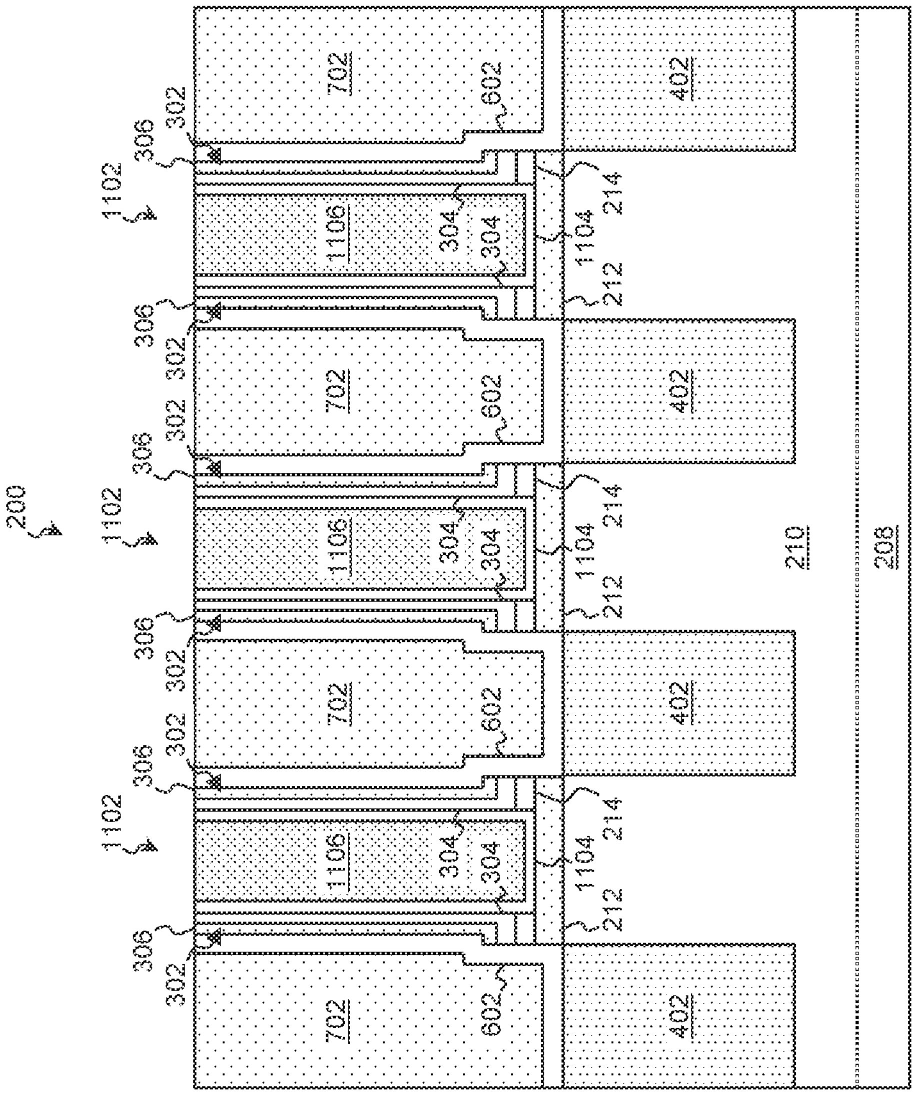
Figure 14:
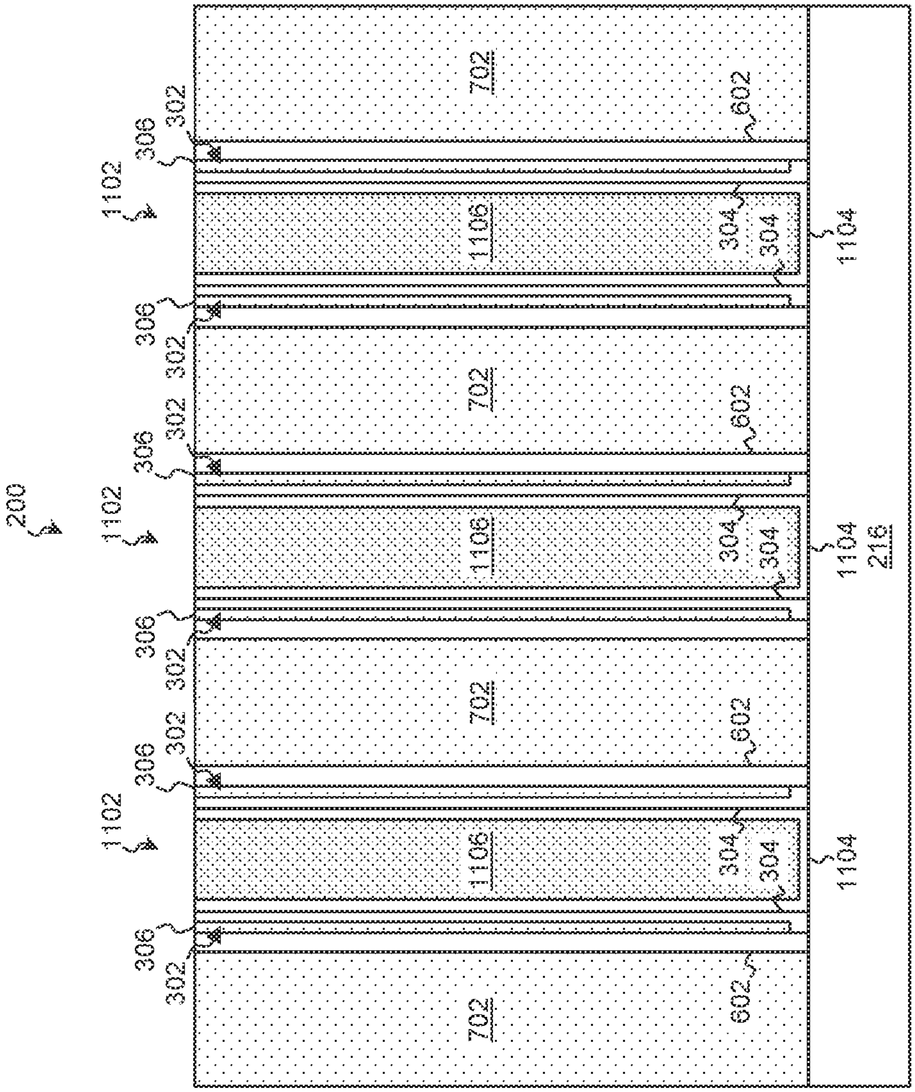

Referring to block 120 of FIG. 1A and to FIGS. 13-14, after depositing the materials that form the functional gates 1102, a CMP process is performed on the workpiece 200. The CMP process may remove some or all of the conductive cap layer 1108 from over the fins 210.

Figure 15:
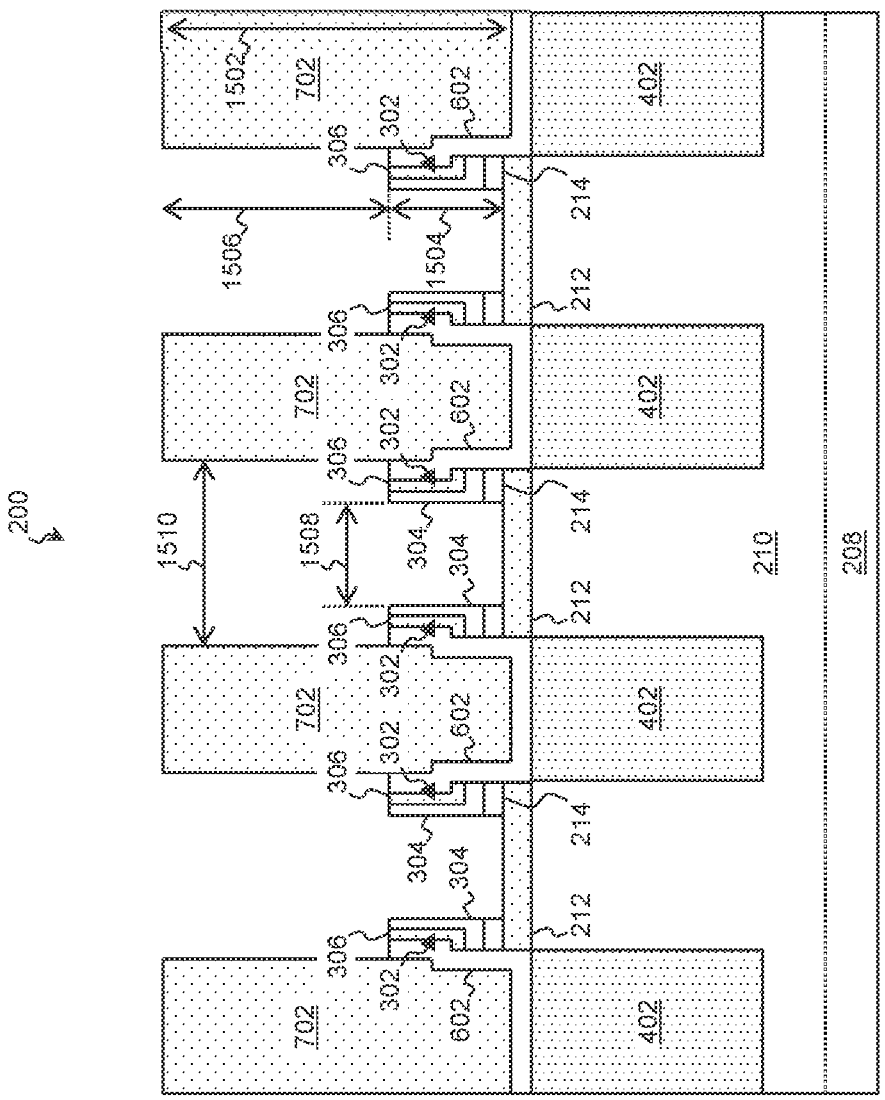
Figure 16:
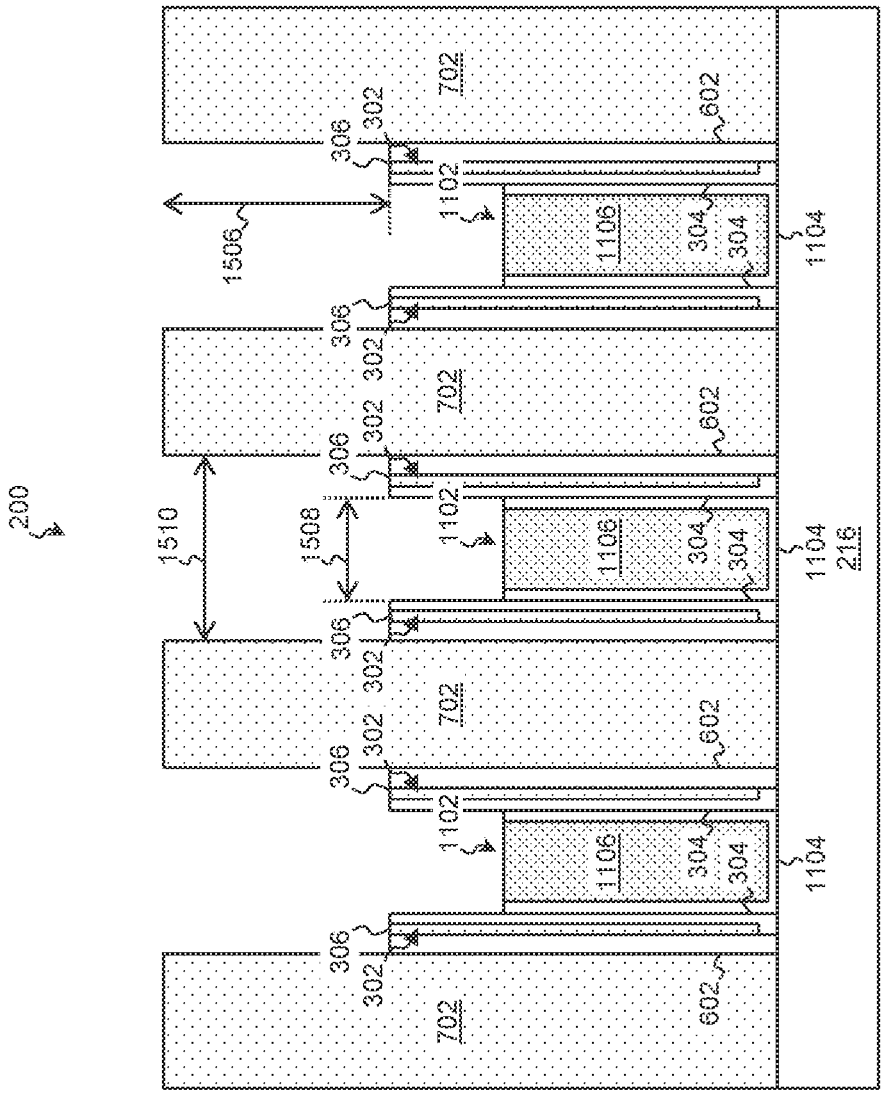

Referring to block 122 of FIG. 1B and to FIGS. 15-16, the materials of the functional gate 1102 are etched back to remove the functional gate 1102 from the top of the fins 210 while leaving the functional gate 1102 materials alongside the fins 210. This may include performing one or more etching processes (e.g., dry etching, wet etching, RIE, etc.) configured to etch the gate dielectric 1104 and the gate electrode 1106 without significant etching of the surrounding materials, such as the gate spacers 302, the fin-top hard mask 212, and the ILD layer 702. In particular, the process of block 122 may be configured to stop etching when the fin-top hard mask 212 is exposed. In this way, the topmost surfaces of the gate dielectric 1104 and the gate electrode 1106 alongside the fins 210 in FIG. 16 may be substantially coplanar with the topmost surface of the fin-top hard mask 212 in FIG. 15.

Referring to block 124 of FIG. 1B and referring still to FIGS. 15-16, the uppermost portions of the gate spacers 302 (e.g., gate spacer layers 304 and 306) are etched back to create additional space for gate contacts to couple to the functional gates 1102. This may include etching back the BCESL 602 so that the top of the BCESL remains substantially coplanar with the top of the gate spacers 302. The etch back of the gate spacers 302 may include one or more etching processes (e.g., dry etching, wet etching, RIE, etc.) configured to etch the gate spacer layers 304 and 306 and/or the BCESL 602 without significant etching of the surrounding materials. The etching may be configured to stop while some portion of the gate spacers 302 remains over the fins 210 and over the functional gates 1102. In various examples where the ILD layer 702 extends about 100 nm above the fin 210 as indicated by marker 1502, the remaining gate spacers 302 may have a height between about 25 nm and about 75 nm as indicated by marker 1504, while between about 25 nm and 75 nm of the ILD layer 702 is free of the gate spacers 302 as indicated by marker 1506. In various such examples, after etching, the height 1504 of the gate spacer 302 over the fins 210 is between about 30% and about 60% of the height 1502 of the ILD layer 702 over the fins 210.

By etching back the gate spacers 302, additional space is created for the gate contacts. In some examples, the recess between the gate spacers 302 is between about 10 nm and about 15 nm in width as indicated by marker 1508, while the recess above the gate spacers 302 is between about 15 nm and about 25 nm in width as indicated by marker 1510. Because the aspect ratio of a recess affects how evenly contact materials are deposited, reducing the height of the narrower recess between the gate spacers 302 may improve the quality and uniformity of the resulting contacts.

Figure 17:
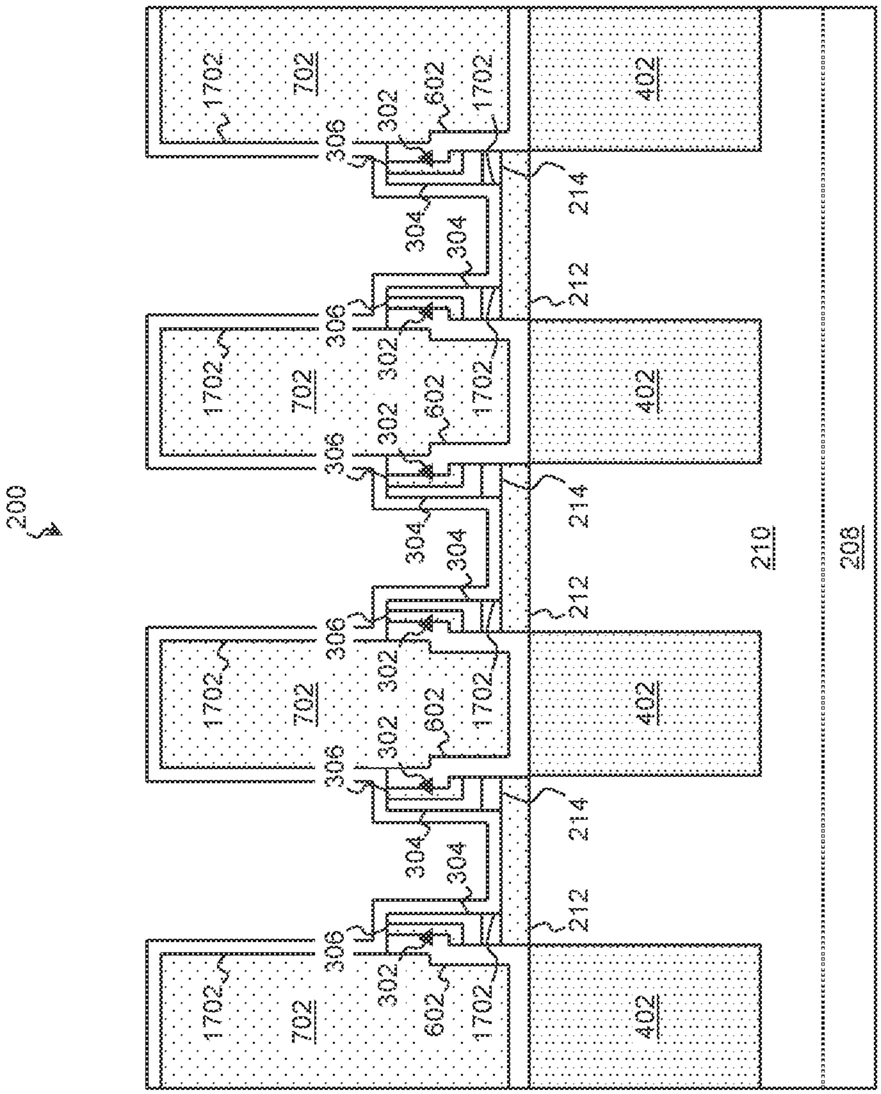
Figure 18:
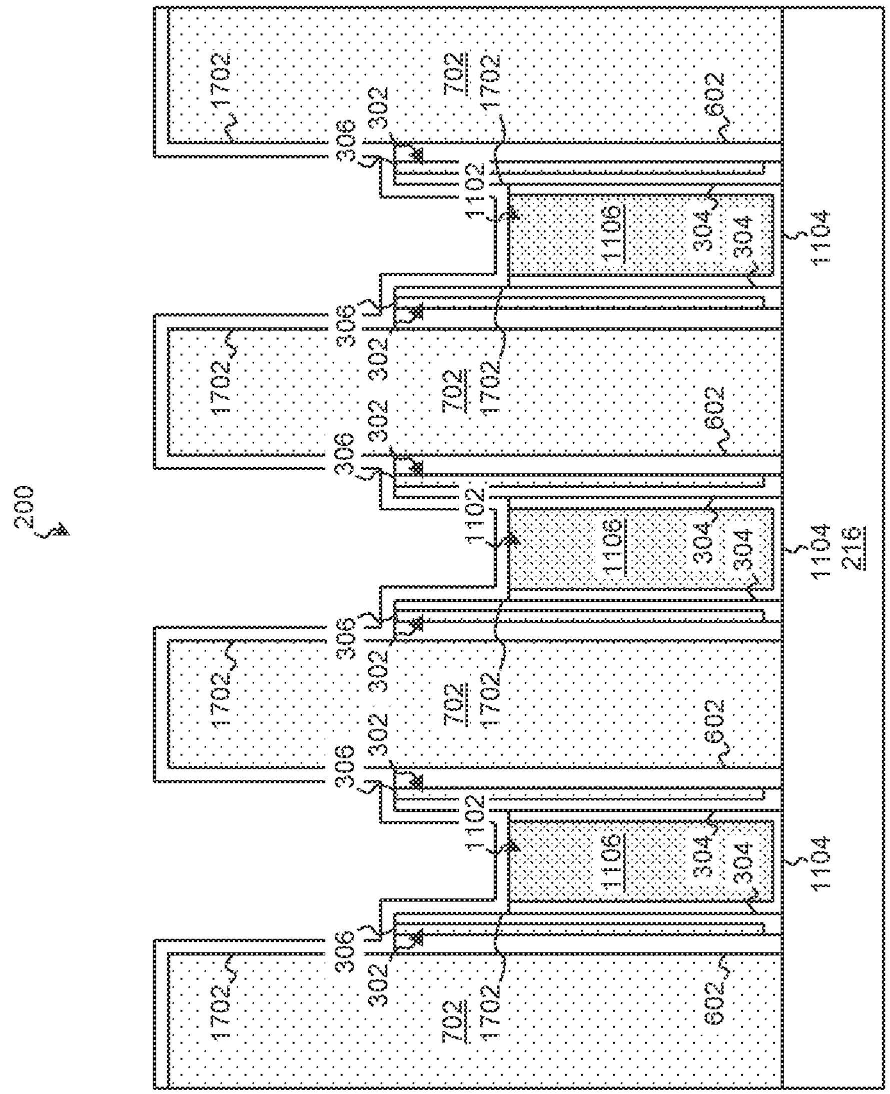

Referring to block 126 of FIG. 1B and to FIGS. 17-18, an additional gate spacer layer (third gate spacer layer 1702) is formed on the side surfaces of the existing gate spacers 302. The third gate spacer layer 1702 may also be formed on top surfaces of the gate spacers 302, the BCESL 602, the fin-top hard mask 212, the gate dielectric 1104, and the gate electrode 1106 as well as the side surfaces of the ILD layer 702. The third gate spacer layer 1702 may be formed using any suitable deposition technique (e.g., ALD, CVD, HDP-CVD, etc.). The third spacer layer 1702 may be formed to any suitable thickness, and in some such examples, the third spacer layer 1702 has a thickness between about 1 nm and about 5 nm. By forming the third spacer layer 1702 on the functional gate 1102 after the gates have been formed, the gate spacer 302 is thinner alongside the gate 1102 than above the gates, which may improve the ability to form the layers of the functional gates 1102 between the gate spacers 302.

The third gate spacer layer 1702 may include one or more layers of suitable materials, such as a dielectric material (e.g., a semiconductor oxide, a semiconductor nitride, a semiconductor oxynitride, a semiconductor carbide, a semiconductor oxycarbonitride, etc.). In some such examples, the third gate spacer layer 1702 includes a low-k dielectric material (e.g., SiCN, SiOC, SiOCN, etc.) that may be the same or different from a material of the first spacer layer 304 and the second spacer layer 306.

Figure 19:
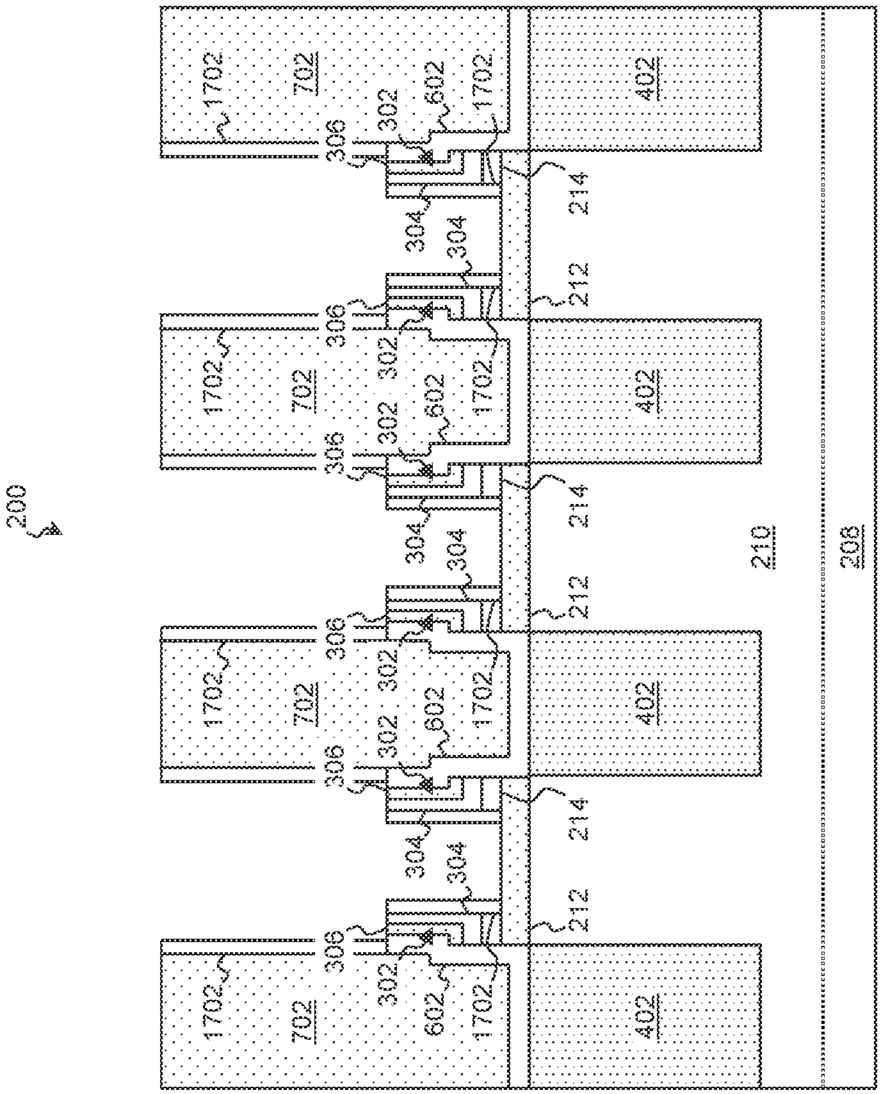
Figure 20:
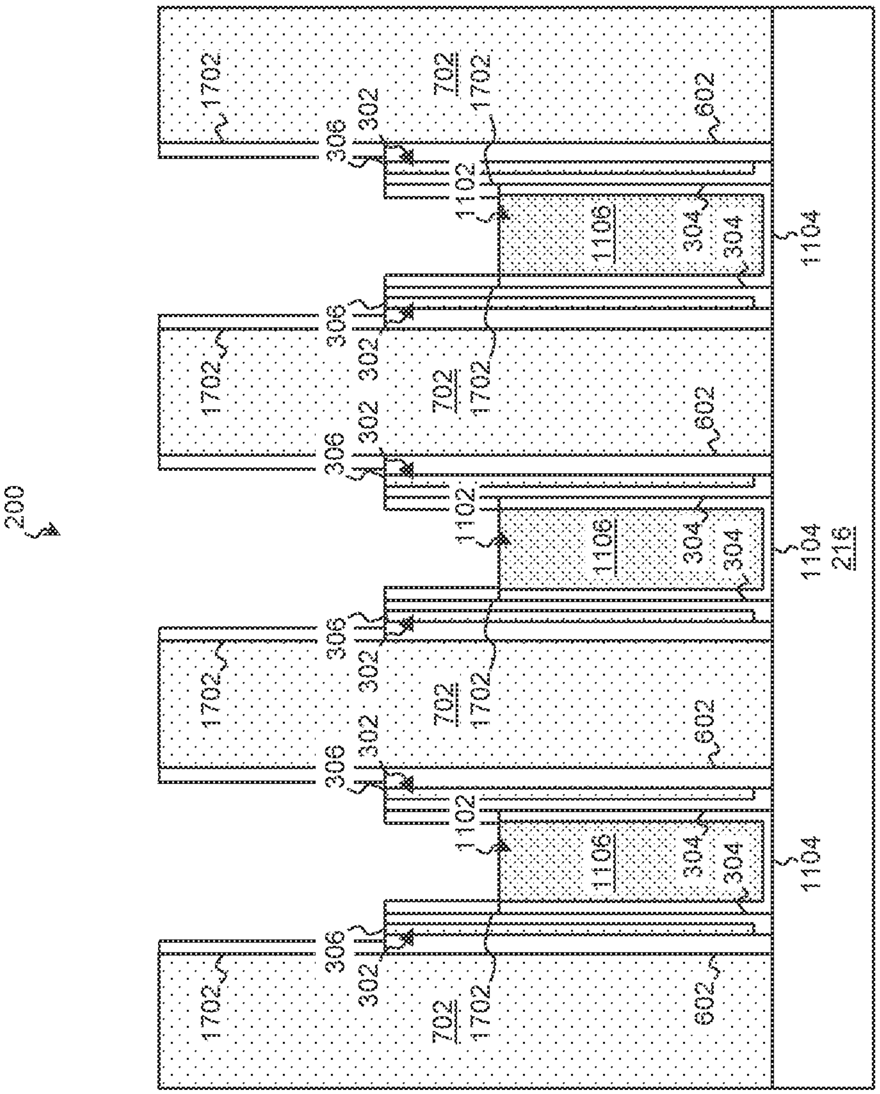

Referring to block 128 of FIG. 1B and to FIGS. 19-20, a break-thru etching is performed on the third gate spacer layer 1702 to expose at least the top of the gate electrode 1106. In some examples, the break-thru etching is configured to remove the third spacer layer 1702 from horizontal surfaces (e.g., the top surfaces of the gate spacers 302, the BCESL 602, the fin-top hard mask 212, the gate dielectric 1104, and/or the gate electrode 1106), while leaving the third spacer layer 1702 on the vertical surfaces of the gate spacer 302 and/or the ILD layer 702. The etching may use any suitable technique including anisotropic dry etching, wet etching, and/or RIE and may be configured to remove the third gate spacer layer 1702 from the horizontal surfaces without significant etching of the surrounding materials.

Figure 21:
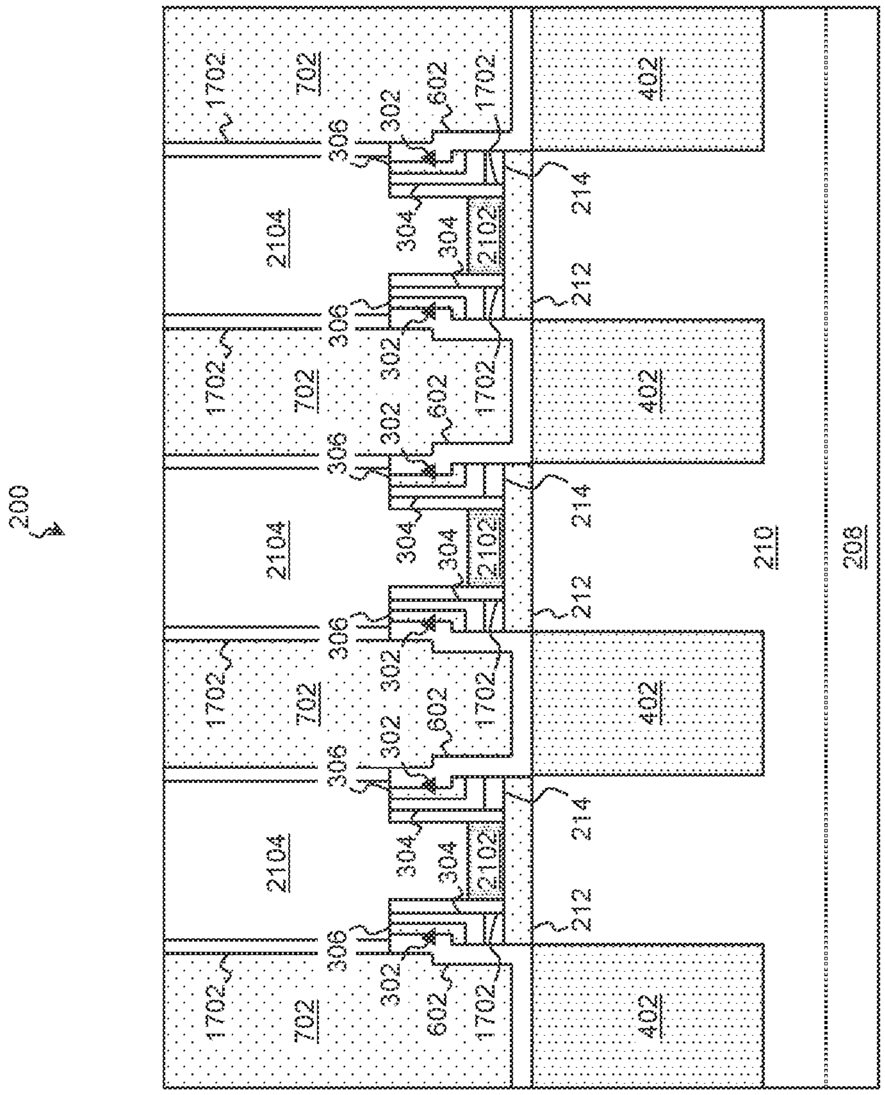
Figure 22:
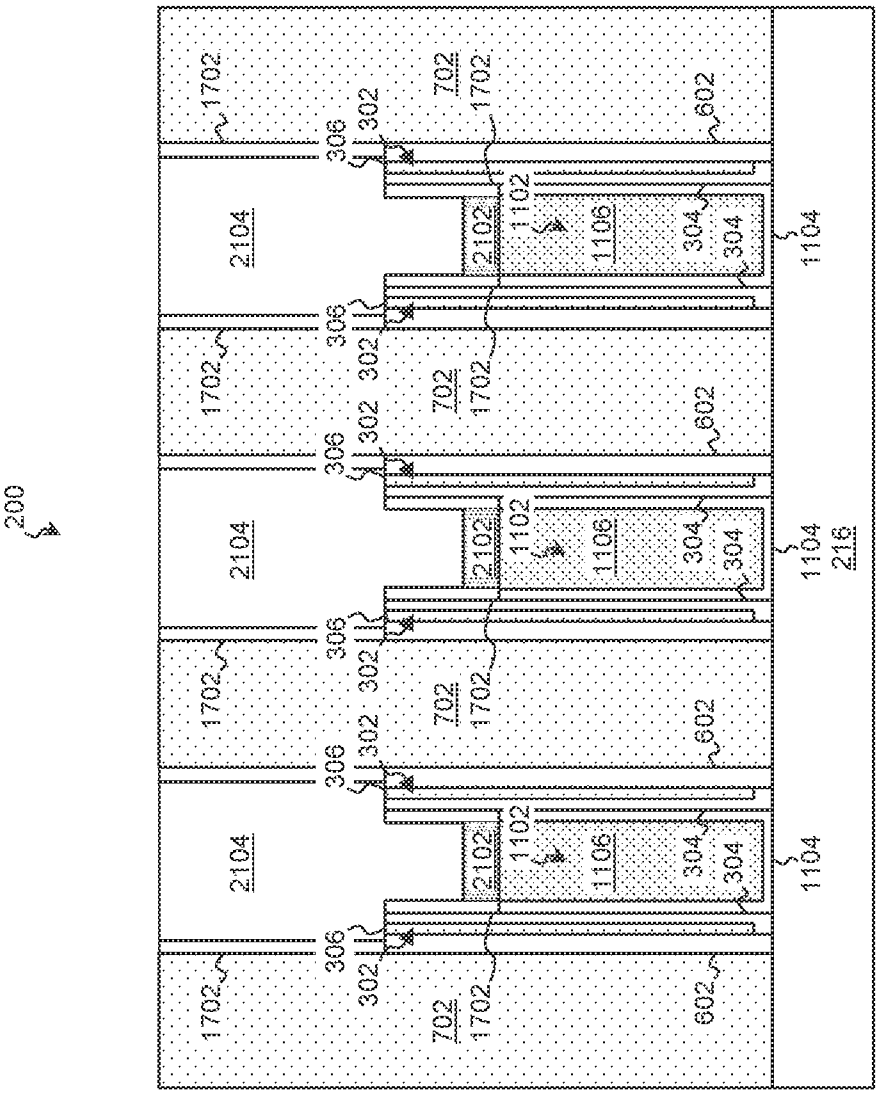

Referring to block 130 of FIG. 1B and to FIGS. 21-22, a second conductive cap layer 2102 is formed on the gate electrode 1106 and on the fin-top hard mask 212. The second conductive cap layer 2102 extends over a fin 210 and the fin-top hard mask 212 to couple gate electrodes 1106 on opposite sides of the fin 210. In particular, the second conductive cap layer 2102 extends between the gate spacers 302 and physically contacts the third gate spacer layer 1702 of the gate spacers 302. The second conductive cap layer 2102 may include any suitable conductive material including metals (e.g., W, Al, Ta, Ti, Ni, Cu, Co, etc.), metal oxides, metal nitrides and/or combinations thereof, and in an example, the second conductive cap layer 2102 includes tungsten. The material(s) of the second conductive cap layer 2102 may be deposited by any suitable technique including ALD, PEALD, CVD, PE CVD, PVD, and/or combinations thereof. In some examples, the second conductive cap layer 2102 includes tungsten and is formed by a fluorine-free ALD process. The second conductive cap layer 2102 may be formed to any suitable thickness, and in some examples, the second conductive cap layer 2102 has a thickness between about 2 nm and about 10 nm.

In examples where the third gate spacer layer 1702 is formed on the side surfaces of the ILD layer 702, the third gate spacer layer 1702 may be removed from these surfaces as shown in blocks 132-138. Referring first to block 132 of FIG. 1B and referring still to FIGS. 21-22, a sacrificial material 2104 is formed on the second conductive cap layer 2102 within a recess defined by the third gate spacer layer 1702. The sacrificial material 2104 may include any suitable material such as a dielectric, amorphous silicon, and/or other suitable materials, and the material(s) may be selected to have a different etch selectivity than, for example, the third gate spacer layer 1702 and the second conductive cap layer 2102.

Figure 23:
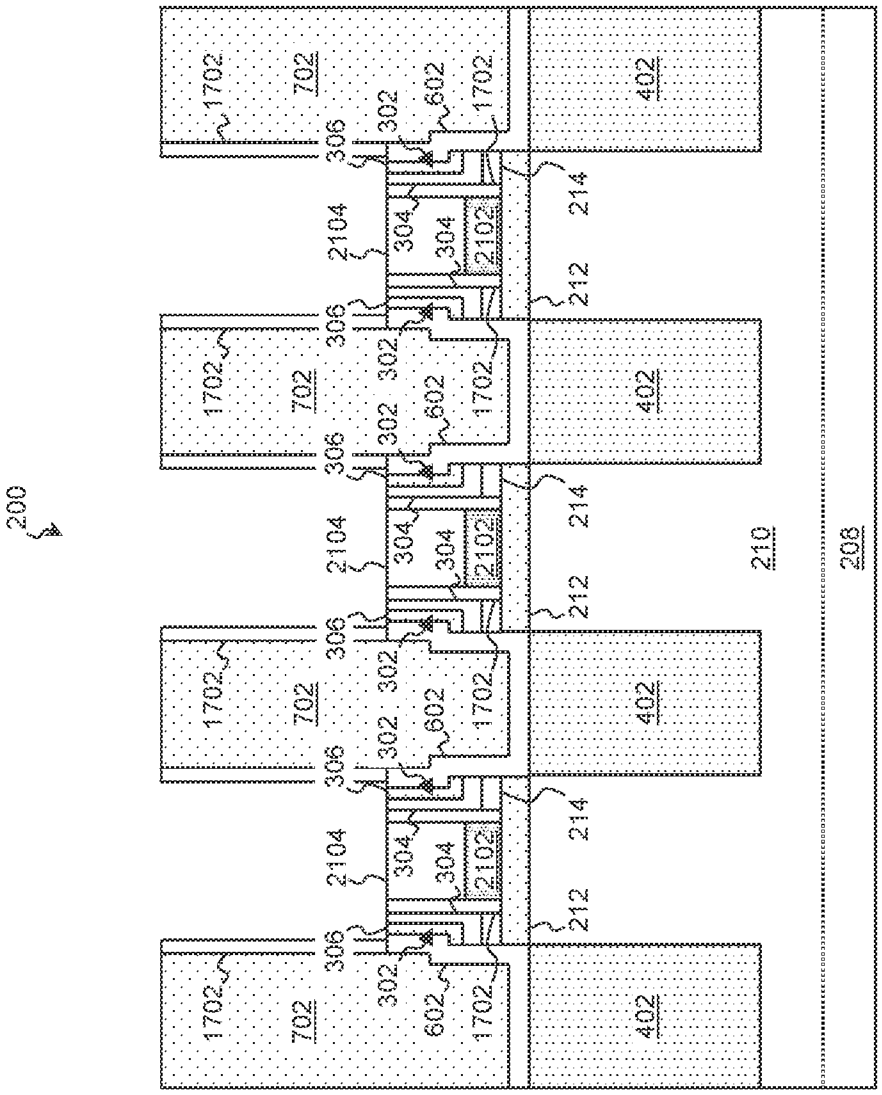
Figure 24:
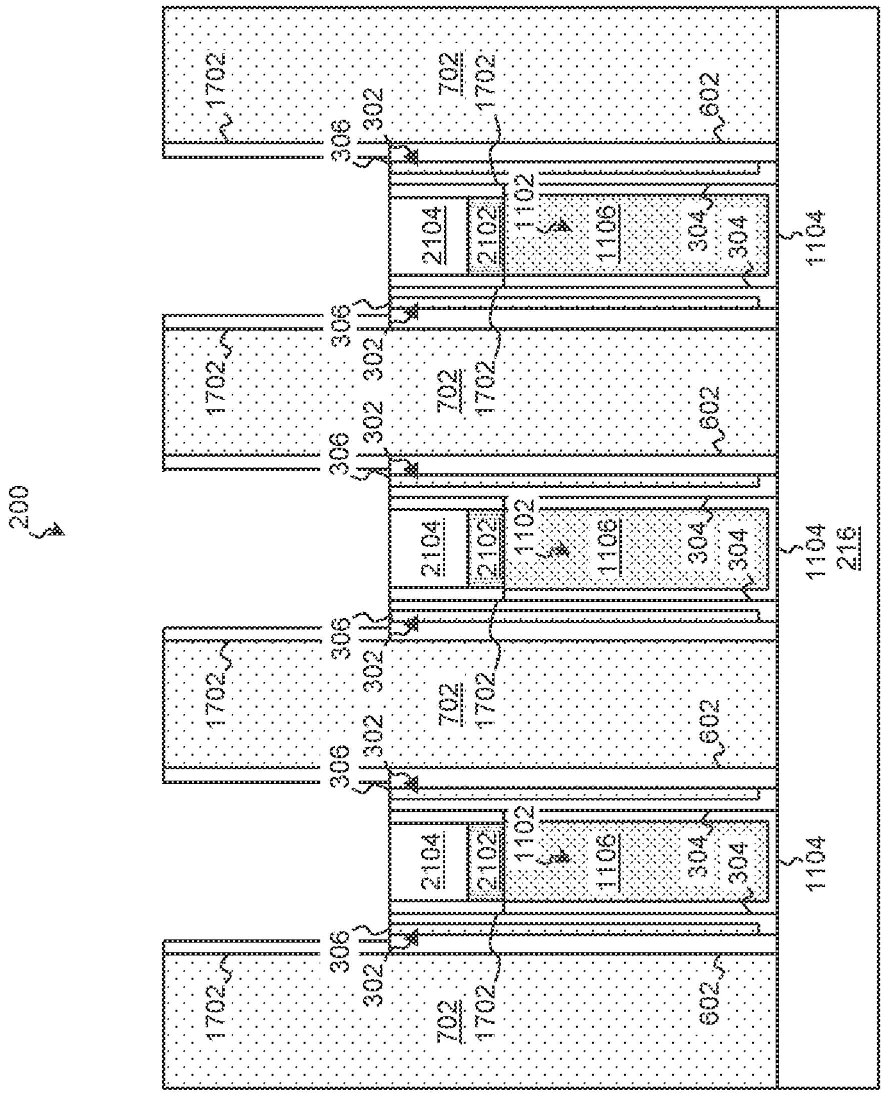

Referring to block 134 of FIG. 1B and to FIGS. 23-24, the sacrificial material 2104 is etched back to expose the portions of the third gate spacer layer 1702 on the side surfaces of the ILD layer 702. The etching may be controlled to protect the portions of the third gate spacer layer 1702 disposed on the side surfaces of the gate spacers 302. Accordingly, after etching, a top surface of the sacrificial material 2104 may be substantially coplanar with a top surface of the gate spacers 302 and a top surface of the BCESL 602. The etching process may use any suitable etching technique including wet etching, dry etching, and/or RIE.

Figure 25:
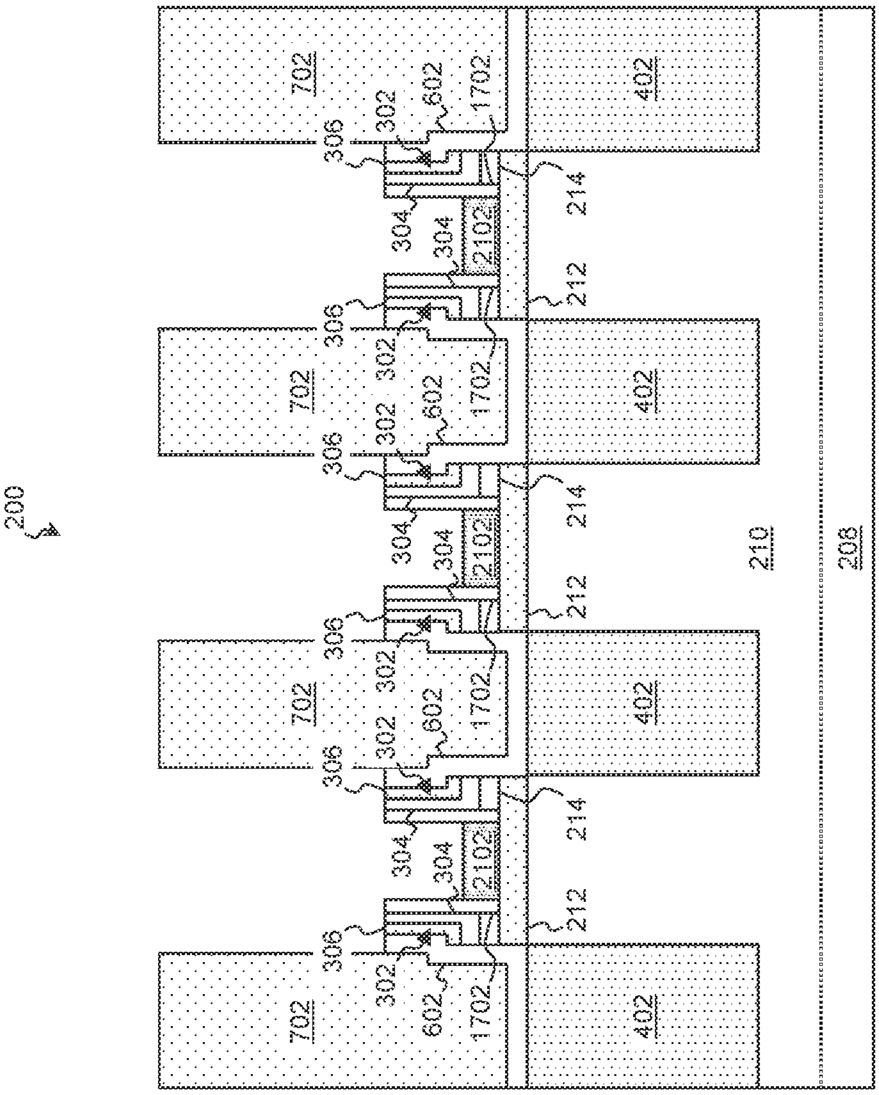
Figure 26:
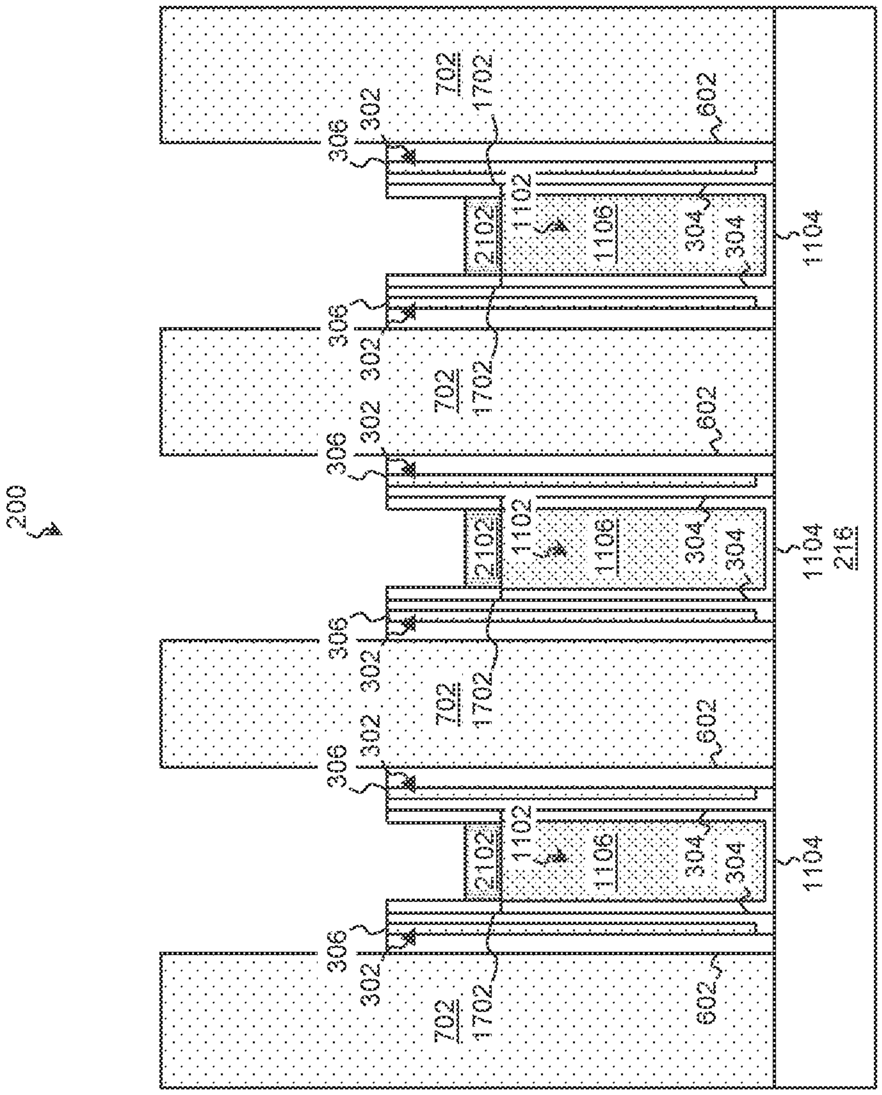

Referring to block 136 of FIG. 1B and to FIGS. 25-26, the exposed portions of the third gate spacer layer 1702 on the side surfaces of the ILD layer 702 are removed. The third gate spacer layer 1702 may be removed using any suitable etching technique including wet etching, dry etching, and/or RIE. The particular etching technique(s) and etchant(s) may be selected to avoid significant etching of surrounding materials such as the ILD layer 702, the gate spacers 302, and/or the BCESL 602.

Referring to block 138 of FIG. 1B and referring still to FIGS. 25-26, the remaining sacrificial material 2104 may be removed. This may be performed substantially as described in block 134.

Figure 27:
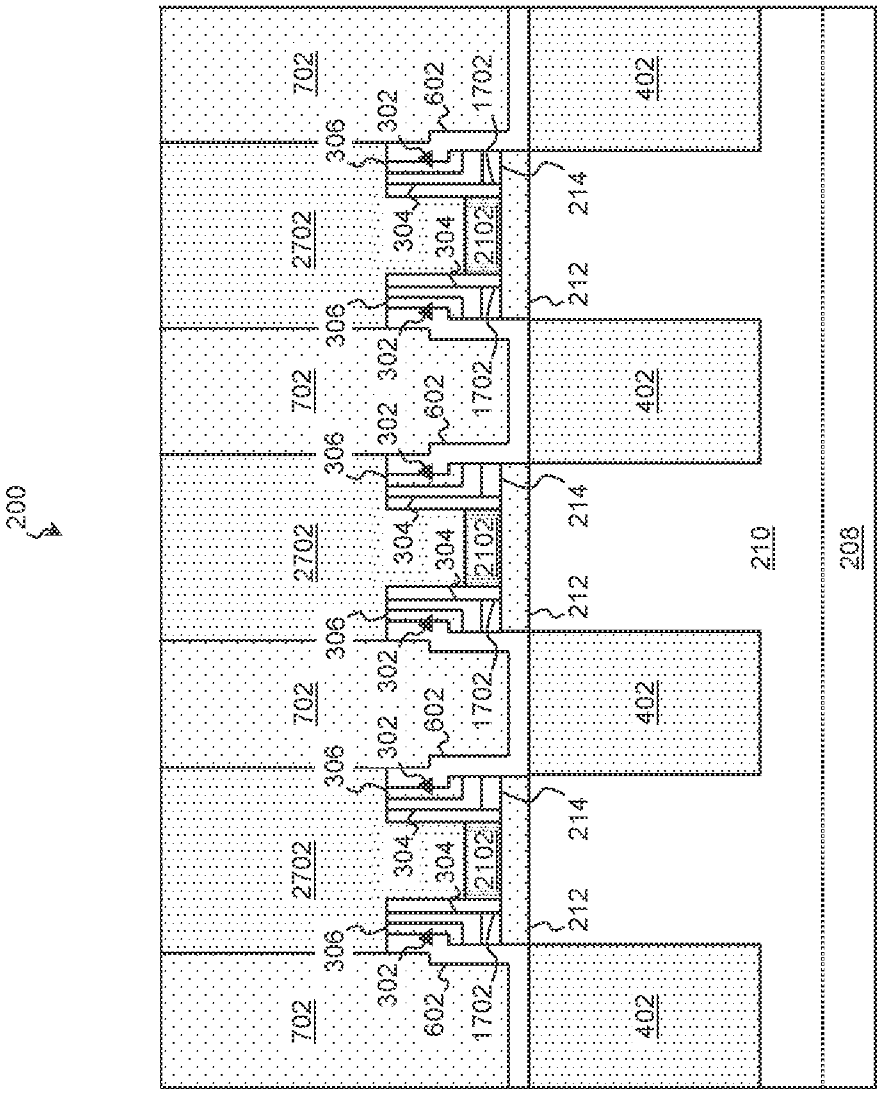
Figure 28:
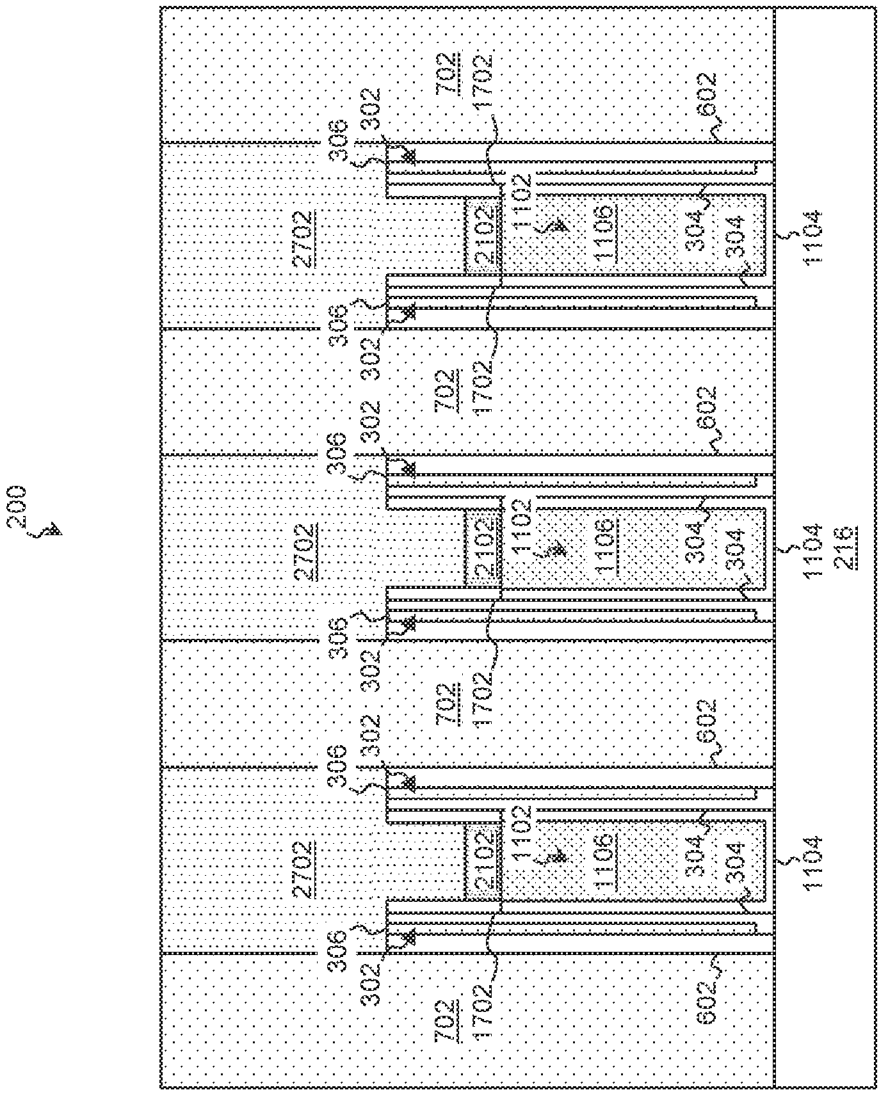

Referring to block 140 of FIG. 1B and to FIGS. 27-28, a Self-Aligned Contact (SAC) dielectric layer 2702 is formed on the second conductive cap layer 2102 over the fin 210 and over the functional gate 1102. The SAC dielectric layer 2702 may include any suitable material, such as one or more dielectric materials including a semiconductor oxide, a semiconductor nitride, a semiconductor oxynitride, a semiconductor carbide, a semiconductor carbonitride, a semiconductor oxycarbonitride, and/or a metal oxide. In various examples, the SAC dielectric layer 2702 includes HfO, ZrO, AlO, LaO, BN, silicon oxide, silicon nitride, silicon carbonitride, silicon oxynitride, and/or silicon oxycarbonitride.

The SAC dielectric layer 2702 may be formed by any suitable process, and in some examples, the SAC dielectric layer 2702 is deposited using CVD, PECVD, HDP-CVD, PVD, ALD, PEALD, and/or other deposition processes. The deposition may be followed by a CMP process to remove material outside of the gate region, and the planarized SAC dielectric layer 2702 within the gate region may have any suitable thickness following the CMP process. In various examples, the SAC dielectric layer 2702 has a thickness between about 50 nm and about 150 nm.

Figure 29:
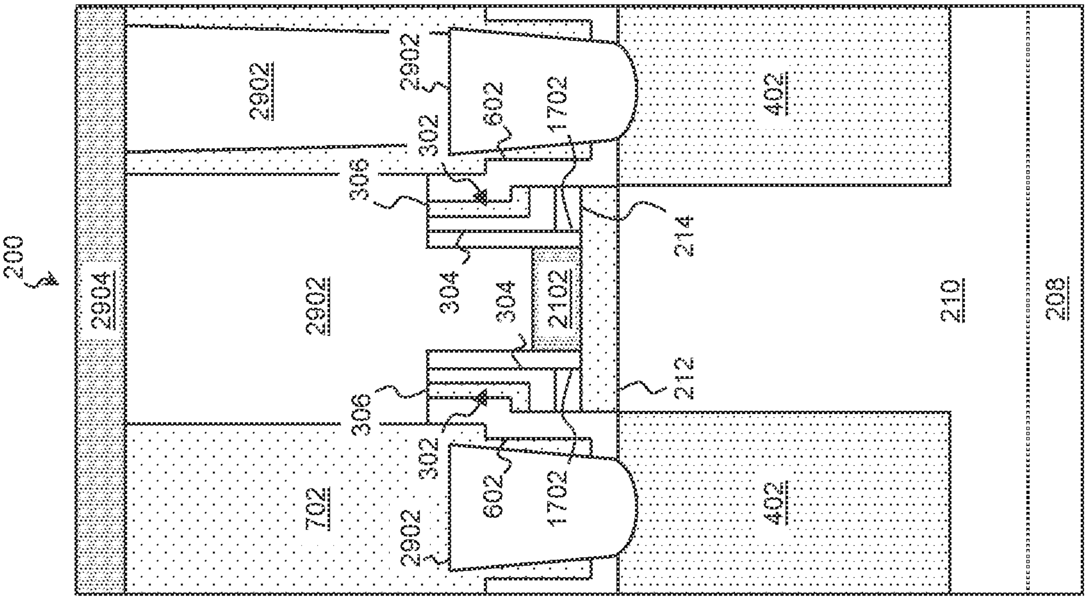
Figure 30:
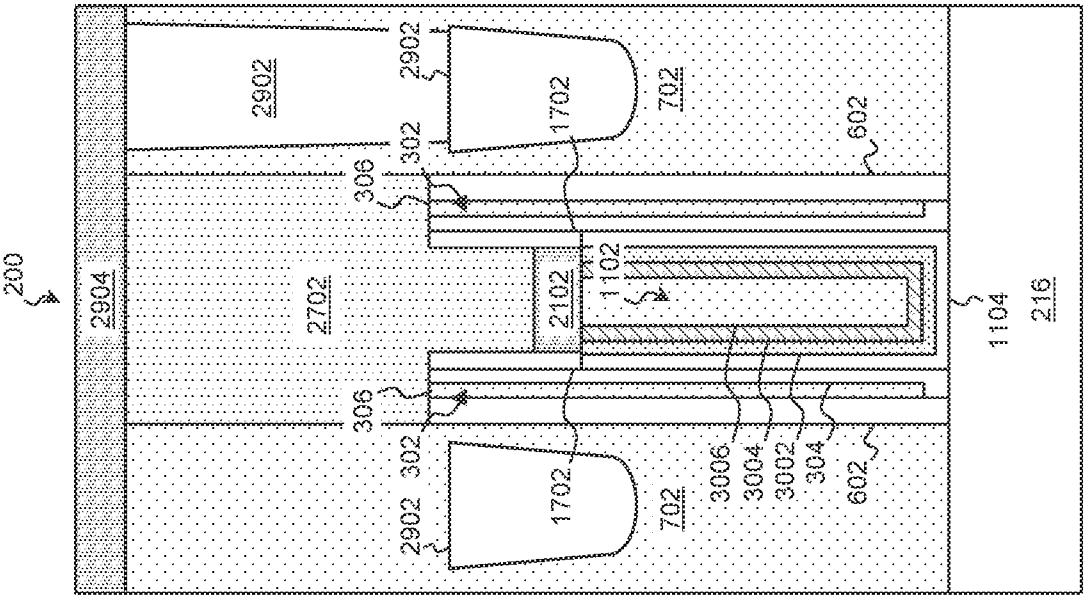
Figure 31:
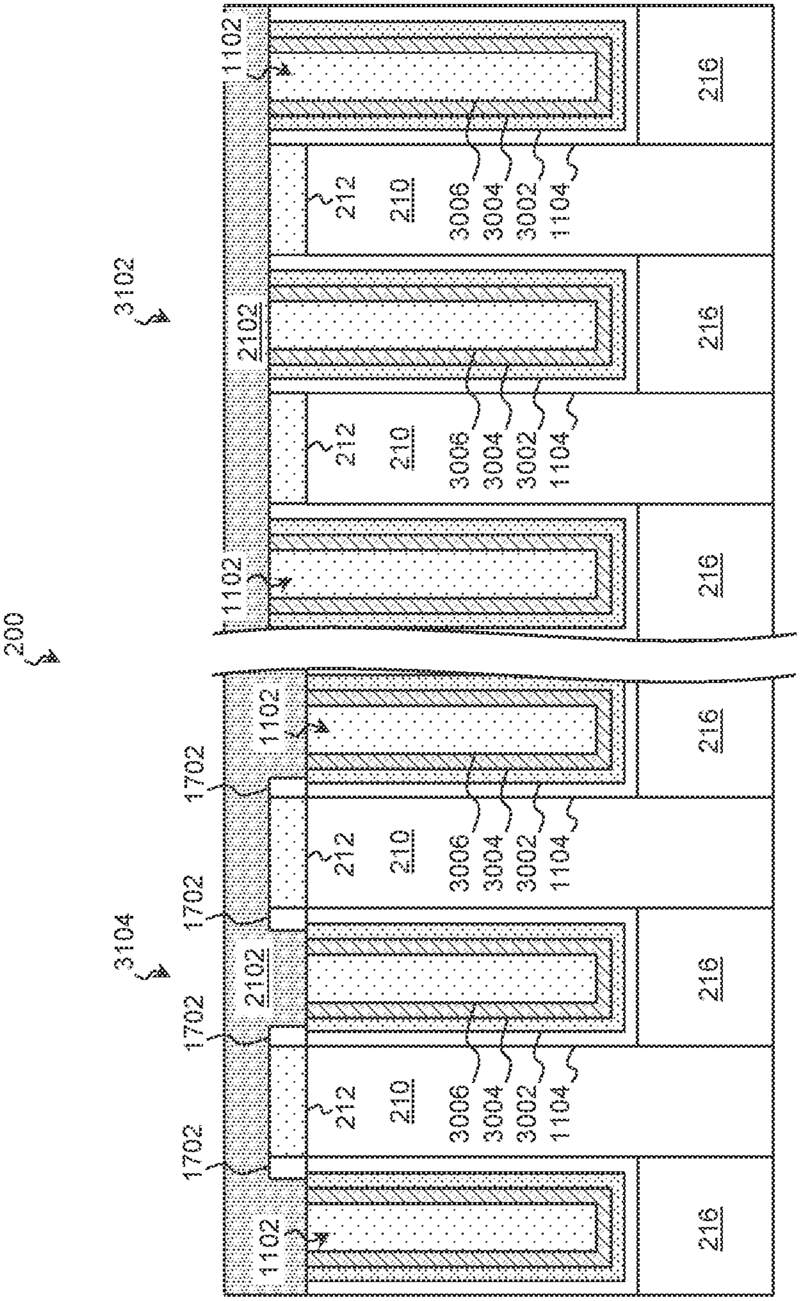
FIG. 31 is a cross-sectional illustration of a workpiece taken in a gate-length direction that cuts through a gate structure according to various aspects of the present disclosure.

Referring to block 142 of FIG. 1B and to FIGS. 29-31, the workpiece 200 may then be provided for further fabrication. In various examples, this includes forming contacts 2902 electrically coupling to the source/drain features 402 and to the functional gates 1102, forming a Contact Etch Stop Layer (CESL) 2904 on the ILD layer 702 and the contacts 2902, forming a remainder of an electrical interconnect structure, dicing, packaging, and other fabrication processes.

By thinning the gate spacer layers 304 and 306 and by forming the third gate spacer layer 1702 on top of the functional gate 1102 rather than alongside, some examples of the present technique provide a relatively wider recess in which to form the functional gate 1102. In general, a wider functional gate 1102 provides better control of the carriers through the channel region and reduces or avoids adverse short channel effects such as drain-induced barrier lowering, punchthrough, velocity saturation, and hot carrier degradation. Wider functional gates 1102 may also reduce contact alignment issues. Accordingly, the present technique may achieve these benefits and others without encroaching on the contacts 2902 and thereby compromising contact formation. Moreover, by removing the functional gate 1102 from the top of the fins 210, the gate capacitance may be reduced, which in turn may improve switching speed and the AC response of the transistor.

FIGS. 30-31 show the material layers of the gate electrode 1106 in more detail and includes a capping layer 3002, a work function layer 3004, and an electrode fill 3006 each substantially as described above.

Referring to FIG. 31, two regions of the workpiece 200 are shown. In a first region 3102, the functional gate 1102 extends alongside the fin 210 and the fin-top hard mask 212 to a top surface of the fin-top hard mask 212. However, due to process conditions such as the etch rate, in a second region 3104, the functional gate 1102 extends alongside the fin 210 but stops at or near the bottom of the fin-top hard mask 212. Instead, the side surfaces of the fin-top hard mask 212 are covered by the third gate spacer layer 1702. Both configurations are equally suitable.

Figure 33:
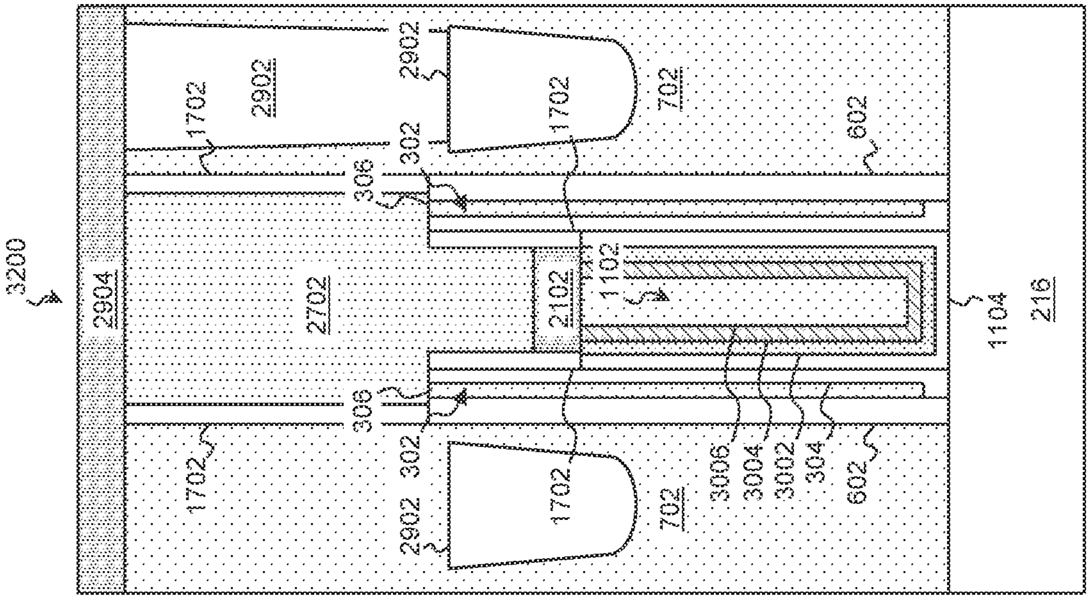
FIG. 33 is a cross-sectional illustration of a workpiece taken in the fin-length direction that cuts through an isolation feature according to various aspects of the present disclosure.
Figure 32:
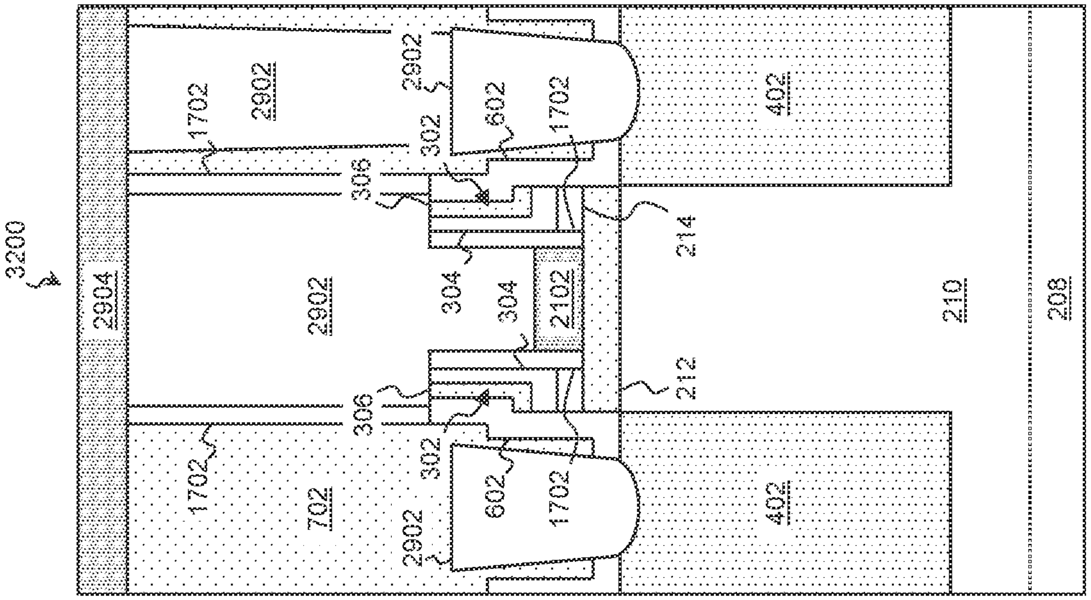
FIG. 32 is a cross-sectional illustration of a workpiece taken in a fin-length direction that cuts through a fin according to various aspects of the present disclosure.
Figure 34:
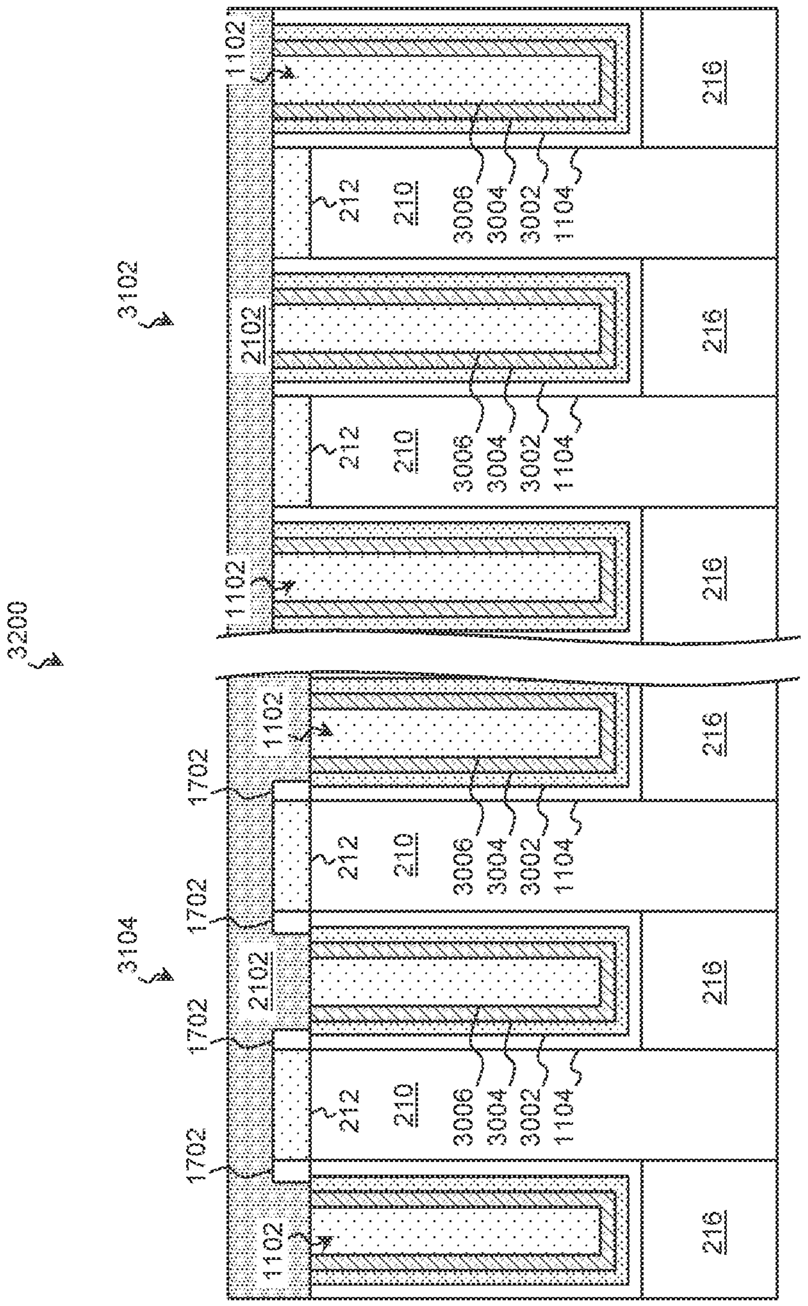
FIG. 34 is a cross-sectional illustration of a workpiece taken in a gate-length direction that cuts through a gate structure according to various aspects of the present disclosure.

Referring next to FIGS. 32-34, another workpiece 3200 is illustrated that is also formed by method 100. FIG. 32 is a cross-sectional illustration of the workpiece 3200 taken in a fin-length direction that cuts through a fin according to various aspects of the present disclosure. FIG. 33 is a cross-sectional illustration of the workpiece 3200 taken in the fin-length direction that cuts through an isolation feature according to various aspects of the present disclosure. FIG. 34 is a cross-sectional illustration of the workpiece 3200 taken in a gate-length direction that cuts through a gate structure according to various aspects of the present disclosure.

The workpiece 3200 is substantially similar to workpiece 200 except that the process of removing the third gate spacer layer 1702 from the side surfaces of the ILD layer 702 of blocks 132-138 are omitted. Accordingly, the third gate spacer layer 1702 is disposed between the ILD layer 702 and SAC dielectric layer 2702 and/or between the ILD layer 702 and the contacts 2902 depending on whether the SAC dielectric layer 2702 was replaced by a contact 2902 at a particular location.

Figure 35:
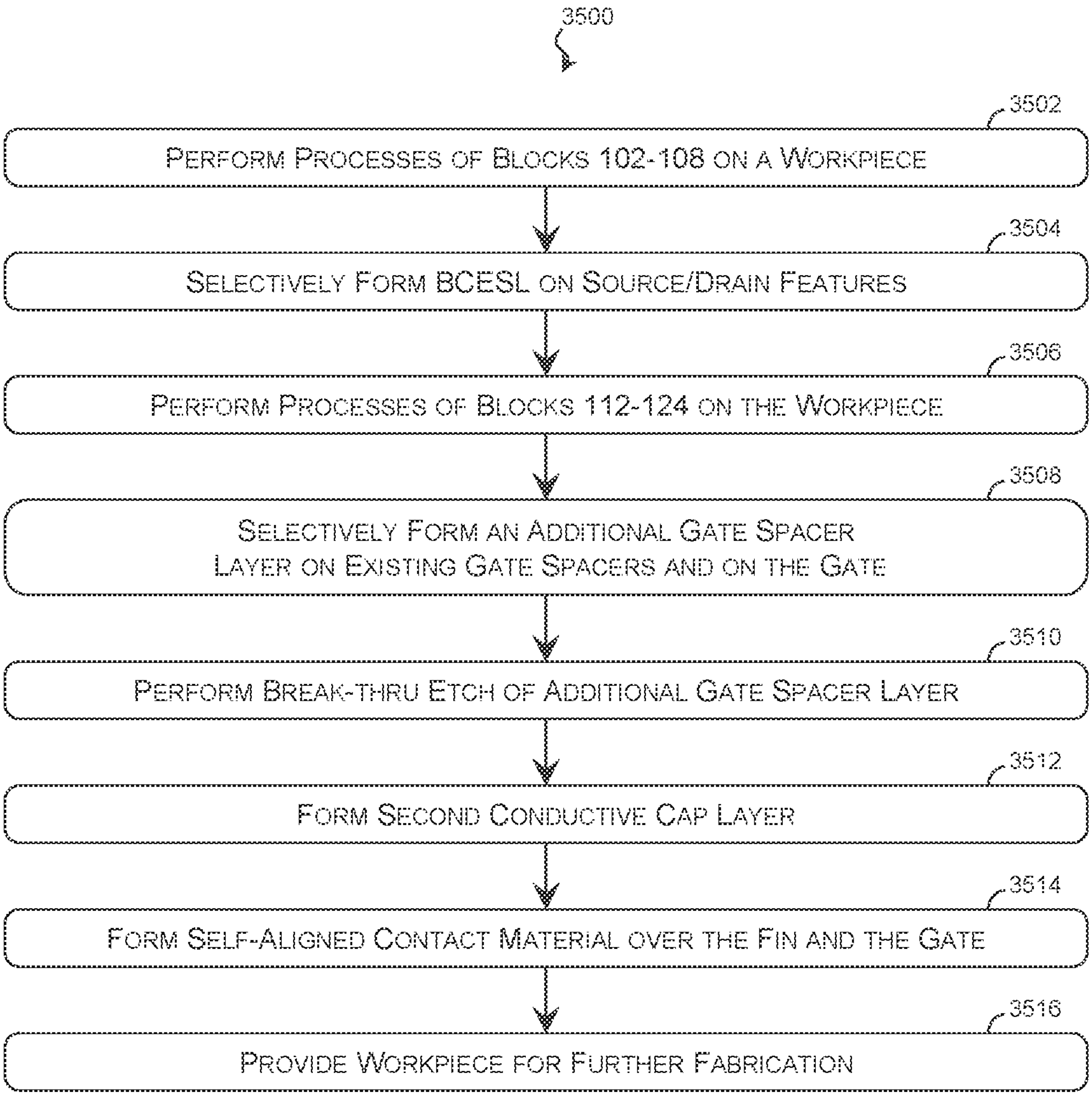
FIG. 35 is a flow diagrams of a method of fabricating a workpiece using selective deposition according to various aspects of the present disclosure.

Further examples that use an alternative technique for forming a Bottom Contact Etch Stop Layer are described with references to FIGS. 35-50. FIG. 35 is a flow diagram of a method 3500 of fabricating a workpiece 3600 using selective deposition according to various aspects of the present disclosure. Additional steps can be provided before, during, and after the method 3500, and some of the steps described can be replaced or eliminated for other embodiments of the method 3500. FIGS. 36-38, 40, 42, 44, 46, and 48 are cross-sectional illustrations of the workpiece 3600 taken in a fin-length direction that cut through a fin according to various aspects of the present disclosure. FIGS. 39, 41, 43, 45, 47, and 49 are cross-sectional illustrations of the workpiece 3600 taken in the fin-length direction that cut through an isolation feature according to various aspects of the present disclosure. FIG. 50 is a cross-sectional illustration of a workpiece 3600 taken in a gate-length direction that cuts through a gate structure according to various aspects of the present disclosure.

Figure 36:
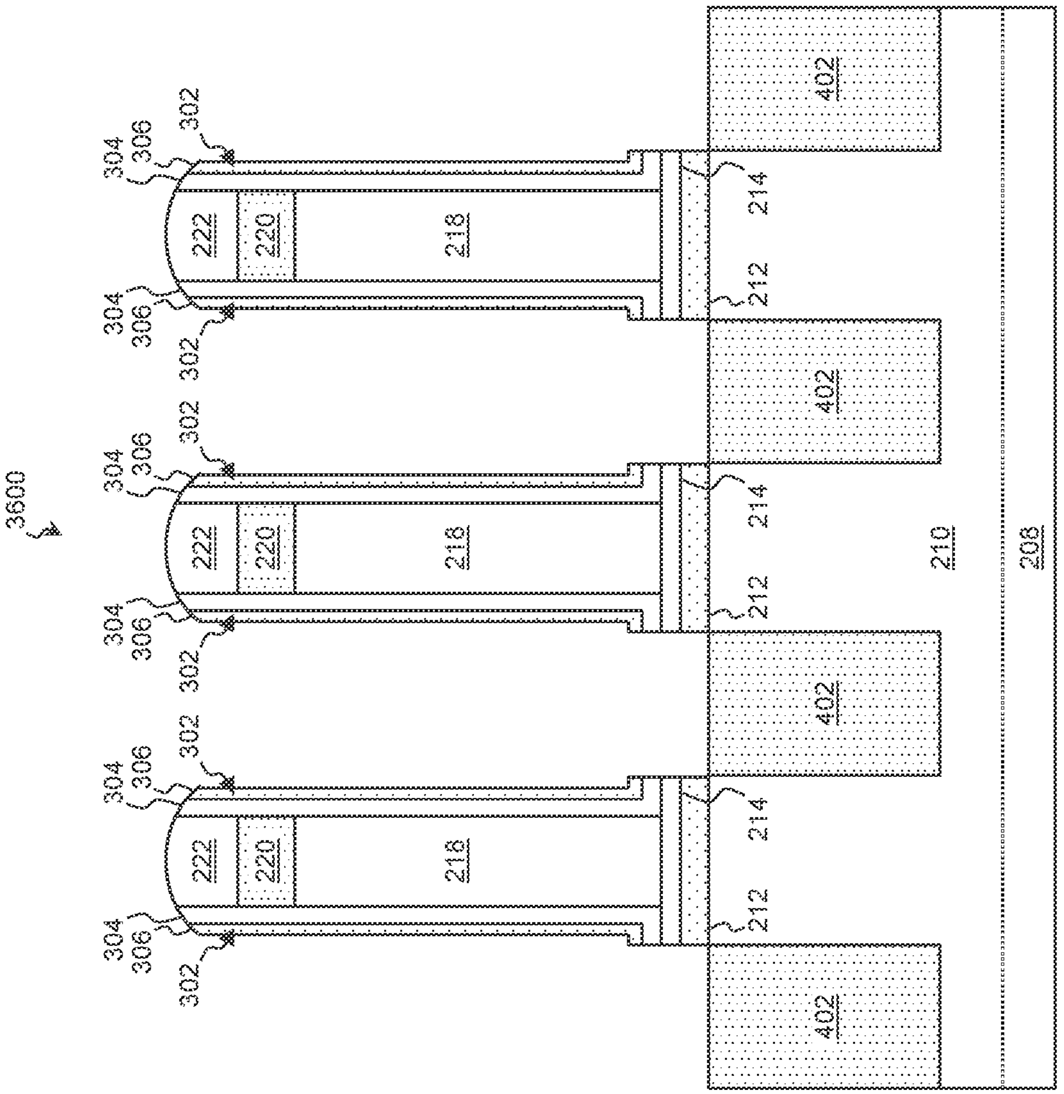
FIGS. 36-38, 40, 42, 44, 46, and 48 are cross-sectional illustrations of a workpiece taken in a fin-length direction that cut through a fin according to various aspects of the present disclosure.

Referring to block 3502 of FIG. 35 and to FIG. 36, the processes of blocks 102-108 of FIG. 1A are performed substantially as described above. Accordingly, a workpiece 3600 may be received that is substantially similar to workpiece 200. The workpiece 3600 includes a substrate 208, fins 210 extending from the substrate, a fin-top hard mask 212 disposed on the fins 210, an I/O oxide layer 214 disposed on the fins 210 and the fin-top hard mask 212, placeholder gates 218 disposed on the fins, and gate hard mask layers 220 and 222 disposed on the placeholder gates 218. Gate spacers 302 (e.g., gate spacer layers 304 and 306) are formed on side surfaces of the placeholder gates 218. Source/drain features 402 are formed on opposite sides of the placeholder gates 218. An etching process is performed to thin the outermost layer of the gate spacers 302 (e.g., gate spacer layer 306).

Figure 37:
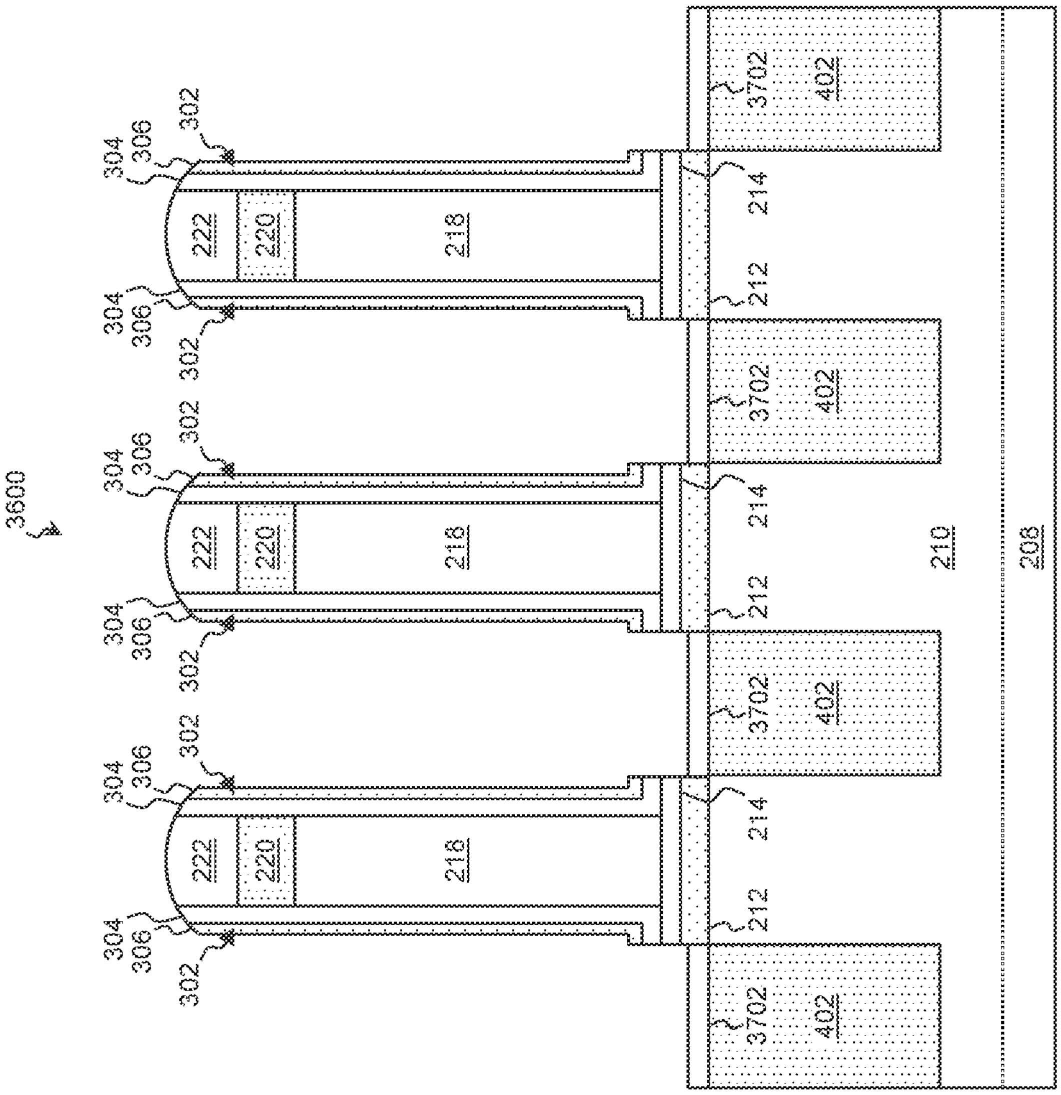

Referring to block 3504 of FIG. 35 and to FIG. 37, a BCESL 3702 is selectively formed on the source/drain features 402. A number of suitable techniques may be used to prevent formation of the BCESL 3702 elsewhere, such as on the side surfaces of the gate spacers 302. In some such examples, a pre-treatment is applied to the workpiece 3600 to remove a native oxide from the source/drain features 402. The pre-treatment may include applying a wet chemical solution (e.g., HF, HCl, and/or other solutions) to the workpiece 3600, applying a vacuum such as an ultra-high vacuum (i.e., approximately on the order of $10^{-8}$ Torr or less), and/or other suitable cleaning techniques.

An inhibitor may be selectively formed on the surfaces where the BCESL 3702 is to be excluded. For example, an inhibitor may be deposited on the side surfaces of the gate spacers 302 (e.g., gate spacer layer 306). The inhibitor may be configured to prevent adhesion of the subsequently formed BCESL 3702 and may include a dielectric, a polymer, and/or other suitable materials.

After the inhibitor is applied, the BCESL 3702 is formed on the source/drain features 402. The BCESL 3702 may be deposited by any suitable technique, including ALD, PEALD, CVD, PECVD, and/or HDP-CVD, and the inhibitor may prevent the BCESL 3702 from being deposited on those surfaces where the inhibitor is present.

The BCESL 3702 may include a dielectric (e.g., a semiconductor oxide, a semiconductor nitride, a semiconductor oxynitride, a semiconductor carbide, etc.) and/or other suitable material, and in various embodiments, the BCESL 3702 includes SiN, SiO, SiON, and/or SiC. The BCESL 3702 may be formed to any suitable thickness, and in some examples, the BCESL 3702 has a thickness between about 1 nm and about 10 nm.

After the BCESL 3702 is formed, any remaining inhibitor may be removed.

Figure 38:
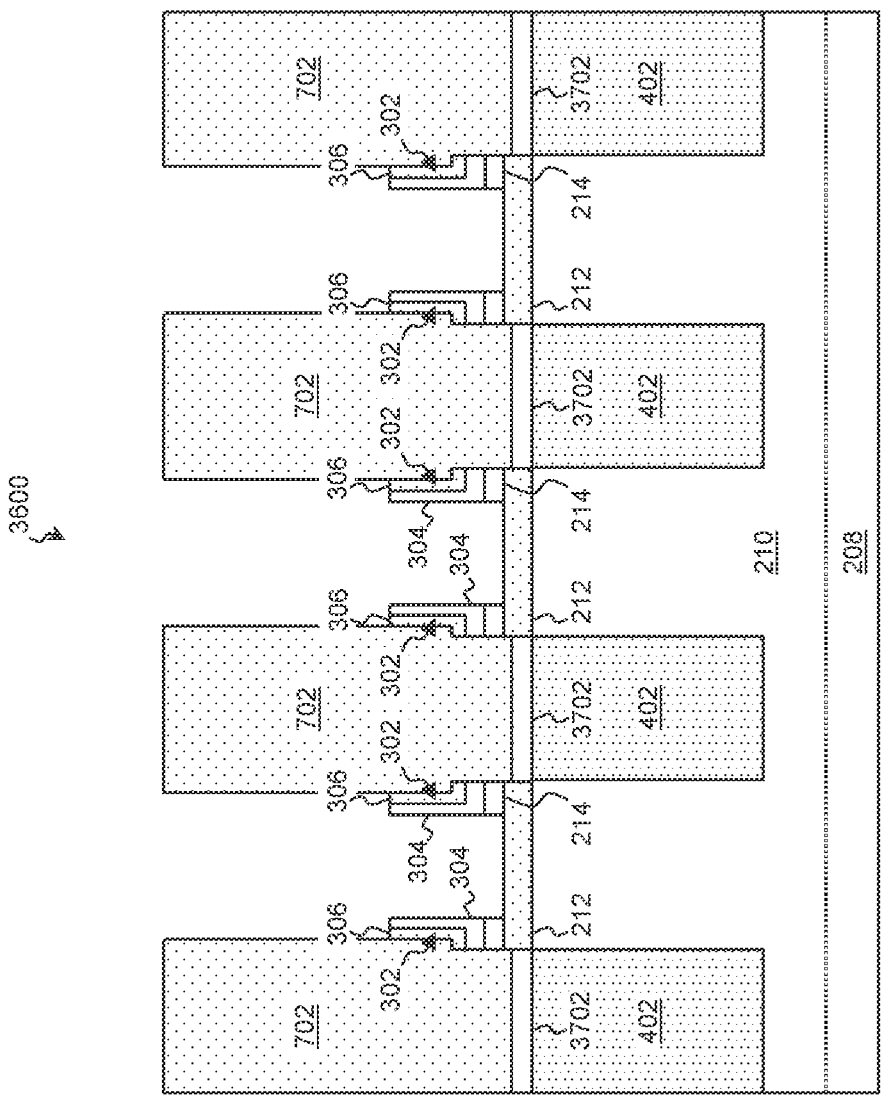
Figure 39:
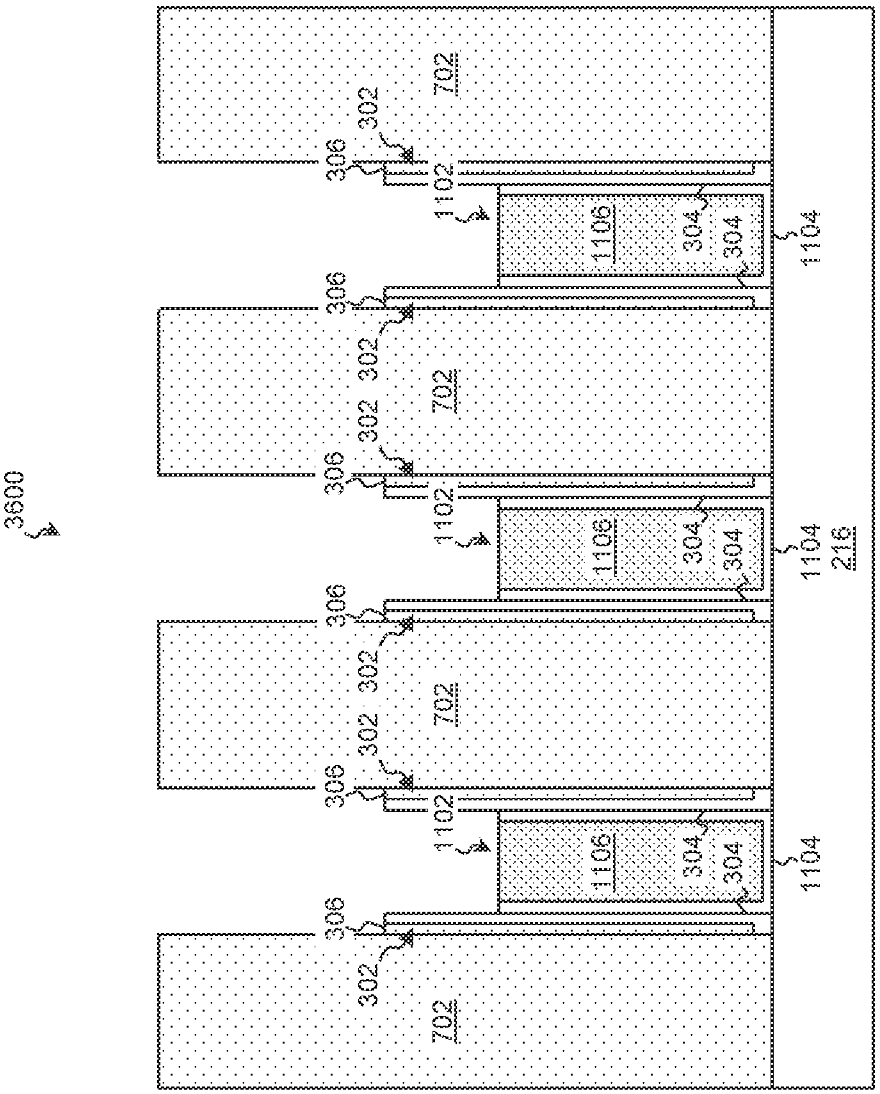
FIGS. 39, 41, 43, 45, 47, and 49 are cross-sectional illustrations of a workpiece taken in the fin-length direction that cut through an isolation feature according to various aspects of the present disclosure.

Referring to block 3506 of FIG. 35 and to FIGS. 38-39, blocks 112-124 of FIGS. 1A-1B are performed on the workpiece 3600. In some examples, an Inter-Level Dielectric (ILD) layer 702 is formed on the workpiece 3600, and the remaining placeholder gates 218 are removed. A portion of the I/O oxide layer 214 exposed by removing the placeholder gates 218 is also removed. Functional gates 1102 are formed in the recesses left by removing the placeholder gates 218, and a CMP process is performed on the workpiece 3600. The materials of the functional gate 1102 are etched back to remove the functional gate 1102 from the top of the fins 210 while leaving the functional gate 1102 materials alongside the fins 210. The uppermost portions of the gate spacers 302 (e.g., gate spacer layers 304 and 306) are etched back to create additional space for gate contacts to couple to the functional gates 1102.

Figure 40:
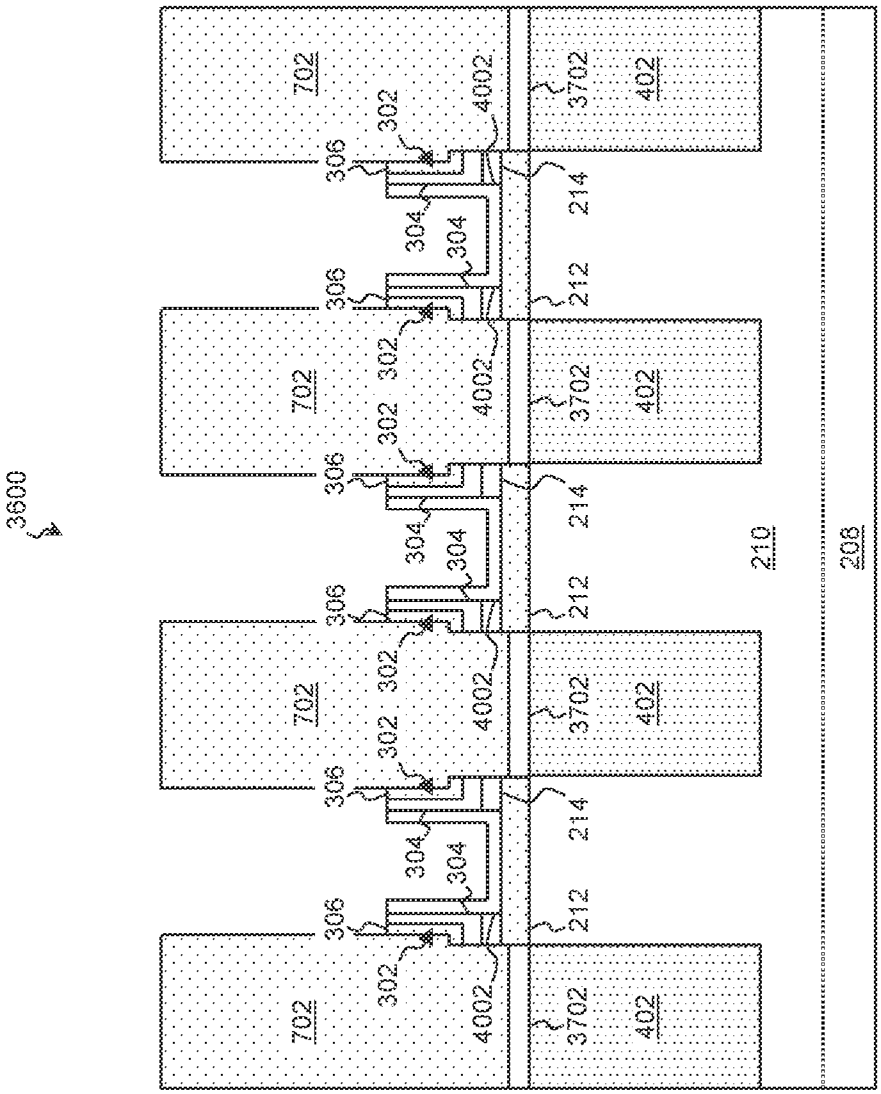
Figure 41:
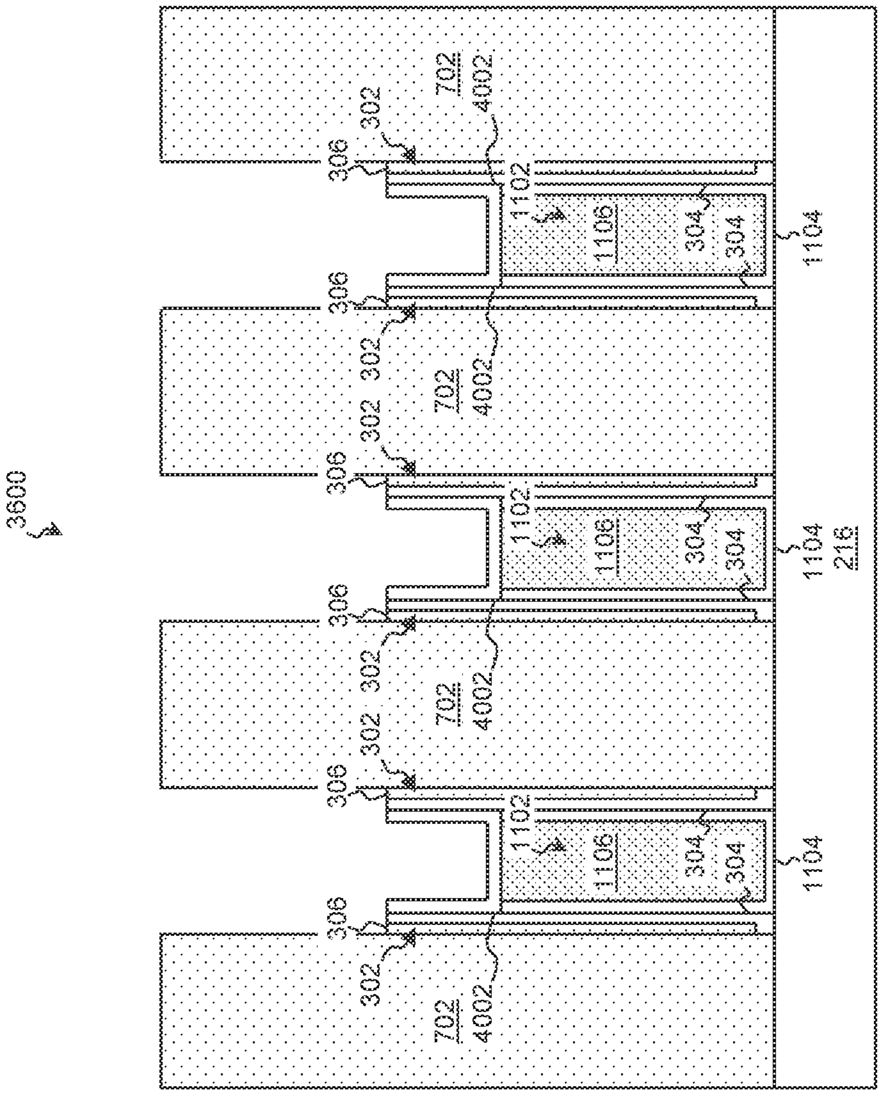

Referring to block 3508 of FIG. 35 and to FIGS. 40-41, an additional gate spacer layer (third gate spacer layer 4002) is formed on the side surfaces of the existing gate spacers 302. The third gate spacer layer 4002 may also be formed on the top surface of the functional gate 1102. In some examples, a selective deposition technique is used to avoid forming the third gate spacer layer 4002 elsewhere, such as on the side surfaces of the ILD layer 702.

This may include selectively forming an inhibitor on the surfaces where the third gate spacer layer 4002 is to be excluded. For example, an inhibitor may be deposited on the side surfaces of the ILD layer 702. The inhibitor may be configured to prevent adhesion of the subsequently formed third gate spacer layer 4002 and may include a dielectric, a polymer, and/or other suitable materials.

After the inhibitor is applied, the third gate spacer layer 4002 is formed on the source/drain features 402. The third gate spacer layer 4002 may be deposited by any suitable technique, including ALD, PEALD, CVD, PECVD, and/or HDP-CVD, and the inhibitor may prevent the third gate spacer layer 4002 from being deposited on those surfaces where the inhibitor is present.

The third gate spacer layer 4002 may include one or more layers of suitable materials, such as a dielectric material (e.g., a semiconductor oxide, a semiconductor nitride, a semiconductor oxynitride, a semiconductor carbide, a semiconductor oxycarbonitride, etc.). In some such examples, the third gate spacer layer 4002 includes a low-k dielectric material (e.g., SiCN, SiOC, SiOCN, etc.) that may be the same or different from a material of the first spacer layer 304 and the second spacer layer 306. The third spacer layer 4002 may be formed to any suitable thickness, and in some such examples, the third spacer layer 4002 has a thickness between about 1 nm and about 5 nm.

After the third spacer layer 4002 is formed, any remaining inhibitor may be removed.

Figure 42:
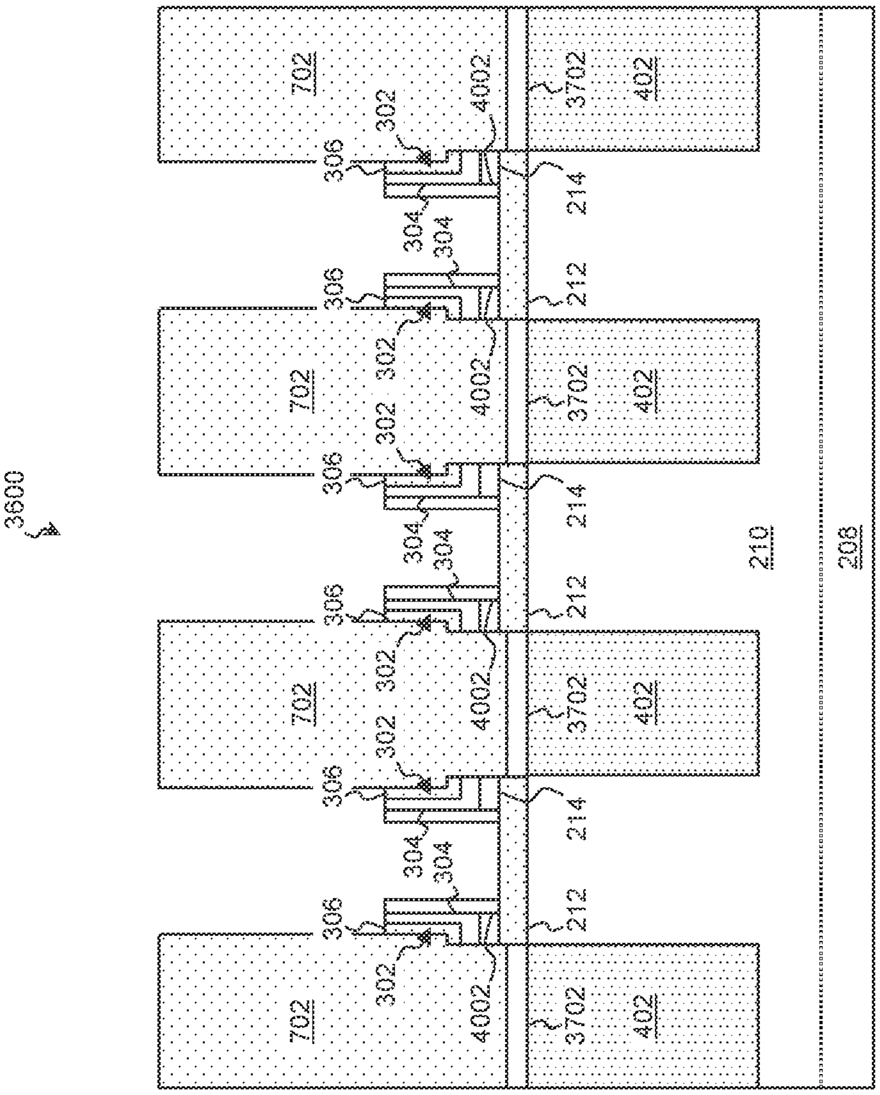
Figure 43:
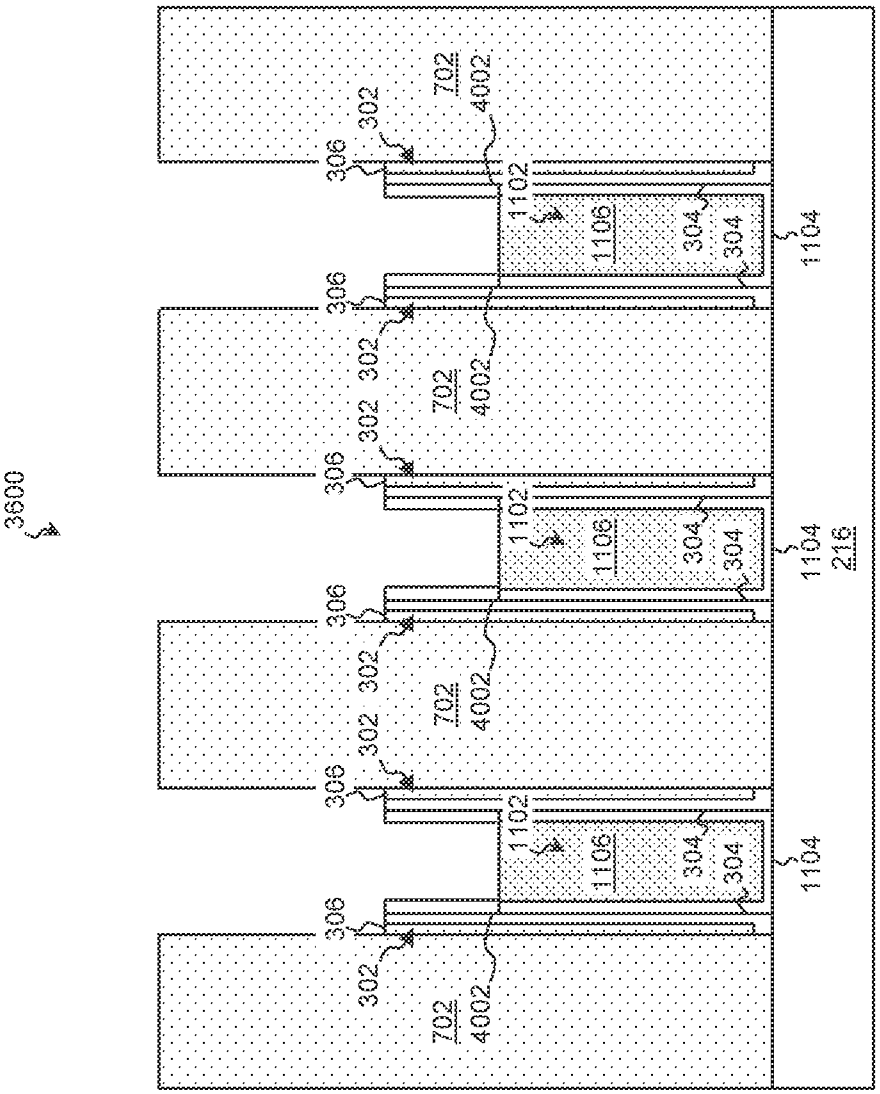

Referring to block 3510 of FIG. 35 and to FIGS. 42-43, a break-thru etching is performed on the third gate spacer layer 4002 to expose at least the top of the gate electrode 1106. This may be performed substantially similar to block 128 of FIG. 1B.

Figure 44:
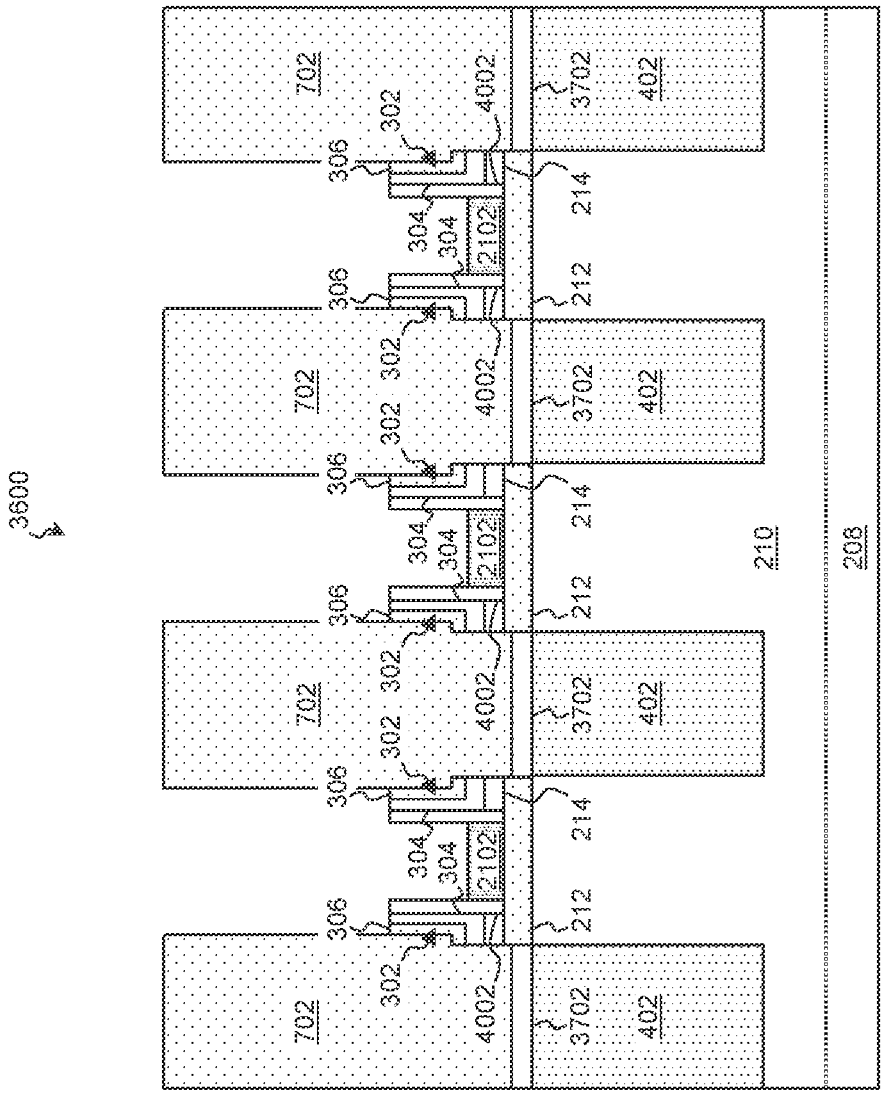
Figure 45:
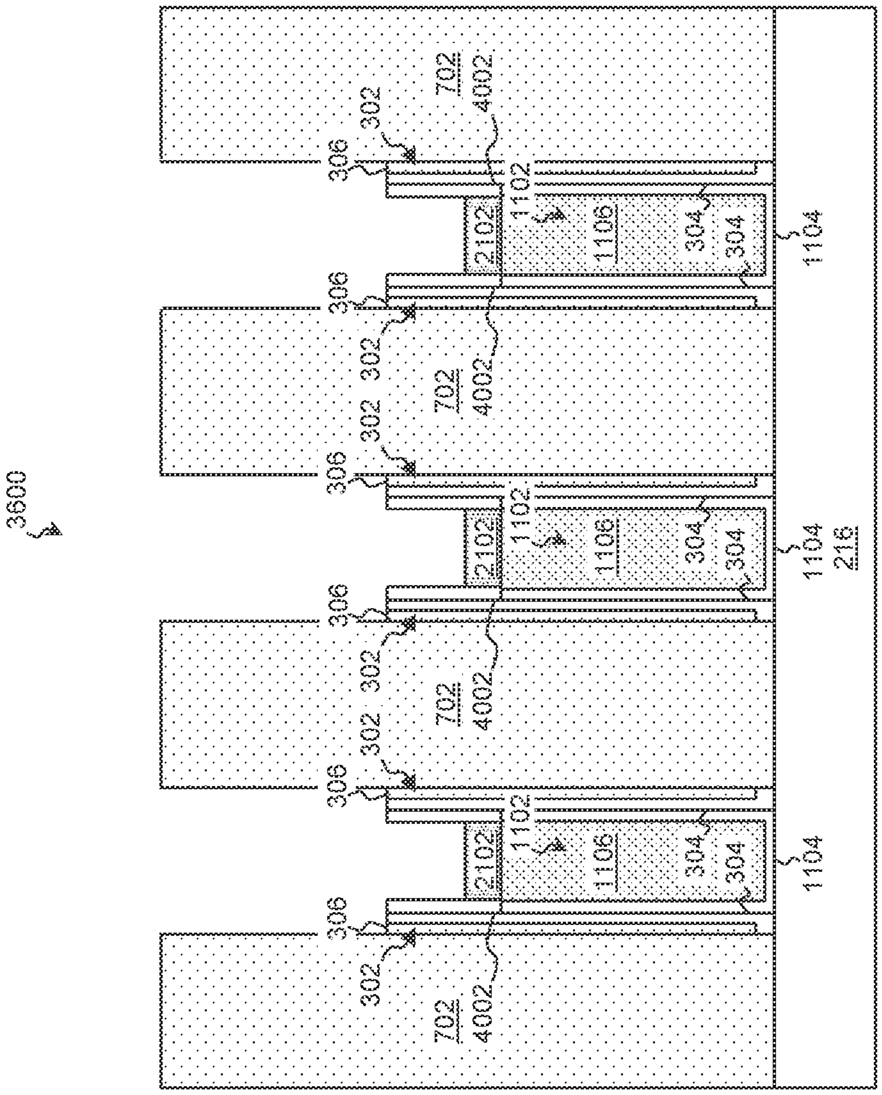

Referring to block 3512 of FIG. 35 and to FIGS. 44-45, a second conductive cap layer 2102 is formed on the gate electrode 1106 and on the fin-top hard mask 212. This may be performed substantially similar to block 130 of FIG. 1B.

Figure 46:
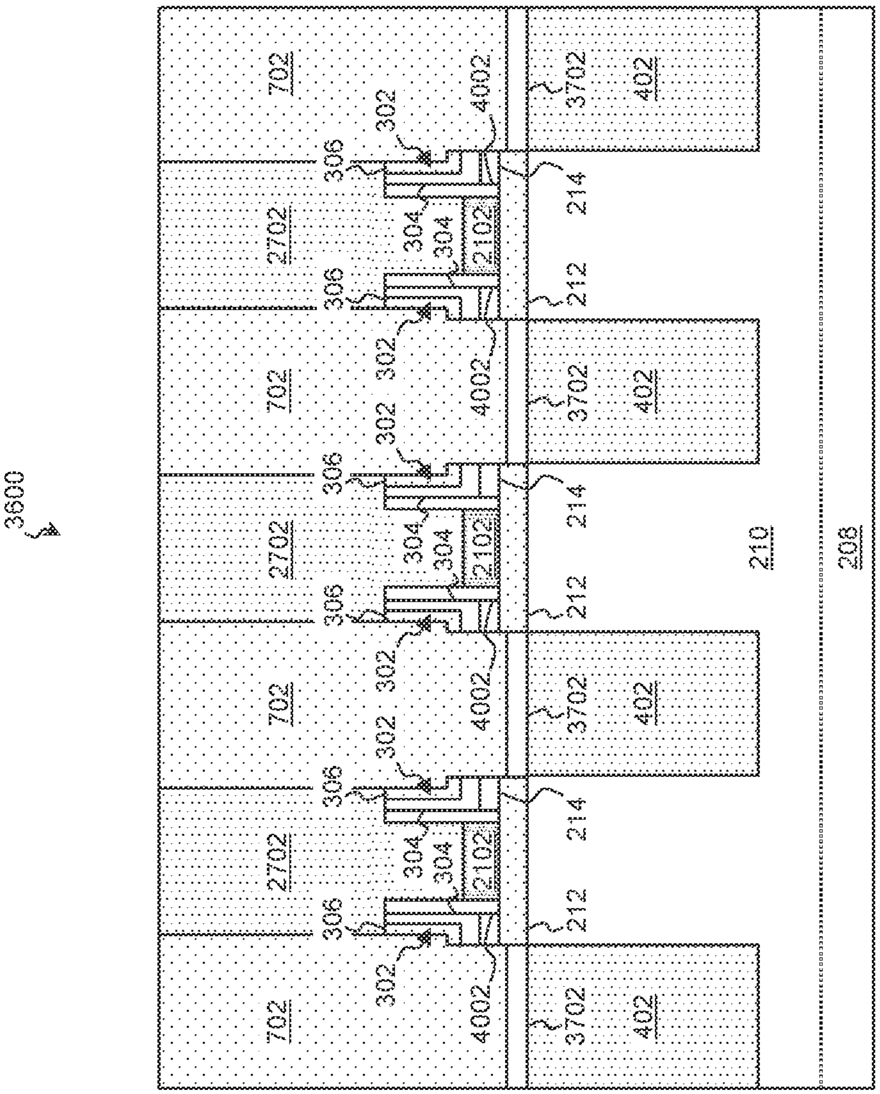
Figure 47:
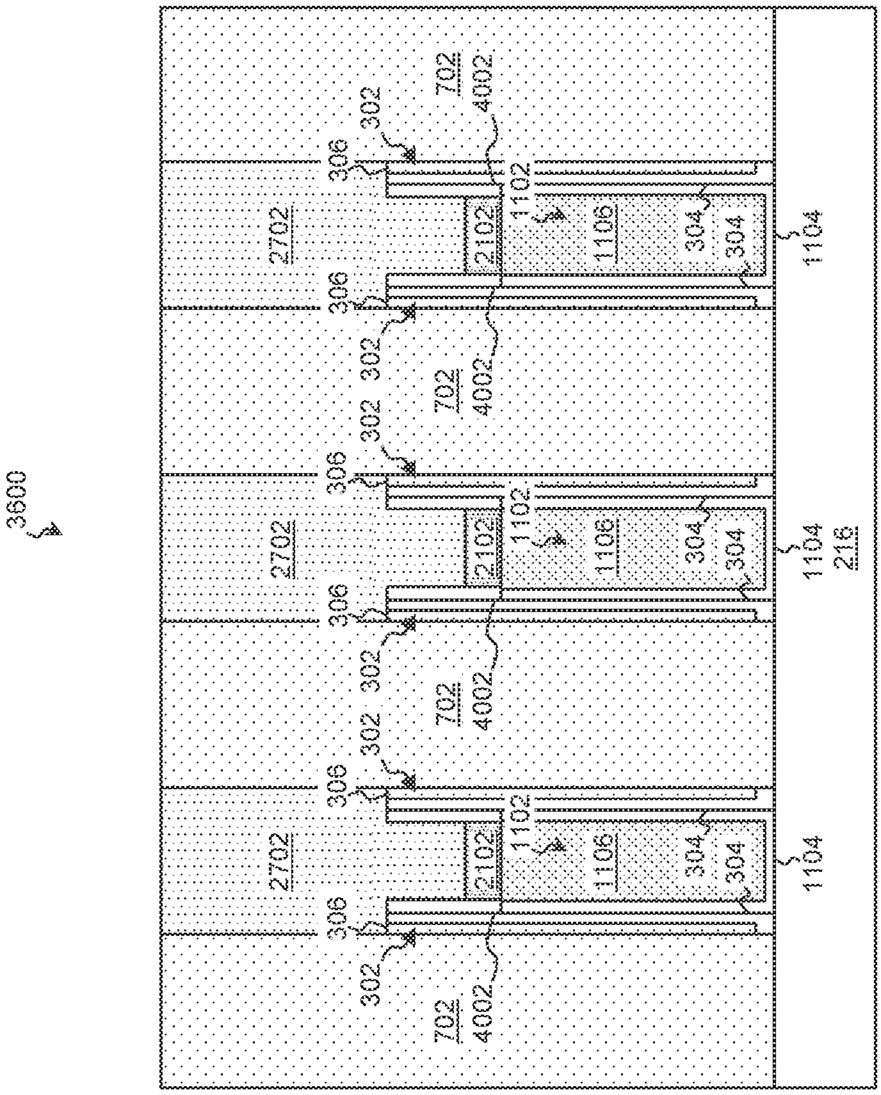

Referring to block 3514 of FIG. 35 and to FIGS. 46-47, a SAC dielectric layer 2702 is formed on the second conductive cap layer 2102 over the fin 210 and over the functional gate 1102. This may be performed substantially similar to block 140 of FIG. 1B.

Figure 49:
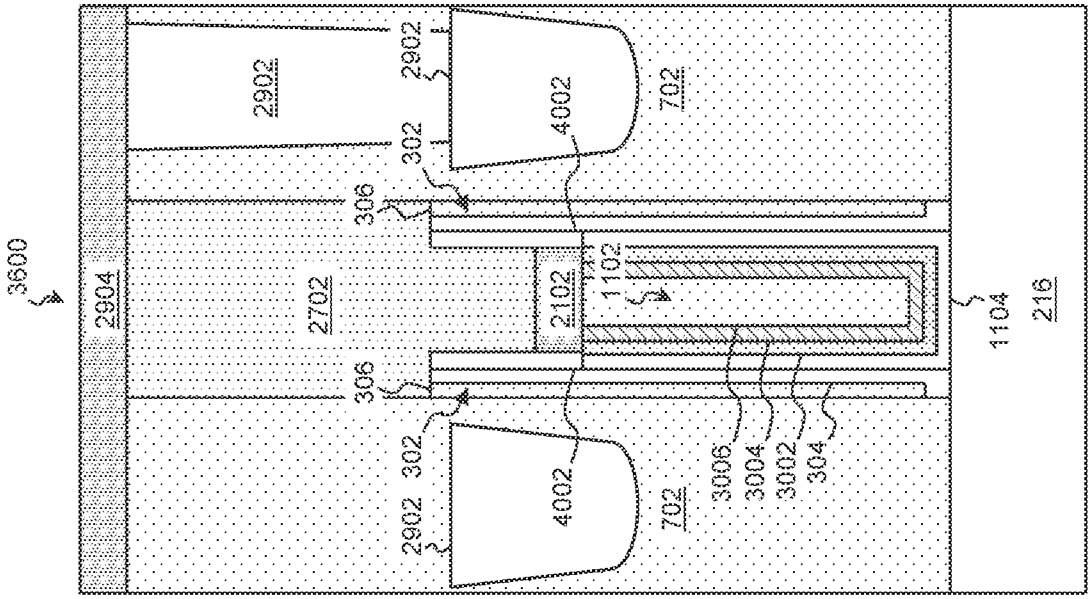
Figure 48:
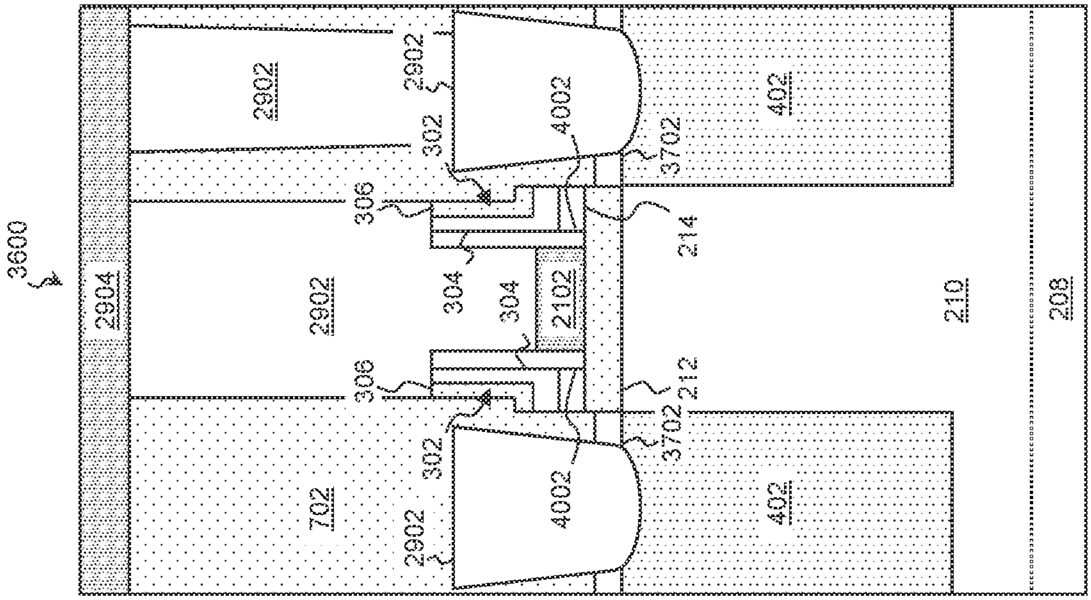
Figure 50:
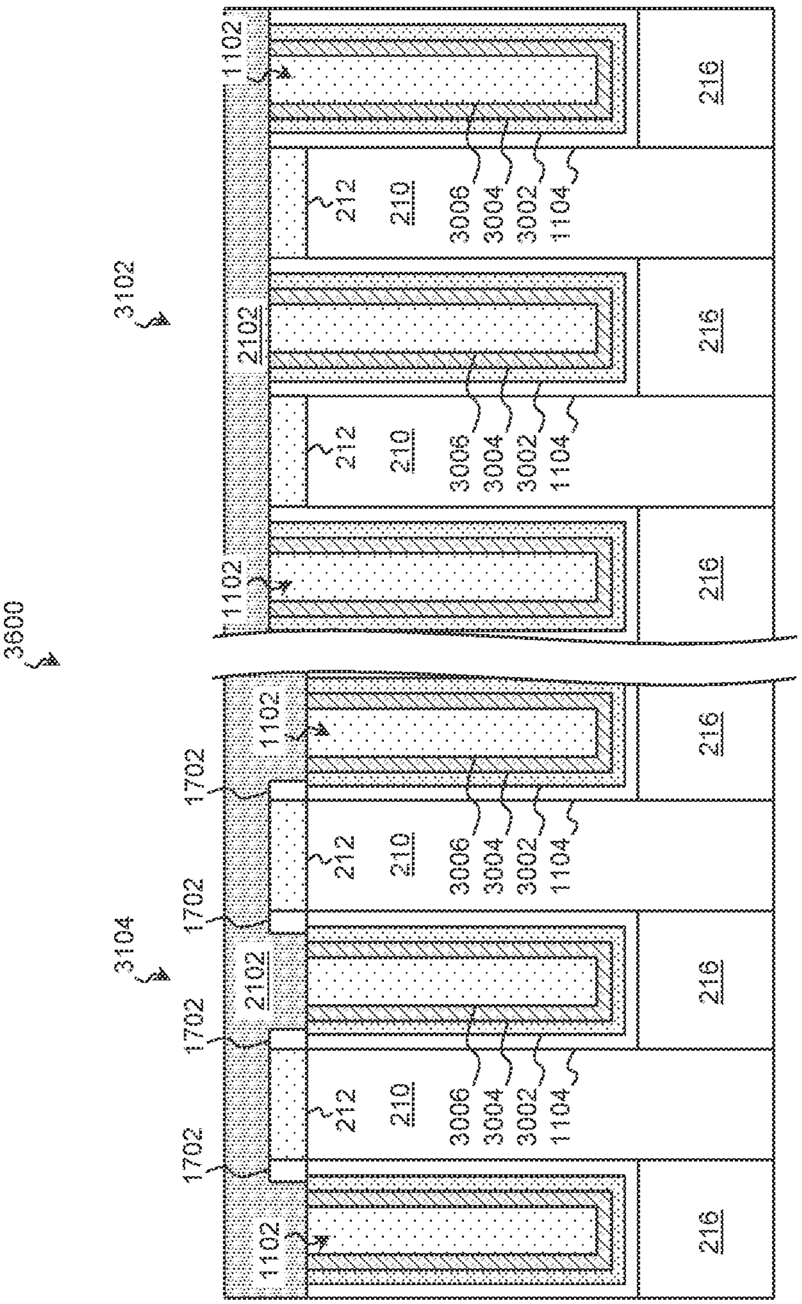
FIG. 50 is a cross-sectional illustration of a workpiece taken in a gate-length direction that cuts through a gate structure according to various aspects of the present disclosure.

Referring to block 3516 of FIG. 35 and to FIGS. 48-50, the workpiece 3600 may then be provided for further fabrication. In various examples, this includes forming contacts 2902 coupling to the source/drain features 402 and to the functional gates 1102, forming a CESL 2904 on the ILD layer 702 and the contacts 2902, forming a remainder of an electrical interconnect structure, dicing, packaging, and other fabrication processes. By not forming the BCESL 3702 on the side surfaces of the gate spacers 302, the method 3500 allows the formation of wider contacts 2902 with less separation between the contacts 2902 and the functional gate 1102. All other dimensions may be substantially similar to the examples of method 100.

Thus, the present disclosure provides examples of an integrated circuit with FinFET gates and a method for forming the integrated circuit. In some embodiments, an integrated circuit device includes a substrate, a fin extending from the substrate, a first gate disposed on a first side of the fin, and a gate spacer disposed alongside the first gate. The gate spacer has a first portion extending along the first gate that has a first width and a second portion extending above the first gate that has a second width that is greater than the first width. In some such embodiments, the second portion of the gate spacer includes a gate spacer layer disposed on the first gate. In some such embodiments, the gate spacer layer physically contacts a gate dielectric of the first gate and physically contacts a side surface of another gate spacer layer. In some such embodiments, the integrated circuit device further includes a second gate disposed on a second side of the fin, and a conductive cap disposed on the fin, the first gate, and the second gate. The conductive cap electrically couples the first gate and the second gate. In some such embodiments, the second portion of the gate spacer includes a gate spacer layer that physically contacts a side surface of the conductive cap and a top surface of the first gate. In some such embodiments, the integrated circuit device further includes a hard mask disposed on the fin between the fin and the conductive cap. In some such embodiments, a top surface of the first gate is substantially coplanar with a top surface of the hard mask. In some such embodiments, the integrated circuit device further includes an inter-level dielectric layer disposed on the fin. The inter-level dielectric layer extends above a top surface of the gate spacer. In some such embodiments, the integrated circuit device further includes a contact etch stop layer disposed on the fin alongside the gate spacer. A top surface of the contact etch stop layer is substantially coplanar with a top surface of the gate spacer. In some such embodiments, the gate spacer further has a third portion disposed on the fin and having a third width, and a fourth portion disposed on the third portion and having a fourth width that is less than the third width.

In further embodiments, a device includes a substrate having a fin, an isolation dielectric disposed on the substrate such that the fin extends above the isolation dielectric, a pair of gate structures disposed on the isolation dielectric on opposing sides of the fin, a gate spacer disposed on a side surface of the pair of gate structures and on the fin, and an interlevel dielectric disposed on the isolation dielectric and on the fin. The interlevel dielectric extends alongside and above the gate spacer. In some such embodiments, the gate spacer has a first thickness adjacent the pair of gate structures and a second thickness that is greater than the first thickness above the pair of gate structures and above the fin. In some such embodiments, the interlevel dielectric physically contacts the gate spacer. In some such embodiments, the device further includes a contact electrically coupled to the pair of gate structures, and the interlevel dielectric physically contacts the contact. In some such embodiments, the device further includes, a conductive cap disposed on the fin and on the pair of gate structures to electrically couple the pair of gate structures. The conductive cap is disposed between the fin and the contact.

In yet further embodiments, a method of fabricating an integrated circuit device includes receiving a substrate having a fin extending from the substrate and a placeholder gate disposed on the fin and disposed on opposing sides of the fin. A gate spacer is formed on a side surface of the placeholder gate, and a gate replacement process is performed to replace the placeholder gate with a functional gate. An additional gate spacer layer is formed on a side surface of the gate spacer and on a top surface of the functional gate. In some such embodiments, the functional gate is recessed to remove the functional gate from a top surface of the fin prior to the forming of the additional gate spacer layer. In some such embodiments, a conductive cap is formed on the fin to electrically couple a first portion of the functional gate on a first side of the fin to a second portion of the functional gate on a second side of the fin. In some such embodiments, the additional gate spacer layer extends along a side surface of the conductive cap. In some such embodiments, forming an inter-level dielectric is formed on the substrate, and removing the additional gate spacer layer is removed from a side surface of the inter-level dielectric.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A device comprising:

a fin disposed on a substrate, the fin having a first sidewall and an opposing second sidewall and a top surface extending from the first sidewall to the second sidewall, the top surface of the fin facing away from the substrate, wherein the substrate comprises crystalline semiconductor material;

a first gate disposed on the first sidewall of the fin, the first gate including a first gate electrode and a first gate dielectric layer, wherein no portion of the first gate electrode is disposed over the top surface of the fin, wherein the first gate dielectric layer wraps around side and bottom surfaces of the first gate electrode;

a first gate spacer disposed along a first side of the first gate, wherein the first gate spacer has a first portion extending along the first gate and having a first width and a second portion extending above the first gate and having a second width that is different than the first width, wherein the second portion of the first gate spacer extends above a height of at least one of the first gate electrode and the first gate dielectric layer; and a capping dielectric layer disposed over the first gate and the first gate spacer, wherein the capping dielectric layer interfaces a sidewall and a top surface of the second portion of the first gate spacer.

2. The device of claim 1, wherein the first portion of the first gate spacer is formed of a first spacer layer and a second spacer layer, and wherein the second portion of the first gate spacer is formed of the first spacer layer, the second spacer layer and a third spacer layer, wherein the third spacer layer is disposed on the first gate.

3. The device of claim 2, wherein the first, second and third spacer layers are formed of different materials from each other.

4. The device of claim 1, further comprising a second gate disposed on the second sidewall of the fin, the second gate including a second gate electrode and a second gate dielectric layer, wherein no portion of the second gate electrode is disposed over the top surface of the fin.

5. The device of claim 4, further comprising a conductive cap extending from the first gate electrode to the second gate electrode thereby electrically coupling the first and second gate electrodes, wherein the conductive cap is disposed between the first gate and the capping dielectric layer.

6. The device of claim 1, further comprising a fin-top hard mask disposed directly on the top surface of the fin.

7. The device of claim 6, wherein the second portion of the first gate spacer is disposed directly on a top surface of the fin-top hard mask, the top surface of the fin-top hard mask facing away from the substrate.

8. The device of claim 6, further comprising an etch stop layer disposed directly on the first portion of the first gate spacer, the second portion of the first gate spacer and the fin-top hard mask.

9. A device comprising:

a fin disposed on a substrate, the fin having a first sidewall and an opposing second sidewall and a top surface extending from the first sidewall to the second sidewall, the top surface of the fin facing away from the substrate;

a first gate structure disposed on the first sidewall of the fin, the first gate structure including a first gate electrode and a first gate dielectric layer, wherein no portion of the first gate electrode is disposed over the top surface of the fin;

a second gate structure disposed on the second sidewall of the fin, the second gate structure including a second gate electrode and a second gate dielectric layer, wherein the first gate structure and the second gate structure are spaced apart from one another by the fin along a direction;

a first source/drain feature and a second source/drain feature extending downward into the fin and spaced apart from one another along a second direction perpendicular to the first direction;

a first gate spacer disposed along the first gate structure and the second gate structure, wherein the first gate spacer extends continuously from the first gate dielectric layer to the second gate dielectric layer such that the first gate spacer interfaces with both the first and second gate dielectric layers, wherein an upper portion of the first gate spacer extends above the first gate structure; and a capping dielectric layer disposed over the first gate structure and the first gate spacer, wherein the capping dielectric layer interfaces a sidewall and a top surface of the upper portion of the first gate spacer.

10. The device of claim 9, wherein the first gate spacer includes:

a first spacer layer disposed directly on the first gate dielectric layer and the second gate dielectric layer; and a second spacer layer disposed directly on the first spacer layer, the first gate dielectric layer and the second gate dielectric layer.

11. The device of claim 10, wherein the first spacer layer has a different material composition than the second spacer layer.

12. The device of claim 10, wherein the first gate spacer further includes a third spacer layer disposed directly on the second spacer layer, and wherein the third spacer layer has a different material composition than the second spacer layer.

13. The device of claim 12, wherein the third spacer layer does not interface with either of the first and second gate dielectric layers.

14. The device of claim 9, further comprising a contact feature disposed on and interfacing with the first gate spacer.

15. The device of claim 14, further comprising a second gate spacer disposed along the first gate structure and the second gate structure, wherein the second gate spacer extends continuously from the first gate dielectric layer to the second gate dielectric layer such that the second gate spacer interfaces with both the first and second gate dielectric layers, wherein the first gate spacer is disposed along respective first sides of the first and second gate structures and the second gate spacer is disposed along respective second sides of the first and second gate structures, the respective first sides of the first and second gate structures being opposite the respective second sides of the first and second gate structures, and wherein the contact feature includes a first portion extending from the first gate spacer to the second gate spacer and a second portion extending over the first and second gate spacers, the first portion of the contact feature having a first width and the second portion of the contact feature having a second width that is different than the first width.

16. A device comprising:

a fin disposed on a substrate, the fin having a first sidewall and an opposing second sidewall and a top surface extending from the first sidewall to the second sidewall, the top surface of the fin facing away from the substrate;

a first gate structure disposed on the first sidewall of the fin, the first gate structure including a first gate dielectric layer and a first gate electrode layer;

a second gate structure disposed on the second sidewall of the fin, the second gate structure including a second gate dielectric layer and a second gate electrode layer;

a first gate spacer including a first portion disposed along a sidewall surface of the first gate structure, a second portion disposed along a sidewall surface of the second gate structure and a third portion disposed above both the first and second gate structures and over the top surface of the fin, the third portion of the first gate spacer having a different width than at least one of the first or second portions of the first gate spacer;

a conductive cap extending over top surface of the fin from the first gate structure to the second gate structure to electrically couple the first and second gate structures, wherein the third portion of the first gate spacer extends to a greater height above the substrate than the conductive cap; and a capping dielectric layer disposed over the conductive cap and the first gate spacer, wherein the capping dielectric layer interfaces a sidewall and a top surface of the third portion of the first gate spacer.

17. The device of claim 16, further comprising an interlayer dielectric layer disposed over the substrate, wherein the interlayer dielectric layer interfaces with the first, second and third portions of the first gate spacer.

18. The device of claim 16, wherein the first portion of the first gate spacer interfaces with the first gate dielectric layer and wherein the second portion of the first gate spacer interfaces with the second gate dielectric layer.

19. The device of claim 16, further comprising a top-fin hard mask disposed directly on the top surface of the fin, wherein the conductive cap is disposed directly on the top-fin hard mask such that the conductive cap is prevented from interfacing with the top surface of the fin by the top-fin hard mask.

20. The device of claim 16, further comprising an etch stop layer disposed along and interfacing with the first, second and third portions of the first gate spacer.

* * * * *